US010923630B1

(12) United States Patent
Pynn et al.

(10) Patent No.: US 10,923,630 B1
(45) Date of Patent: Feb. 16, 2021

(54) P—GAN-DOWN MICRO-LED ON SEMI-POLAR ORIENTED GAN

(71) Applicant: Facebook Technologies, LLC, Menlo Park, CA (US)

(72) Inventors: Christopher Pynn, Cork (IE); Anneli Munkholm, Bellevue, WA (US); David Hwang, Cork (IE)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 16/575,246

(22) Filed: Sep. 18, 2019

(51) Int. Cl.
*H01L 33/32* (2010.01)
*H01L 33/06* (2010.01)
*H01L 33/00* (2010.01)
*H01L 33/18* (2010.01)

(52) U.S. Cl.
CPC ........... *H01L 33/32* (2013.01); *H01L 33/007* (2013.01); *H01L 33/0025* (2013.01); *H01L 33/06* (2013.01); *H01L 33/18* (2013.01)

(58) Field of Classification Search
None
See application file for complete search history.

(56) References Cited

U.S. PATENT DOCUMENTS

| 8,252,662 | B1* | 8/2012 | Poblenz | H01L 33/0095 438/458 |
| 8,569,085 | B2* | 10/2013 | Tamboli | H01L 33/0062 438/31 |
| 9,653,642 | B1* | 5/2017 | Raring | H01L 33/0075 |
| 2007/0093073 | A1* | 4/2007 | Farrell, Jr. | B82Y 20/00 438/763 |
| 2008/0191223 | A1* | 8/2008 | Nakamura | B82Y 20/00 257/95 |
| 2010/0309943 | A1* | 12/2010 | Chakraborty | H01S 5/34333 372/45.012 |

(Continued)

OTHER PUBLICATIONS

David Hwang, Benjamin P. Yonkee, Burhan Saif Addin, Robert M. Farrell, Shuji Nakamura, James S. Speck, and Steven DenBaars, "Photoelectrochemical liftoff of LEDs grown on freestanding c-plane GaN substrates," Opt. Express 24, 22875-22880 (2016) (Year : 2016).*

(Continued)

*Primary Examiner* — J. E. Schoenholtz
(74) *Attorney, Agent, or Firm* — Weaver Austin Villeneuve & Sampson LLP

(57) ABSTRACT

Disclosed herein are techniques for improving performance of micro light emitting diodes. According to certain embodiments, a semi-polar-oriented light emitting diode (LED) (e.g., grown on ($20\bar{2}1$) plane or ($11\bar{2}2$) plane) includes a buried p-GaN layer that is grown before the active region and the n-GaN layer of the LED are grown, such that the polarization-induced (including strain-induced piezoelectric polarization and spontaneous polarization) electrical field and the built-in depletion field in the active region are in opposite directions during normal operations, thereby reducing or minimizing the overall internal electric field that can contribute to Quantum-Confined Stark Effect. The buried p-GaN layer is grown on an n-i-n sacrificial etch junction, which can be laterally wet-etched to separate the semi-polar-oriented LED from the underlying substrate and expose the p-GaN layer for planar or vertical (rather than horizontal or lateral) activation.

20 Claims, 29 Drawing Sheets

(56) References Cited

U.S. PATENT DOCUMENTS

2013/0100978 A1* 4/2013 Hardy ................ H01S 5/34333
372/45.012
2017/0236807 A1* 8/2017 Hwang ............... H01L 33/0075
257/90

OTHER PUBLICATIONS

David Hwang, "Epitaxial Growth, Nanofabrication, and Mass Transfer of InGaN Micro-LEDs for Display", University of California Santa Barabara, Diss. Jul. 2018 (Year: 2018).*

Browne, et al., "Indium and Impurity Incorporation in InGaN Films on Polar, Nonpolar, and Semipolar GaN Orientations Grown by Ammonia Molecular Beam Epitaxy", Journal of Vacuum Science & Technology A, vol. 30, No. 4, American Vacuum Society, Jul./Aug. 2012, pp. 041513-1-041513-8.

Forman, et al., "Semipolar (2021) III-Nitride P-Down LEDs With in Situ Anneal to Reduce the Mg Memory Effect", Journal of Crystal Growth, vol. 464, 2017, pp. 197-200.

Olivier, et al., "Influence of Size-Reduction on the Performances of Gan-Based Micro-Leds for Display Application", Journal of Luminescence, vol. 191, 2017, pp. 112-116.

Romanov, et al., "Basal Plane Misfit Dislocations and Stress Relaxation in Iii-Nitride Semipolar Heteroepitaxy", Journal of Applied Physics, vol. 109, 2011, pp. 103522-1-103522-12.

Zhao, et al., "Valence Band States and Polarized Optical Emission from Nonpolar and Semipolar III-Nitride Quantum Well Optoelectronic Devices", Japanese Journal of Applied Physics, vol. 53, 2014, pp. 100206-1-100206-17.

* cited by examiner

P—GAN-DOWN MICRO-LED ON SEMI-POLAR ORIENTED GAN

BACKGROUND

Light emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, projection systems, and wearable electronic devices. Micro-LEDs ("μLEDs") based on III-nitride semiconductors, such as alloys of AlN, GaN, InN, and the like, have begun to be developed for various display applications due to their small size (e.g., with a linear dimension less than 100 μm, less than 50 μm, or less than 10 μm), high packing density (and hence higher resolution), and high brightness. For example, micro-LEDs that emit light of different colors (e.g., red, green, and blue) can be used to form the sub-pixels of a display system, such as a television or a near-eye display system.

SUMMARY

This disclosure relates generally to micro light emitting diodes (micro-LEDs). More specifically, this disclosure relates to micro-LEDs fabricated on III-nitride materials with semi-polar crystal lattice orientations to increase the quantum efficiency and reduce the Quantum-Confined Stark Effect (QCSE) of the micro-LEDs. According to certain embodiments, a buried p-GaN layer of a semi-polar-oriented LED is grown before the active layers and the n-GaN layer of the LED, such that the strain-induced piezoelectric field and the built-in depletion field in the active layers are in opposite directions during normal operations, thereby reducing or minimizing the overall internal electric field that may cause the QCSE. In addition, the buried p-GaN layer is grown on an n-i-n sacrificial etch junction, which can be laterally etched to separate the semi-polar-oriented LED from the underlying substrate and expose the p-GaN layer for activation. The micro-LEDs can be bonded individually or in an array to a substrate or support, such as a silicon substrate with circuits fabricated thereon.

According to some embodiments, a method may include forming, on a semi-polar plane-oriented surface of a substrate, an n-i-n junction that includes a sacrificial layer sandwiched by a first n-type III-nitride material layer and a second n-type III-nitride material layer; forming a p-type III-nitride material layer on the second n-type III-nitride material layer; growing, on the p-type III-nitride material layer, a light emitting region that includes one or more III-nitride material layers; forming a third n-type III-nitride material layer on the light emitting region; etching the third n-type III-nitride material layer, the light emitting region, and the p-type III-nitride material layer to form one or more mesa structures and one or more anchor sites; etching the p-type III-nitride material layer and the n-i-n junction to expose the sacrificial layer; bonding a first carrier to the anchor sites; and laterally etching the sacrificial layer using photoelectrochemical etching to detach the substrate.

In some embodiments of the method, an angle between the semi-polar plane-oriented surface of the substrate and a c-plane of the substrate may be between about 45° and about 90°. The semi-polar plane-oriented surface is parallel to a $(20\bar{2}1)$ plane or $(11\bar{2}2)$ plane of the substrate. The light emitting region may include a single InGaN/GaN quantum-well structure or an InGaN/GaN multiple-quantum-well structure.

In some embodiments, the method may also include conditioning a process chamber used to dope the p-type III-nitride material layer to remove remaining dopants in the process chamber and/or treating a surface of the p-type III-nitride material layer to remove dopants built on the surface of the p-type III-nitride material layer, after forming the p-type III-nitride material layer. In some embodiments, forming the p-type III-nitride material layer may include growing the p-type III-nitride material layer at a temperature higher than a temperature for growing the light emitting region.

In some embodiments, the method may also include etching the second n-type III-nitride material layer to expose the p-type III-nitride material layer, forming a $p^+$-type III-nitride material layer, on the p-type III-nitride material layer, activating the p-type III-nitride material layer and p+-type III-nitride material layer, and forming a first contact layer on the p+-type III-nitride material layer. In some embodiments, activating the p-type III-nitride material layer and the $p^+$-type III-nitride material layer may include annealing the p-type III-nitride material layer and the p+-type III-nitride material layer. In some embodiments, the method may also include bonding a second carrier on the first contact layer, debonding the first carrier from the anchor sites, and bonding a silicon backplane including electrical circuits to the third n-type III-nitride material layer.

In some embodiments, forming the n-i-n junction on the semi-polar plane-oriented surface of the substrate may include growing a buffer layer on the semi-polar plane-oriented surface of the substrate, and forming the n-i-n junction on the buffer layer. In some embodiments, growing the light emitting region on the p-type III-nitride material layer may include growing an electron-blocking layer on the p-type III-nitride material layer, and growing the light emitting region on the electron-blocking layer. In some embodiments, forming the third n-type III-nitride material layer on the light emitting region may include growing a barrier layer on the light emitting region, and forming the third n-type III-nitride material layer on the barrier layer. In some embodiments, the method may also include forming a passivation layer on sidewalls of the one or more mesa structures.

According to some embodiments, a wafer may include a substrate including a semi-polar plane-oriented surface, an n-i-n junction grown on the semi-polar plane-oriented surface of the substrate and including a sacrificial layer sandwiched by a first n-type III-nitride material layer and a second n-type III-nitride material layer, a p-type III-nitride material layer on the second n-type III-nitride material layer, a light emitting region including one or more III-nitride material layers on the p-type III-nitride material layer, and a third n-type III-nitride material layer on the light emitting region.

In some embodiments, an angle between the semi-polar plane-oriented surface of the substrate and a c-plane of the substrate may be between about 45° and about 90°, such as about 75°. In some embodiments, the semi-polar plane-oriented surface may be parallel to a $(20\bar{2}1)$ plane or $(11\bar{2}2)$ plane of the substrate. The substrate may include GaN, sapphire, silicon carbide, silicon, zinc oxide, boron nitride, lithium aluminate, lithium niobate, germanium, aluminum nitride, lithium gallate, partially substituted spinel, or quaternary tetragonal oxide having a beta-$LiAlO_2$ structure. The light emitting region may include an InGaN/GaN multiplequantum-well structure. The InGaN/GaN multiple-quantum-well structure may include indium-rich InGaN quantum well layers.

In some embodiments, the wafer may also include a buffer layer between the substrate and the n-i-n junction. In some embodiments, the wafer may also include a barrier layer between the light emitting region and the third n-type III-nitride material layer. In some embodiments, the wafer may also include an electron-blocking layer between the light emitting region and the p-type III-nitride material layer. In some embodiments, the first n-type III-nitride material layer and the second n-type III-nitride material layer may be heavily doped n-type III-nitride material layers. In some embodiments, the p-type III-nitride material layer may include a Mg-doped GaN layer.

According to some embodiments, a light source may include a semiconductor substrate including electrical circuits fabricated thereon, and a light emitting diode bonded to the semiconductor substrate. The light emitting diode may include an n-type III-nitride material layer bonded to the electrical circuits on the semiconductor substrate, a light emitting region including one or more III-nitride material layers, and a p-type III-nitride material layer. The light emitting region may include a side surface that is at least partially covered by a passivation layer, a bottom surface of the light emitting region is parallel to a semi-polar plane of a hexagonal lattice, and the light emitting region is characterized by a polarization-induced electric field opposite to a built-in depletion electric field in the light emitting region.

In some embodiments of the light source, the p-type III-nitride material layer may be vertically rather than laterally activated. An angle between the semi-polar plane and a c-plane of the hexagonal lattice may be between about 45° and about 90°, such as bout 75°. A direction from the p-type III-nitride material layer to the n-type III-nitride material layer is a [20$\bar{2}$1] direction.

In some embodiments, the light emitting region may include a single InGaN/GaN quantum-well structure or an InGaN/GaN multiple-quantum-well structure. In some embodiments, the light source may also include a p$^+$-type III-nitride material layer on the p-type III-nitride material layer, and an electrode layer on the p+-type III-nitride material layer. In some embodiments, the light source may also include a barrier layer between the light emitting region and the n-type III-nitride material layer. In some embodiments, the light source may also include an electron-blocking layer between the light emitting region and the p-type III-nitride material layer. The p-type III-nitride material layer may include a Mg-doped GaN layer.

In some embodiments, the polarization-induced electric field and the built-in depletion electric field may be antiparallel. A difference between an amplitude of the polarization-induced electric field and an amplitude of the built-in depletion electric field may be less than 25% of the amplitude of the built-in depletion electric field. The bottom surface of the light emitting region may be characterized by a linear dimension less than 20 μm. A majority of transistors in the electrical circuits may be NMOS transistors. The light emitting diode may be characterized by a blue-shift less than 15 nm when a current density of the light emitting diode is increased ten times.

According to some embodiments, a display device may include an NMOS silicon substrate including electrical circuits fabricated thereon, and an array of light emitting diodes bonded to the NMOS silicon substrate. Each of the array of light emitting diodes may include an n-type III-nitride material layer bonded to the electrical circuits on the NMOS silicon substrate, a light emitting region including one or more III-nitride material layers, and a p-type III-nitride material layer. The light emitting region may include a side surface that is at least partially covered by a passivation layer, a bottom surface of the light emitting region may be parallel to a semi-polar plane of a hexagonal lattice, and the light emitting region may be characterized by a polarization-induced electric field opposite to a built-in depletion electric field in the light emitting region.

According to some embodiments, a light source may include a semiconductor backplane including electrical circuits fabricated thereon, and a light emitting diode bonded to the semiconductor backplane. The light emitting diode may be made by: forming, on a semi-polar plane-oriented surface of a substrate, an n-i-n junction that includes a sacrificial layer sandwiched by a first n-type III-nitride material layer and a second n-type III-nitride material layer; forming a p-type III-nitride material layer on the second n-type III-nitride material layer; growing a light emitting region that includes one or more III-nitride material layers on the p-type III-nitride material layer; forming a third n-type III-nitride material layer on the light emitting region; etching the third n-type III-nitride material layer, the light emitting region, and the p-type III-nitride material layer to form one or more mesa structures; etching the p-type III-nitride material layer and the n-i-n junction to expose the sacrificial layer; laterally etching the sacrificial layer using photoelectrochemical etching to detach the substrate; etching the second n-type III-nitride material layer to expose the p-type III-nitride material layer, and vertically activating the p-type III-nitride material layer.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

Figure 1:
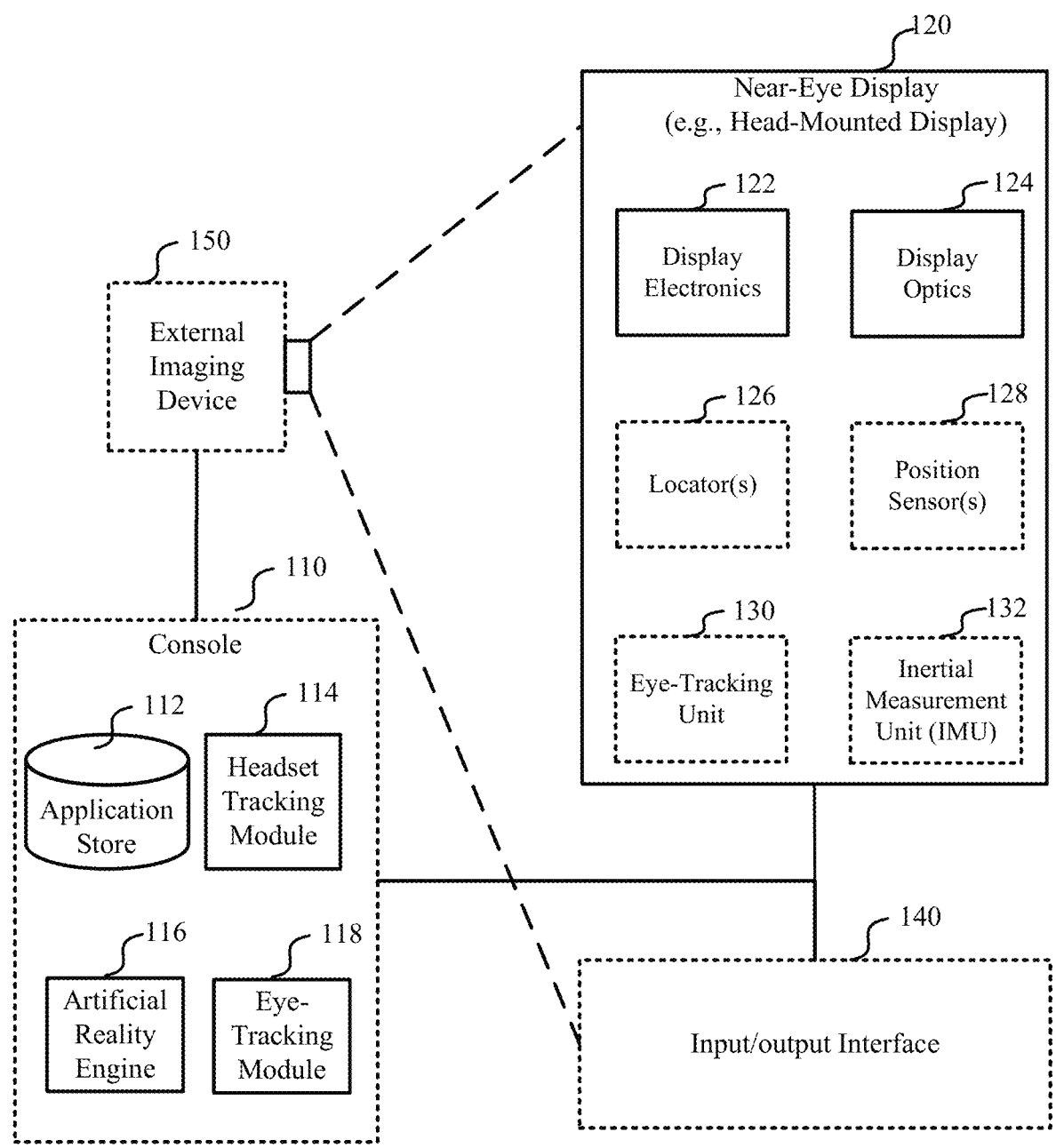
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to light emitting diodes (LEDs). More specifically, and without limitation, disclosed herein are techniques for improving the quantum efficiencies and reducing the Quantum-Confined Stark Effect (QCSE) of III-nitride micro-LEDs. According to certain embodiments, a semi-polar-oriented LED may include a buried p-GaN layer that is grown before the active region and the n-GaN layer of the LED are grown, such that the polarization-induced (including strain-induced piezoelectric polarization and spontaneous polarization) electrical field and the built-in depletion field in the active region are in opposite directions during normal operations, thereby reducing or minimizing the overall internal electric field that may contribute to the QCSE. In addition, the buried p-GaN layer may be grown on an n-i-n sacrificial etch junction, which can be laterally etched to separate the semi-polar-oriented LED from the underlying substrate and expose the p-GaN layer for planar (vertical rather than horizontal) activation. The micro-LEDs can be bonded individually or in an array to a substrate or support, such as a silicon substrate with circuits (e.g., CMOS or NMOS circuits) fabricated thereon. Various inventive embodiments are described herein, including devices, systems, methods, materials, and the like.

III-nitride LEDs generally include an active region (e.g., an InGaN/GaN multiple-quantum-well (MQW)) grown on top of a n-type GaN layer, and a p-type GaN layer grown on top of the active region. Such LEDs may be referred to as n-GaN down or n-down LEDs (NDLEDs). NDLEDs grown on a c-plane generally have large internal fields in the quantum-well light emitting layers. The internal fields may include polarization-induced (including strain-induced piezoelectric polarization and spontaneous polarization) electrical field and the built-in depletion field of a p-n junction. The internal fields may contribute to QCSE in the LEDs, which is often associated with a reduction in radiative efficiency and a blue-shift in the emission spectrum when current is injected into the LEDs, neither of which is desirable for display applications. In NDLEDs fabricated on GaN layers grown on substrates having certain semi-polar orientations, such as on the $(20\bar{2}1)$ plane, the built-in depletion field (from n-GaN to p-GaN) and the polarization-induced internal field (from p-GaN to n-GaN, which is opposite to the growth direction) at a typical operating condition can be made approximately equal in magnitude and have opposing directions, which may result in a minimal total internal field in the active region and thus a significant reduction in QCSE. For example, the indium composition (and thus the piezoelectric field) may be selected to provide a flat-banded QW for a given p-n junction doping and current density (and thus a given built-in field). However, indium-rich InGaN layers grown on the $(20\bar{2}1)$ plane may be unstable and can form stacking faults that are extended defects within a crystal and can significantly reduce the radiative efficiency of LEDs. A semi-polar-oriented substrate, such as a $(20\bar{2}1)$ or $(11\bar{2}2)$ semi-polar-oriented substrate, can be used to more reliably grow epitaxial layers that can incorporate much more indium in the InGaN layers before stacking faults may be formed. In addition, LEDs fabricated in $(20\bar{2}1)$ or $(11\bar{2}2)$ semipolar-oriented GaN layers can achieve a high quantum efficiency even when the physical dimensions of the micro-LEDs decrease to a few microns or close to one micron. However, in NDLEDs grown on the $(20\bar{2}1)$ semi-polar plane, the built-in depletion field (from n-GaN to p-GaN) and the polarization-induced internal field (which may be the same as the growth direction, i.e., from n-GaN to p-GaN) are in the same direction. Therefore, the QCSE effect and the blue-shift can be as large as or even larger than those in LEDs grown on the c-plane (i.e., polar plane) because the built-in filed and the piezoelectric field in c-plane LEDs are anti-parallel and thus can partially cancel out.

According to certain embodiments, epitaxial layers of an LED can be grown on the $(20\bar{2}1)$ or $(11\bar{2}2)$ semi-polar plane of a substrate, where a high-quality p-GaN layer of the LED may be grown at a higher temperature before growing the active region and the n-GaN layer of the LED at a lower temperature (which is referred to herein as p-GaN-down LED or PDLED). The built-in depletion field in the active region may remain from the n-GaN layer to the p-GaN layer, but the polarization-induced internal field in the active region may be from the p-GaN layer to the n-GaN layer (i.e., the growth direction). As such, the polarization-induced internal field may be opposite to the built-in depletion field in the active region, thus reducing or minimizing the overall internal field and hence the QCSE of the LED. In this way, the LED can achieve both the benefits of growth in the [20 $\bar{2}$1] direction (e.g., reliability and high quantum efficiency) and the band bending benefits of LEDs grown on the $(20\bar{2}\bar{1})$ plane.

However, there may be some challenges associated with fabricating the LEDs when the p-GaN layer is grown before the active layers and the N-GaN layer (and thus the p-GaN layer is buried). For example, after growing the p-GaN layer, dopants (e.g., Mg) used to form the p-GaN layer (e.g., Mg-doped GaN layer) may remain in the processing chamber of the reactor and/or on the epitaxial surface after the introduction of Mg precursors into the reactor. If the quantum-well layers are grown directly on the Mg-rich p-GaN layer, the quantum wells may be contaminated with Mg dopants (e.g., including Mg tailing), which may be referred to as the Mg-memory effect. In addition, to activate the Mg dopants in the Mg-doped GaN layer to form the p-GaN layer, the Mg-doped GaN layer may need to be annealed to drive out hydrogen via diffusion and eliminate Mg—H complexes. Because the p-GaN layer is buried, to drive out the hydrogen, positively charged H$^+$ ions may need to diffuse across the active region and through the n-GaN layer that is exposed. However, because of the depletion field in the p-n junction (from n to p), positively charged H$^+$ ions may not be able to diffuse from the p-type layer across the active region to the n-type layer. In addition, hydrogen may have a much higher diffusion barrier and thus a much lower diffusivity in n-type GaN compared with in p-type GaN. As such, the hydrogen ions may not diffuse through the n-type layer to the exposed top surface of the n-type layer. Therefore, it may be difficult to sufficiently activate the p-GaN layer.

According to certain embodiments, to reduce or eliminate the Mg-memory effect, the reactor (e.g., the processing chamber) may be conditioned after growing the p-type layer to reduce or eliminate the Mg-memory effect. For example, chlorine can be introduced into the reactor to clean the reactor walls and/or reactor lines. Optionally, a surface treatment can be carried out to reduce the Mg accumulated on the growth surface. The remaining epitaxial layers, including the quantum wells, can then be grown, such that the Mg tailing in the active region can be reduced or eliminated.

To activate the buried p-GaN layer, a sacrificial layer may be formed before the p-GaN layer, and a photoelectrochemical (PEC) etching process can be used to laterally etch the sacrificial layer and expose the buried p-GaN layer. A sacrificial layer sandwiched within an n-i-p junction may be difficult to etch by PEC etching due to the unfavorable Fermi level pinning. According to some embodiments, the sacrificial layer can be sandwiched within an n-i-n junction to facilitate the lateral etching of the sacrificial layer. After the PEC etching, an n-type layer of the n-i-n junction may be exposed, and the p-GaN layer may be directly underneath the n-type layer. A hydrogen-based etching may be performed to etch the remaining n-type layer of the n-i-n junction to fully expose the p-GaN layer. The hydrogen-based etching may be an in-situ hydrogen etching at elevated temperatures, which may promote GaN dissociation. Optionally, a p$^+$ or p$^{++}$-GaN layer can then be grown on the exposed p-GaN layer in a metal organic chemical vapor deposition (MOCVD) regrowth process, followed by an in-situ or ex-situ activation annealing to activate the Mg dopants in the p-GaN layer and the p$^+$ or p$^{++}$-GaN layer. Each pixel (i.e., micro-LED) of the micro-LEDs may be bonded to a silicon backplane, which may include, for example, CMOS or NMOS circuits for addressing and controlling individual LEDs.

Therefore, techniques disclosed herein can significantly reduce the defect density, improve the production yield and device reliability, increase the quantum efficiency, reduce the peak efficiency current density, and reduce the QCSE of micro-LEDs fabricated in III-nitride materials. In addition, because the epitaxial layer growth ends with the n-GaN layer, the micro-LEDs can be processed with the n-side up. Furthermore, the n-GaN layer of the micro-LEDs can be bonded to an NMOS silicon backplane, where circuits in the silicon backplane can be made using NMOS devices that are generally much faster than PMOS devices due to the higher carrier mobility, and thus fewer NMOS transistors (and smaller silicon area) can be used to achieve the same current and/or a higher speed.

The micro-LEDs described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using LED-based display subsystem.

As used herein, the term "light emitting diode (LED)" refers to a light source that includes at least an n-type semiconductor layer, a p-type semiconductor layer, and a light emitting region (i.e., active region) between the n-type semiconductor layer and the p-type semiconductor layer. The light emitting region may include one or more semiconductor layers that form one or more heterostructures, such as quantum wells. In some embodiments, the light emitting region may include multiple semiconductor layers that form one or more multiple-quantum-wells (MQWs) each including multiple (e.g., about 2 to 6) quantum wells.

As used herein, the term "micro-LED" or "µLED" refers to an LED that has a chip where a linear dimension of the chip is less than about 200 µm, such as less than 100 µm, less than 50 µm, less than 20 µm, less than 10 µm, or smaller. For example, the linear dimension of a micro-LED may be as small as 6 µm, 5 µm, 4 µm, or even 2 µm or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "bonding" may refer to any one of adhesive bonding, metal-to-metal bonding, fusion bonding, hybrid bonding, and the like, for physically and/or electrically connecting two or more devices and/or wafers. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., pads or balls), conductive adhesive, or welded joints. Wafer-to-wafer fusion bonding may bond two wafers (e.g., silicon wafers or other semiconductor wafers) without any intermediate layers and is based on chemical bonds between the surfaces of two wafers that meet certain conditions. Wafer-to-wafer fusion bonding may include wafer cleaning and other preprocessing, aligning and pre-bonding at room temperature, and annealing at elevated temperatures, such as about 250° C. or higher. Fusion bonding can significantly reduce or substantially eliminate the thermal resistance at the interface between two wafers. In some embodiments, wafer-level metal/adhesive hybrid bonding may be used to bond two wafers with dielectric materials (e.g., oxide) and/or metal materials at the surface of one or both wafers. Dielectric bonds and/or metal bonds may be formed at the interface between two wafers by the hybrid bonding. Hybrid bonding may include, for example, wafer cleaning, surface activation (e.g., plasma activation), pre-bonding, and annealing at, for example, 250-300° C. or higher.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140 that may each be coupled to an optional console 110. While FIG. 1 shows example artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audios, or some combination thereof. In some embodiments, audios may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of these elements or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (μLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or a combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be a light emitting diode (LED), a corner cube reflector, a reflective marker, a type of light source that contrasts with an environment in which near-eye display 120 operates, or some combinations thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or some combinations thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or some combinations thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or some combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or some combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or some combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or some combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
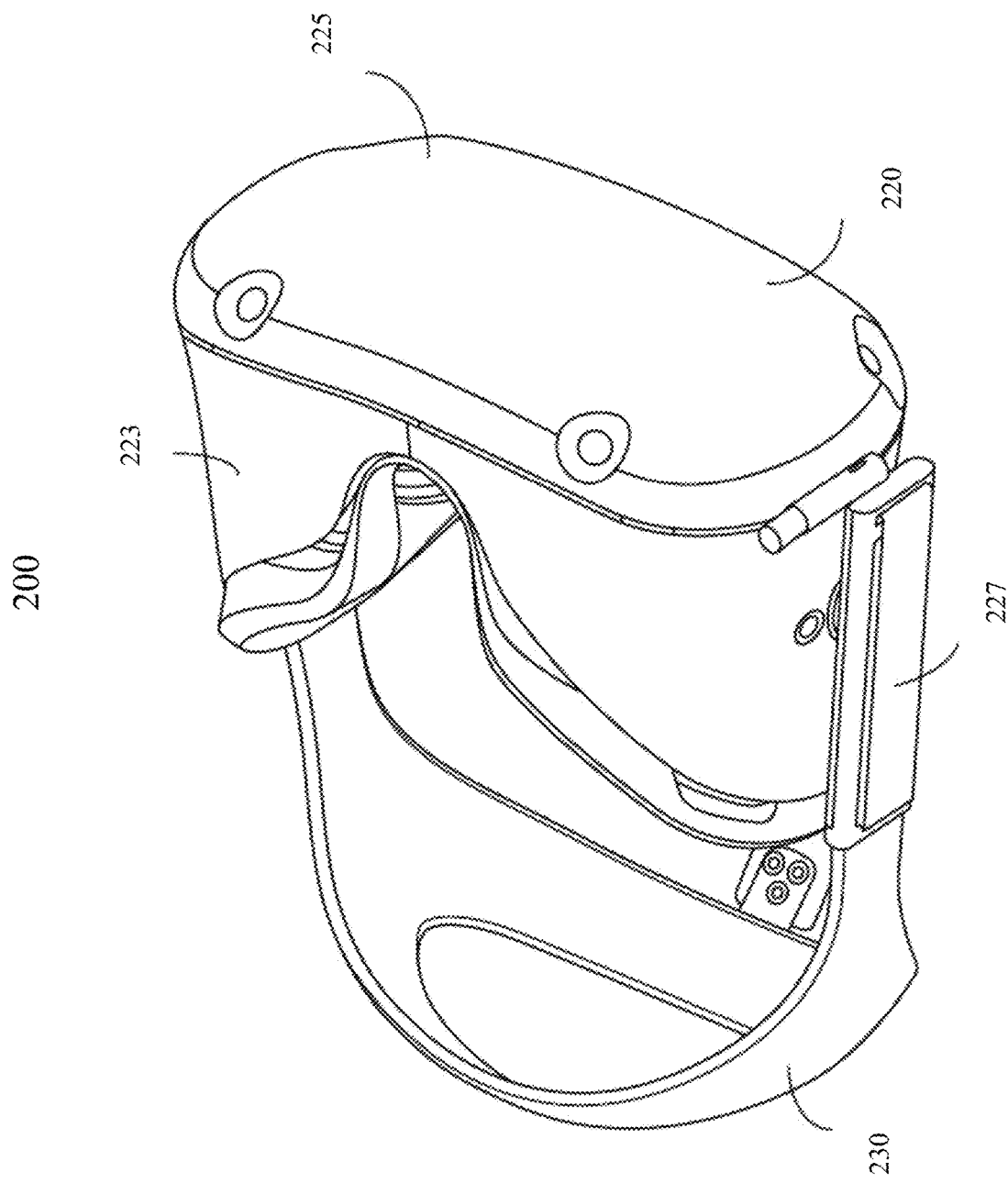
FIG. 2 is a perspective view of an example of a near-eye display in the form of a head-mounted display (HMD) device for implementing some of the examples disclosed herein.

FIG. 2 is a perspective view of an example of a near-eye display in the form of a head-mounted display (HMD) device 200 for implementing some of the examples disclosed herein. HMD device 200 may be a part of, e.g., a virtual reality (VR) system, an augmented reality (AR) system, a mixed reality (MR) system, or some combinations thereof. HMD device 200 may include a body 220 and a head strap 230. FIG. 2 shows a top side 223, a front side 225, and a right side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temples tips as shown in, for example, FIG. 2, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audios, or some combinations thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, a liquid crystal display (LCD), an organic light emitting diode (OLED) display, an inorganic light emitting diode (ILED) display, a micro light emitting diode (μLED) display, an active-matrix organic light emitting diode (AMOLED) display, a transparent organic light emitting diode (TOLED) display, some other display, or some combinations thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or some combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
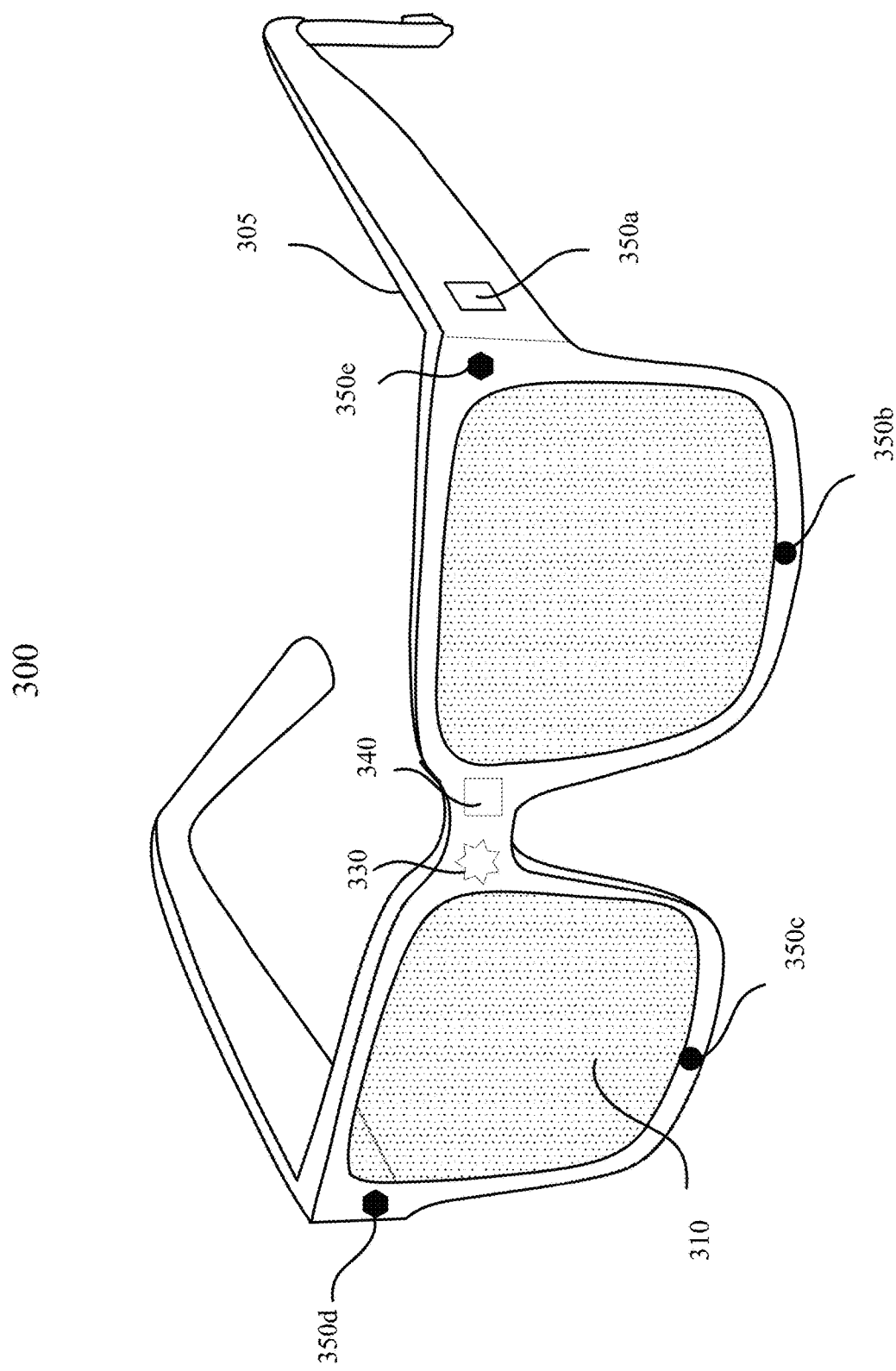
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350*a*, 350*b*, 350*c*, 350*d*, and 350*e* on or within frame 305. In some embodiments, sensors 350*a*-350*e* may include one or more depth sensors, motion sensors, position sensors, inertial sensors, or ambient light sensors. In some embodiments, sensors 350*a*-350*e* may include one or more image sensors configured to generate image data representing different fields of views in different directions. In some embodiments, sensors 350*a*-350*e* may be used as input devices to control or influence the displayed content of near-eye display 300, and/or to provide an interactive VR/AR/MR experience to a user of near-eye display 300. In some embodiments, sensors 350*a*-350*e* may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light pattern onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

The light sources, image sources, or display systems described above may include one or more LEDs, such as a one-dimensional array or two-dimensional array of LEDs. For example, each pixel in a display may include three subpixels that include a red micro-LED, a green micro-LED, and a blue micro-LED. A semiconductor light emitting diode generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Figure 4A:
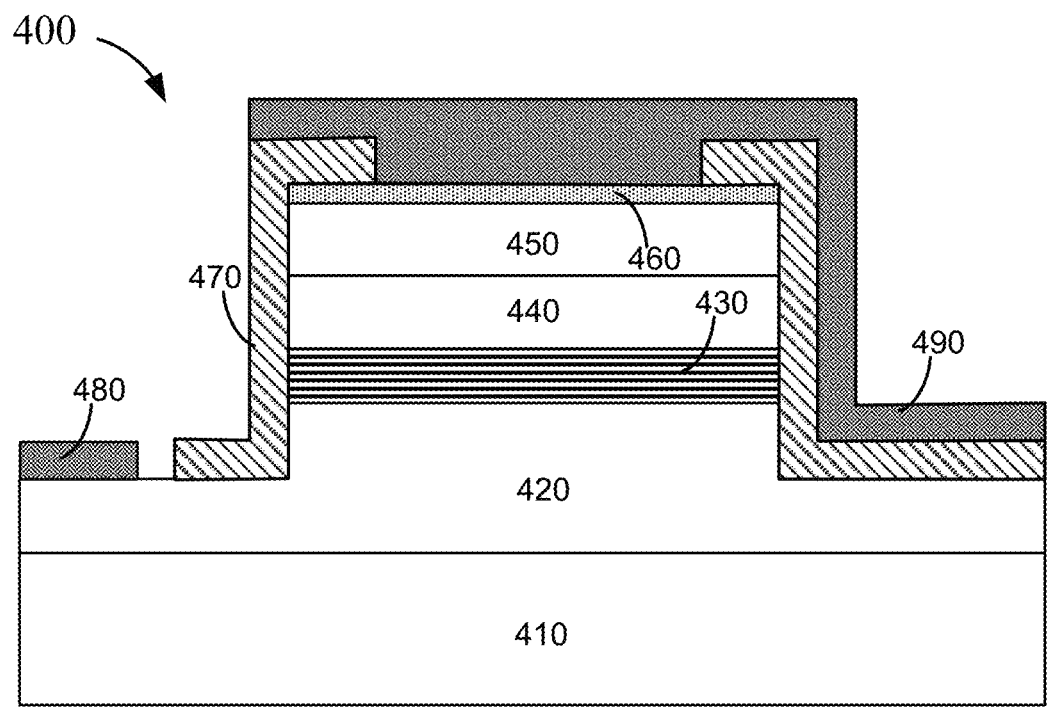
FIG. 4A illustrates an example of a light emitting diode (LED) including a vertical mesa structure according to certain embodiments.

FIG. 4A illustrates an example of a light emitting diode 400 including a vertical mesa structure. LED 400 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques, such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation, such as a GaN, GaAs, or GaP substrate, or a foreign substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-LiAlO$_2$ structure, where the substrate may be cut in a specific direction to expose a specific plane as the growth surface.

In the example shown in FIG. 4A, LED 400 may include a substrate 410, which may include, for example, a sapphire substrate or a GaN substrate. A semiconductor layer 420 may be grown on substrate 410. Semiconductor layer 420 may include a III-V material, such as GaN, and may be p-doped (e.g., with Mg, Ca, Zn, or Be) or n-doped (e.g., with Si or Ge). One or more active layers 430 may be grown on semiconductor layer 420 to form an active region. Active layers 430 may include one or more InGaN layers, one or more AlInGaP layers, and/or one or more GaN layers, which may form one or more heterostructures, such as one or more quantum wells or multiple quantum wells (MQWs). A semiconductor layer 440 may be grown on active layers 430. Semiconductor layer 440 may include a III-V material, such as GaN, and may be p-doped (e.g., with Mg, Ca, Zn, or Be) or n-doped (e.g., with Si or Ge). One of semiconductor layer 420 and semiconductor layer 440 may be a p-type layer and the other one may be an n-type layer. Semiconductor layer 420 and semiconductor layer 440 sandwich active layers 430 to form the light emitting diode. For example, LED 400 may include a layer of InGaN situated between a layer of p-type GaN doped with magnesium and a layer of n-type GaN doped with silicon or oxygen. In some embodiments, LED 400 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 4A) may be grown to form a layer between active layers 430 and at least one of semiconductor layer 420 or semiconductor layer 440. The EBL may reduce the electron leakage current and improve the efficiency of the LED. In some embodiments, a heavily-doped semiconductor layer 450, such as a $P^+$ or $P^{++}$ semiconductor layer, may be formed on semiconductor layer 440 and act as a contact layer for forming an ohmic contact and reducing the contact impedance of the device. In some embodiments, a conductive layer 460 may be formed on heavily-doped semiconductor layer 450. Conductive layer 460 may include, for example, an indium tin oxide (ITO) or Al/Ni/Au film. In one example, conductive layer 460 may include a transparent ITO layer.

To make contact with semiconductor layer 420 (e.g., an n-GaN layer) of the diode and to more efficiently extract light emitted by active layers 430 from LED 400, the semiconductor material layers may be etched to expose semiconductor layer 420 and to form a mesa structure that includes layers 420-460. The mesa structure may confine carriers within the injection area of the device. Etching the mesa structure may lead to the formation of mesa sidewalls that may be orthogonal to the growth planes. A passivation layer 470 may be formed on the sidewalls of the mesa structure. Passivation layer 470 may include an oxide layer, such as a SiO$_2$ layer, and may act as a reflector to reflect emitted light out of LED 400. A contact layer 480, which may include a metal layer, such as Al, Au, Ni, Ti, or any combination thereof, may be formed on semiconductor layer 420 and may act as an electrode of LED 400. In addition, another contact layer 490, such as an Al/Ni/Au metal layer, may be formed on conductive layer 460 to act as another electrode of LED 400.

When a voltage signal is applied to contact layers 480 and 490, electrons and holes may recombine in active layers 430, where the recombination of electrons and holes may cause photon emission. The wavelength and energy of the emitted photons may depend on the energy bandgap between the valence band and the conduction band in active layers 430. For example, InGaN active layers may emit green or blue light, AlGaN active layers may emit blue to ultraviolet light, while AlInGaP active layers may emit red, orange, yellow, or green light. The emitted photons may be reflected by passivation layer 470 and may exit LED 400 from the top (e.g., the transparent ITO layer and thin contact layer) or bottom (e.g., substrate 410).

In some embodiments, LED 400 may include one or more other components, such as a lens, on the light emission surface, such as substrate 410, to focus or collimate the emitted light or couple the emitted light into a waveguide. In some embodiments, an LED may include a mesa of another shape, such as a planar, vertical, conical, semi-parabolic, or parabolic shape, where a base area of the mesa may be circular, rectangular, hexagonal, or triangular. For example, the LED may include a mesa of a curved shape (e.g., paraboloid shape) and non-curved shape (e.g., conic shape). The mesa may be truncated or non-truncated.

Figure 4B:
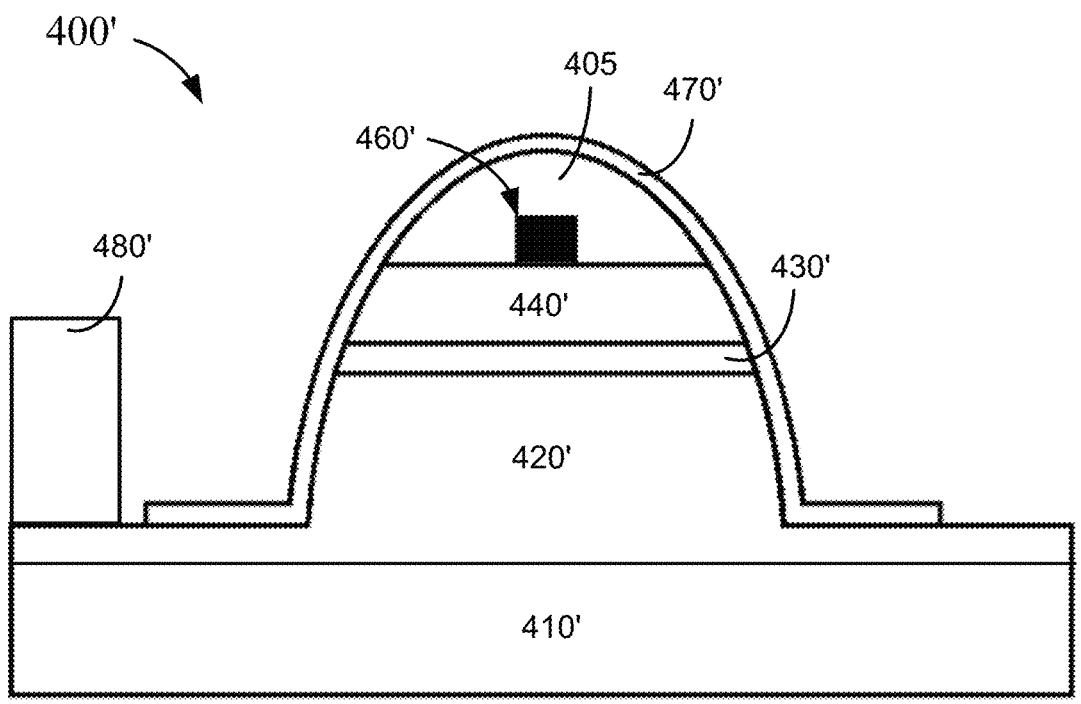
FIG. 4B is a cross-sectional view of an example of a light emitting diode including a parabolic mesa structure according to certain embodiments.

FIG. 4B is a cross-sectional view of an example of a light emitting diode 400' including a parabolic mesa structure. As LED 400, LED 400' may include multiple layers of semiconductor materials, such as multiple layers of III-V semiconductor materials. The semiconductor material layers may be epitaxially grown on a substrate 410', such as a GaN substrate or a sapphire substrate. For example, a semiconductor layer 420' may be grown on substrate 410'. Semiconductor layer 420' may include a III-V material, such as GaN, and may be p-doped (e.g., with Mg, Ca, Zn, or Be) or n-doped (e.g., with Si or Ge). One or more active layers 430' may be grown on semiconductor layer 420'. Active layers 430' may include one or more InGaN layers, one or more AlInGaP layers, or one or more GaN layers, which may form one or more heterostructures, such as one or more quantum wells. A semiconductor layer 440' may be grown on active layers 430'. Semiconductor layer 440' may include a III-V material, such as GaN, and may be p-doped (e.g., with Mg, Ca, Zn, or Be) or n-doped (e.g., with Si or Ge). One of semiconductor layer 420' and semiconductor layer 440' may be a p-type layer and the other one may be an n-type layer.

As shown on FIG. 4B, LED 400' may include a mesa that includes a dome top composed of a substantially transparent material 405, such as an oxide or a silicon compound (e.g., silicon oxide (SiOx) or silicon nitride (SiNx)). In some embodiments, transparent material 405 may include a material having a refractive index similar to that of semiconductor layer 440'. A reflector 470' may be formed on top of transparent material 405. In some embodiments, reflector 470' may include multiple layers of dielectric materials. In some embodiments, reflector 470' may include a metal layer, such as a layer of aluminum (Al) or silver (Ag). Reflector 470' may reflect light emitted in active layers 430' toward substrate 410'. In some embodiments, reflector 470' may be parabolic-shaped to act as a parabolic reflector.

Electrical contact 460' and electrical contact 480' may be formed on semiconductor layer 440' and semiconductor layer 420', respectively. Electrical contact 460' and electrical contact 480' may each include a conductive material, such as Al, Au, Ni, Ti, or any combination thereof, and may act as the electrodes of LED 400'. When a voltage signal is applied across electrical contacts 460' and 480', electrons and holes in active layers 430' may recombine, where the recombination of electrons and holes may be accompanied by photon emission. The emitted photons may propagate in many different directions, and may be reflected by reflector 470' towards substrate 410' and exit LED 400'. One or more other optical components, such as a lens, may be formed on the light emission surface, such as substrate 410', to focus or collimate the emitted light or couple the emitted light into a waveguide.

In semiconductor LEDs, light is usually generated at an internal quantum efficiency (IQE) through the recombination of electrons and holes within an active region (e.g., one or more active layers), where the internal quantum efficiency is the proportion of the radiative electron-hole recombination in the active region that emits photons. The generated light is then extracted from the LEDs in a particular direction or solid angle. The ratio between the number of emitted photons extracted from an LED and the number of electrons passing through the LED is referred to as the external quantum efficiency (EQE), which describes how efficiently the LED coverts injected electrons to photons that are extracted from the device. The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device. Various approaches may be used to improve the overall efficiency of an LED, such as optimizing the doping level or using the mesa structure to confine the carriers in the active region to increase the injection efficiency, and using reflective layer (e.g., passivation layer 470 or reflector 470') on the sidewalls or the dome of the mesa structure to direct the light out of the LED to increase the extraction efficiency.

The internal quantum efficiency (IQE) of LEDs, such as III-nitride (e.g., GaN) LEDs, depends on the relative rates of competitive radiative (light producing) recombination and non-radiative (lossy) recombination that occur in the active region of the device. Although LEDs may achieve a high peak IQE under a lower injection current, their efficiencies may start to drop with increasing current injection, which may be referred to as efficiency droop. Non-radiative recombination processes in the active region include Shockley-Read-Hall (SRH) recombination at defect sites and eeh or ehh Auger recombination, which may be a major cause of efficiency droop. The internal quantum efficiency of an LED may be determined by:

$$IQE = \frac{BN^2}{AN + BN^2 + CN^3}, \quad (1)$$

where A, B and C are the rates of SRH recombination, bimolecular (radiative) recombination, and Auger recombination, respectively, and N is the charge-carrier density (i.e., charge-carrier concentration) in the active region.

Figure 5:
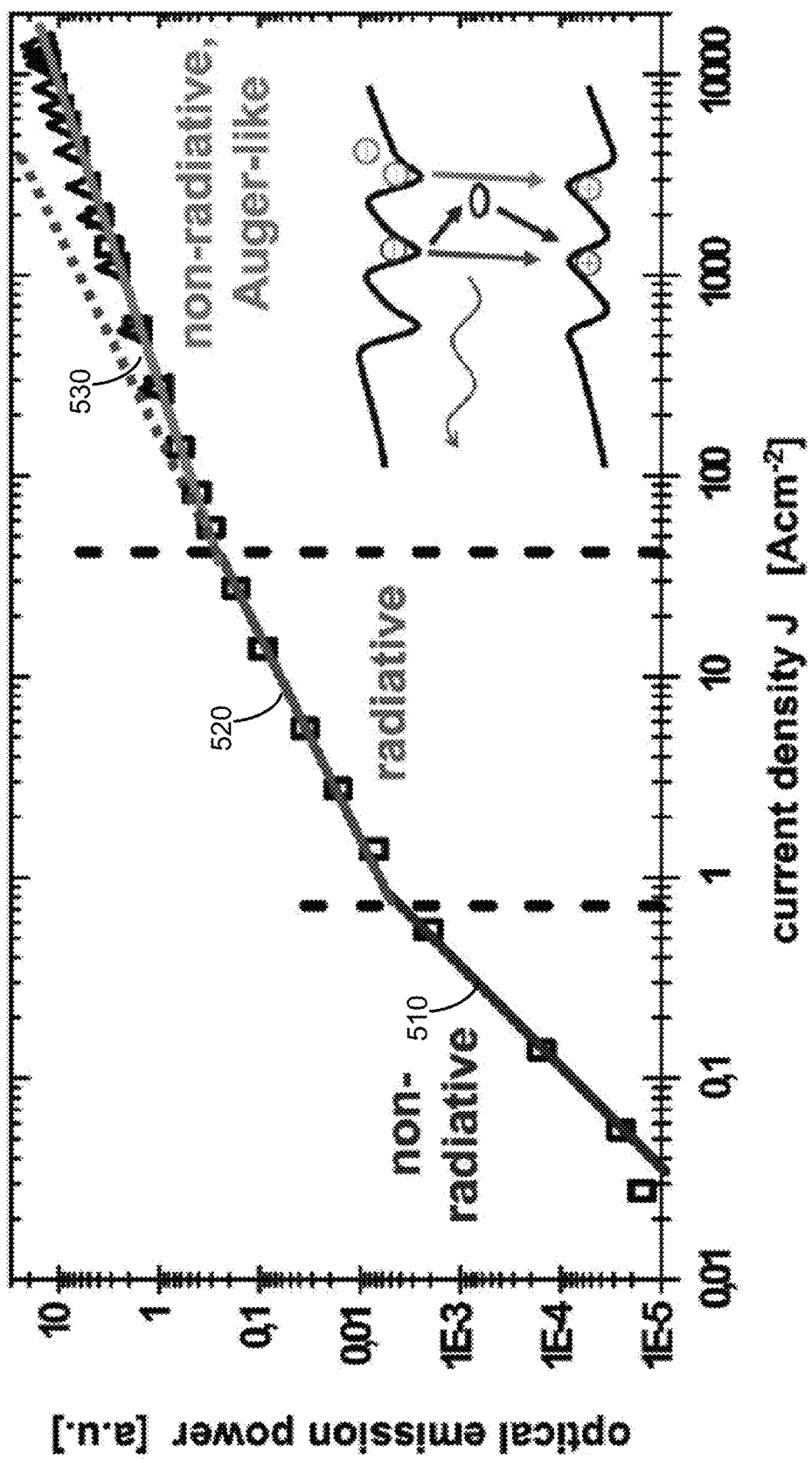
FIG. 5 illustrates the relationship between the optical emission power and the current density of a light emitting diode.

FIG. 5 illustrates the relationship between the optical emission power and the current density of a light emitting diode. As illustrated by a curve 510 in FIG. 5, the optical emission power of a micro-LED device may be low when the current density (and thus the charge carrier density N) is low, where the low external quantum efficiency may be caused by the relatively high non-radiative SRH recombination when the charge carrier density N is low according to equation (1). As the current density (and thus the charge carrier density N) increases, the optical emission power may increase as shown by a curve 520 in FIG. 5, because the radiative recombination may increase at a higher rate ($\propto N^2$) than the non-radiative SRH recombination ($\propto N$) when the charge carrier density N is high according to equation (1). As the current density increases further, the optical emission power may increase at a slower rate as shown by a curve 530 in FIG. 5 and thus the external quantum efficiency may drop because, for example, the non-radiative Auger recombination may increase at a higher rate ($\propto N^3$) than the radiative recombination ($\propto N^2$) when the charge carrier density N is sufficiently high according to equation (1).

Auger recombination is a non-radiative process involving three carriers. Auger recombination may be a major cause of efficiency droop and may be direct or indirect. For example, direct Auger recombination occurs when an electron and a hole recombine, but instead of producing light, either an electron is raised higher into the conduction band or a hole is pushed deeper into the valence band. Auger recombination may be reduced to mitigate the efficiency droop by lowering the charge-carrier density N in the active region for a given injection current density J, which may be written as:

$$J = gd_{eff}(AN + BN^2 + CN^3), \quad (2)$$

where $d_{eff}$ is the effective thickness of the active region. Thus, according to equation (1), the effect of the Auger recombination may be reduced and thus the IQE of the LED may be improved by reducing the charge-carrier density N for a given injection current density, which may be achieved by increasing the effective thickness of the active region $d_{eff}$. The effective thickness of the active region may be increased by, for example, growing multiple quantum wells (MQWs). Alternatively, an active region including a single thick double heterostructure (DH) may be used to increase the effective thickness of the active region.

One factor affecting the effective thickness of the active region is the presence of internal fields $E_{qw}$ (e.g., strain-induced internal field) in the quantum wells. Internal fields $E_{qw}$ may localize charge carriers and reduces the overlap integral between carrier wave functions, which may reduce the radiative efficiency of LEDs. Some LEDs including heterostructures (e.g., quantum wells) formed using III-nitride materials may have a strong internal strain-induced piezoelectric field in the carrier transport direction. The strain-induced internal field may cause the electron and hole energy levels to shift (thus changing the bandgap) and cause the electrons and holes to shift to opposite sides of a quantum well, thus decreasing the spatial electron-hole overlap and reducing the radiative recombination efficiency and thus the internal quantum efficiency of the LED.

Figure 6B:
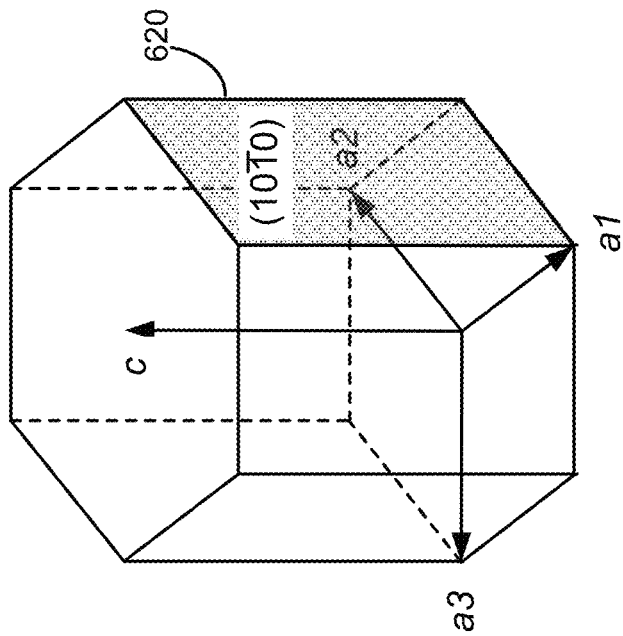
FIGS. 6A and 6B illustrate the hexagonal crystal lattice structure of an example of a III-nitride semiconductor material.
Figure 6A:
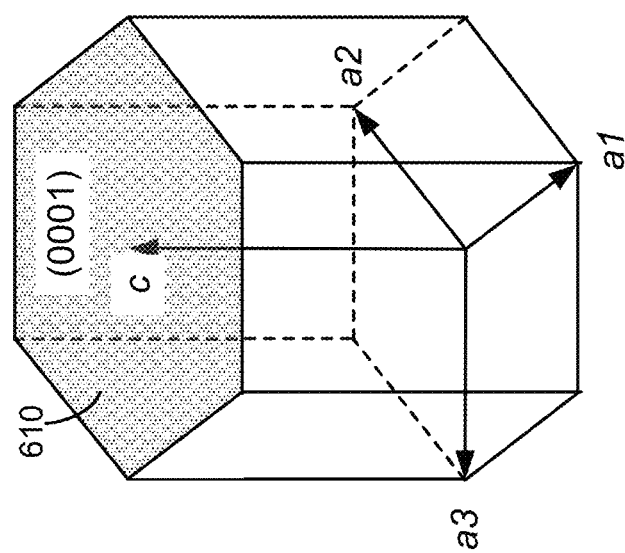

FIGS. 6A and 6B illustrate the hexagonal crystal lattice structure of an example of a III-nitride semiconductor material 600. Semiconductor material 600 may include, for example, a sapphire substrate or a GaN substrate that has a Wurtzite hexagonal lattice including a 6-fold rotation and 2 mirror planes as shown in the figures. The planes of a hexagonal lattice can be represented by four Miller-Bravais indices a1, a2, a3, and c as (a1, a2, a3, c), where a1+a2+a3=0. For example, a1+a2+a3=0 and c≠0 defines a sets of parallel planes (e.g., c-planes 610) that has different index c along the c-axis, which are polar planes that have the maximum spontaneous polarization in the direction perpendicular to the planes as a result of unequal numbers of nitride atoms and gallium atoms in the double monolayer. An example of a c-plane 610 is shown in FIG. 6A. When index c of a plane is nonzero, and any of the a1 and a2 indices of the plane is nonzero, the plane is a semi-polar plane. If index c of a plane is 0, the plane is featured by a zero polarization field in the direction perpendicular to the plane and is thus referred to as a "nonpolar" plane. An example of a nonpolar m-plane 620 is shown in FIG. 6B.

In polar crystals, such as GaN, the spontaneous polarization in the growth direction is at the maximum for crystals grown on the c-plane (i.e., polar plane). The polarization may change directions for crystals grown on planes of other orientations. Thus, the polarization in the growth direction may decrease for crystals grown on planes that make angles 0°<θ<90° with the c-plane (i.e., the semi-polar planes), and may become zero (nonpolar) for crystals grown on planes perpendicular to the polar plane (i.e., the nonpolar planes). Piezoelectric polarization in InGaN/GaN structures may behave in a similar manner, and thus the piezoelectric polarization may also differ for planes with different orientations. Thus, heterostructures (e.g., quantum wells) based on these polar crystals may have a strong internal electric field induced by the piezo- and spontaneous polarization along the most natural crystal growth direction [0001] (i.e., the c-axis). As such, carriers in heterostructures grown on the c-plane may experience a strong polarization-induced internal field in their transport direction (e.g., the heterostructure growth direction). The polarization-induced internal fields in the carrier transport direction may cause a shift of the exciton emission energy inside these heterostructures, where electrons and holes may also be shifted to opposite sides of the well and confined by the well.

Figures 7A, 7B:
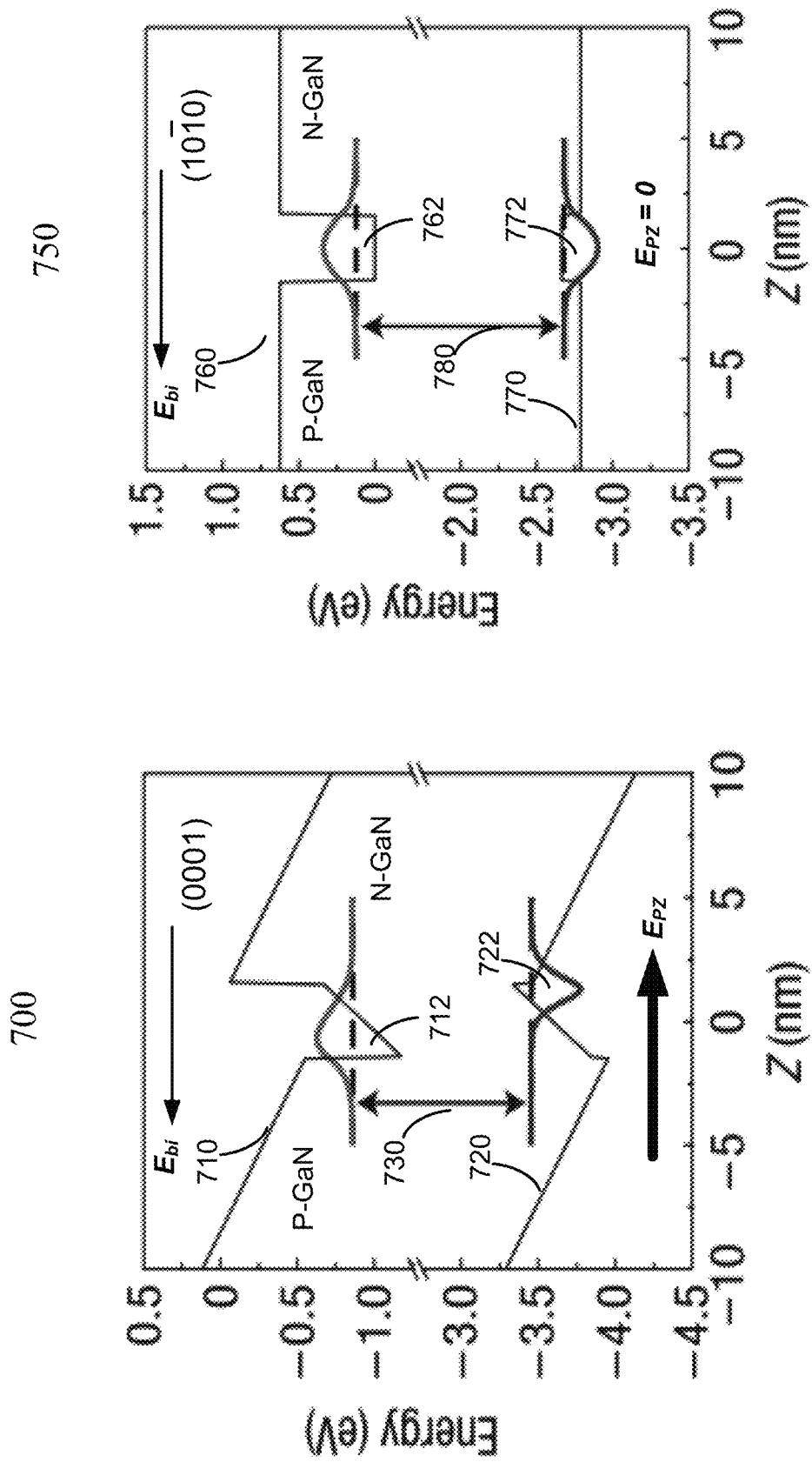
FIG. 7A illustrates energy bands of an example of a semiconductor quantum well device grown on a polar plane of a substrate.
FIG. 7B illustrates energy bands of an example of a semiconductor quantum well device grown on a nonpolar plane of a substrate.

FIG. 7A illustrates energy bands of an example of a semiconductor quantum well device 700 grown on a polar plane of a semiconductor substrate. In the absence of an electric field, electrons and holes in a quantum well may only occupy states within a discrete set of energy sub-bands. Thus, only a discrete set of frequencies of light may be absorbed or emitted by the quantum well. When an electric field is applied to the quantum well, the carrier states may shift. In a semiconductor quantum well device grown on the polar c-plane of a semiconductor substrate, the piezoelectric field $E_{PZ}$ in the growth direction (i.e., the carrier transport direction in the quantum well) may be the strongest and may be much higher than the built-in electric field $E_{bi}$ of a p-n junction. Thus, as shown in FIG. 7A, the electron energy level 712 in conduction band 710 may shift to lower energy levels, while the hole energy level 722 in valence band 720 may shift to higher energy levels. Thus, a bandgap 730 between the conduction band and valence band may reduce, which in turn reduces the frequency of the absorbed or emitted light.

Additionally, the electric field may shift electrons and holes to opposite sides of the quantum well. For example, as shown in FIG. 7A, the electron energy level 712 in conduction band 710 and the hole energy level 722 in valence band 720 are tilted in the quantum well due to the electric field. Thus, more electrons may be close to the p-GaN side, and more holes may be close to the N—GaN side. This spatial separation between the electrons and holes is limited by the presence of the potential barriers around the quantum well, and may cause a drastic decrease of the spatial electron-hole overlap (and hence the overlap integral of the holes and the electrons or the effective thickness $d_{eff}$ of the active region) in the direction of the c-axis, which may in turn reduce the radiative recombination rate and thus the internal quantum efficiency of the system.

FIG. 7B illustrates energy bands of an example of a semiconductor quantum well device 750 grown on a nonpolar plane (e.g., m-plane) of a substrate. In a semiconductor quantum well device grown on the nonpolar m-plane of the substrate, the piezoelectric field $E_{PZ}$ in the growth direction may be zero, and the built-in electric field $E_{bi}$ of a p-n junction may be relatively low. Thus, as shown in FIG. 7B, the electron energy level 762 in conduction band 760 may be flat or may have a minimum shift, and the hole energy level 772 in valence band 770 may be flat or have a minimum shift. Thus, in contrast to bandgap 730 shown in FIG. 7A, bandgap 780 between the conduction band and valence band in semiconductor quantum well device 750 may not be reduced, and thus the frequency of the absorbed or emitted light may not be reduced. In addition, because electron energy level 762 in conduction band 760 and hole energy level 772 in valence band 770 in the quantum well may be flat, the distribution of electrons and holes in the quantum well may be uniform and may overlap in the entire quantum well region. As such, the overlap integral of the holes and the electrons and thus the radiative recombination rate and the internal quantum efficiency of semiconductor quantum well device 750 may be high.

While the Auger recombination due to high current density (and high charge carrier density) may be an intrinsic process depending on material properties, non-radiative SRH recombination depends on the quality of material, such as the defect density in the active region. As described above with respect to FIGS. 4A and 4B, LEDs may be fabricated by etching a mesa structure into the active emitting layers to confine carriers within the injection area of the device and to expose the n-type material beneath the active emitting layers for electrical contact. Etching the mesa structures may lead to the formation of mesa sidewalls that are orthogonal to the growth plane. Active region in proximity to the exposed sidewalls may have a higher rates of SRH recombination than the bulk region that is far from the surface, due to a higher density of defects formed during the etch. Charge carriers injected into active regions that are within a minority carrier diffusion length from the surface may be subject to the higher SRH recombination rate, where the minority carrier diffusion length is the average distance a minority carrier moves before recombining.

For traditional, broad area LEDs used in lighting and backlighting applications (e.g., with about 0.1 mm$^2$ to about 1 mm$^2$ lateral device area), the sidewall surfaces are at the far extents of the devices and the devices can be designed such that little or no current is injected into regions within a minority carrier diffusion length of the mesa sidewalls, and thus the overall rate of SRH recombination may be low. However, in micro-LEDs, such as III-nitride micro-LEDs fabricated on (0001) oriented (i.e., c-plane) substrate (e.g., sapphire or GaN), as the size of the LED is reduced to a value comparable to or having a same order of magnitude as the minority carrier diffusion length (which may depend on the doping density and may be between, for example, about 0.1 μm to about 1 μm), a greater proportion of the total active region falls within the minority carrier diffusion length from the LED sidewall surface and thus more injected carriers are subjected to the higher SRH recombination rate. This can cause the leakage current of the LED to increase and the efficiency of the LED to decrease as the size of the LED decreases, and/or cause the peak efficiency operating current to increase as the size of the LED decreases. Increasing the current injection may cause the efficiencies of the micro-LEDs to drop due to the Auger recombination at a higher current density.

Non-radiative surface recombination may be governed, in part, by the surface recombination velocity (SRV) of the material, which describes the rate at which charge carriers are captured by a surface defect. Surface recombination velocity of a material may be reduced by passivating the surface with a suitable dielectric material, such as $SiO_2$, $SiN_x$, or $Al_2O_3$. The SRV may also be reduced by etching away highly defective surface material using a chemical treatment. Despite these efforts to reduce surface recombination, when the micro-LED mesa size reduces, the efficiency of the micro-LED generally still decreases and the peak efficiency operating current density generally still increases. These effects can lower the overall electrical-to-optical power conversion efficiency (referred to as the wall-plug efficiency) of the device.

Figure 8:
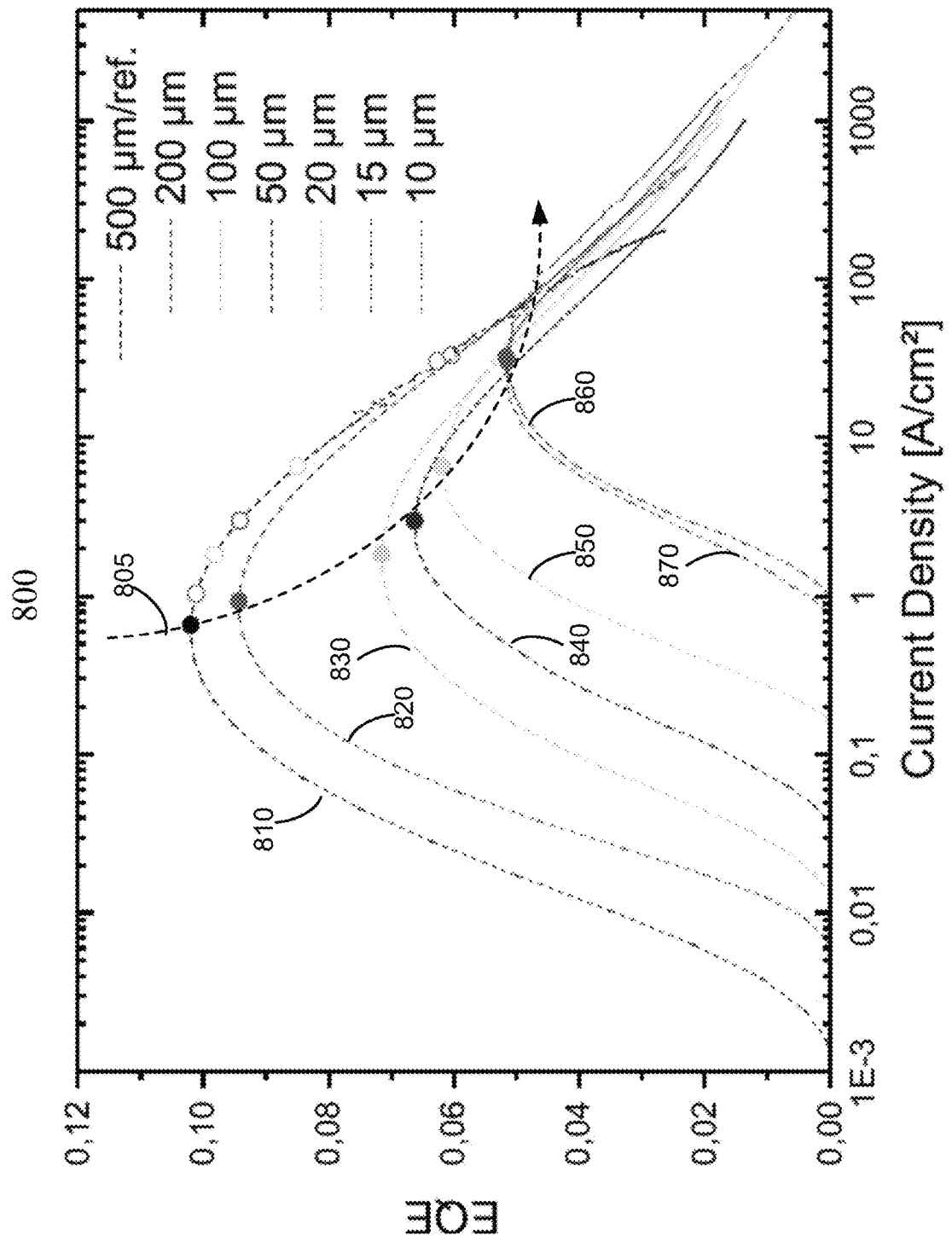
FIG. 8 illustrates the relationship between the external quantum efficiency and the current density for examples of polar micro-LED devices of different sizes.

FIG. 8 is a chart 800 illustrating the relationship between the external quantum efficiency and the current density for examples of polar micro-LED devices of different sizes. The x-axis in chart 800 represents the current density (in A/cm$^2$) of an LED device in logarithmic scale, and the y-axis represents the external quantum efficiency of the LED device at the corresponding current density. In the examples illustrated in FIG. 8, the micro-LED devices are fabricated on III-nitride materials grown on the c-plane of a substrate. Curve 810 shows the external quantum efficiency as a function of the current density for a micro-LED device having a linear dimension of about 500 μm. Curves 820, 830, 840, 850 show the external quantum efficiency as a function of the current density for micro-LED devices having a linear dimension of about 200 μm, about 100 μm, about 50 μm, and about 20 μm, respectively. Curves 860 and 870 show the external quantum efficiency as a function of the current density for micro-LED devices having a linear dimension of about 15 μm and about 10 μm, respectively, which may be close to the order of magnitude of the minority carrier diffusion length.

As shown by curves 810-870, the external quantum efficiency of a micro-LED device may be low when the current density (and thus the charge carrier density N) is low, where the low external quantum efficiency may be caused by the relatively high non-radiative SRH recombination or leakage when the charge carrier density N is low according to equation (1). As the current density (and thus the charge carrier density N) increases, the external quantum efficiency may increase because the radiative recombination may increase at a higher rate than the non-radiative SRH recombination. The external quantum efficiency may reach a peak value at a certain current density value, after which the external quantum efficiency may drop due to, for example, the relatively high non-radiative Auger recombination as described above.

As shown by a trend curve 805 in FIG. 8, in general, the larger the micro-LED, the higher the peak efficiency. For example, the peak efficiency of the micro-LED having a linear dimension of about 10 μm (shown by curve 870) may be much lower than the peak efficiency of the micro-LED having a linear dimension of about 500 μm (shown by curve 810). In addition, in general, the larger the micro-LED, the lower the current density needed to achieve the peak efficiency. For example, the peak efficiency current density of the micro-LED having a linear dimension of about 10 μm (shown by curve 870) may be much higher (e.g., >10 times) than the peak efficiency current density of the micro-LED having a linear dimension of about 500 μm (shown by curve 810). Furthermore, FIG. 8 shows that the onset of EQE appears at higher current densities for smaller LEDs due to, for example, leakage current and/or an increased proportion of non-radiative SRH recombination at sidewall defects. As shown in FIG. 8, the smaller micro-LED devices (e.g., having a linear dimension of about 15 μm or about 10 μm) may have significant low-voltage leakage or SRH recombination, where the EQE at a current density below about 1 A/cm$^2$ is very small.

As described above, conventional III-nitride LEDs grown on the (0001) plane (i.e., c-plane) oriented GaN may have a higher low-voltage leakage, a lower efficiency at a same current density, a lower peak efficiency, and a higher operating current density to achieve the peak efficiency, when the device shrinks. III-nitride LEDs can be grown on other crystal planes, such as semi-polar growth planes between the polar c-plane and non-polar a- and m-planes.

Figure 9B:
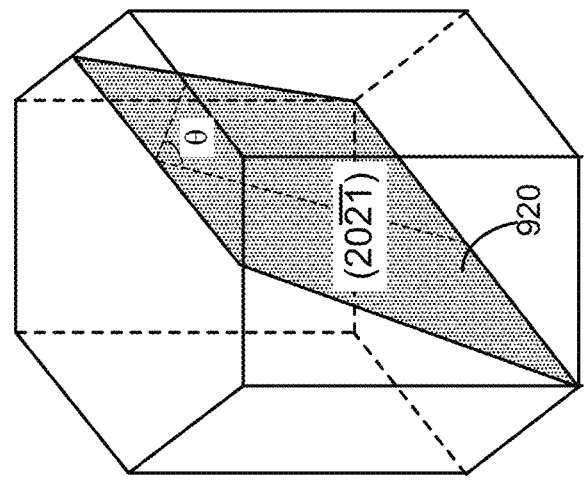
FIG. 9B illustrates another example of a semi-polar plane in a crystal material having a hexagonal crystal lattice structure according to certain embodiments.
Figure 9A:
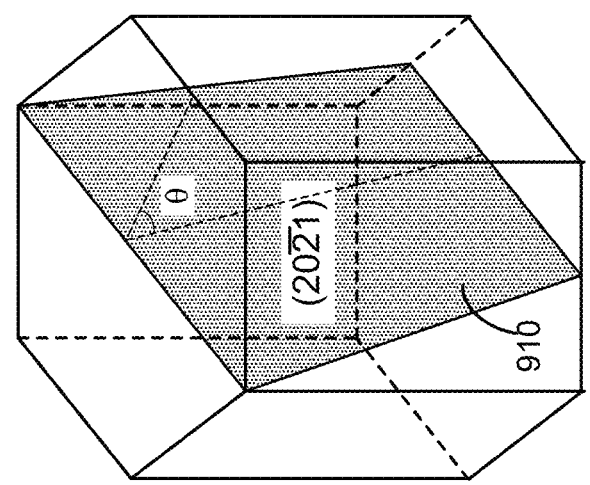
FIG. 9A illustrates an example of a semi-polar plane in a crystal material having a hexagonal crystal lattice structure according to certain embodiments.

FIG. 9A illustrates an example of a semi-polar plane 910 in a crystal material 900 having a hexagonal crystal lattice structure according to certain embodiments. FIG. 9B illustrates another example of a semi-polar plane 920 in crystal material 900 having a hexagonal crystal lattice structure according to certain embodiments. Crystal material 900 may include, for example, a III-V semiconductor material, such as GaN, or sapphire. Semi-polar plane 910 shown in FIG. 9A is the $(20\bar{2}1)$ plane, which forms an angle θ about 75° with respect to the c-plane. The $(20\bar{2}1)$ plane may be a majority-N plane, where a majority of elements on the plane are N. Semi-polar plane 920 shown in FIG. 9B is the $(20\bar{2}\bar{1})$ plane, which forms an angle θ about 105° with respect to the c-plane. The $(20\bar{2}\bar{1})$ plane may be a majority-Ga plane, where a majority of elements on the plane are Ga. Crystal material 900 may be cut along a semi-polar plane, such as the $(20\bar{2}1)$ plane or the $(20\bar{2}\bar{1})$ plane, and the facet of crystal material 900 cut along the semi-polar plane may be used as the growth surface on which epitaxial layers can be grown for fabricating micro-LEDs. GaN layers grown on the $(20\bar{2}1)$ plane and GaN layers grown on the $(20\bar{2}\bar{1})$ plane may have identical stress states but opposite polarization states. For example, an active region grown on the $(20\bar{2}\bar{1})$ plane may have a polarization discontinuity at the active region interface with the same sense (i.e. similar direction, different magnitude) as conventional c-plane GaN, whereas an active region grown on the $(20\bar{2}1)$ plane may have a polarization discontinuity of the opposite sense to that of $(20\bar{2}\bar{1})$ plane or c-plane GaN layer.

According to certain embodiments, micro-LEDs are fabricated on III-nitride material (e.g., GaN) layers having certain semi-polar crystal orientations. The III-nitride material layers may be grown on a substrate (e.g., GaN or sapphire) that is cut along a semi-polar plane and thus may have a surface in the semi-polar plane. The fabricated micro-LED can achieve a better efficiency performance than micro-LED devices fabricated on III-nitride materials with conventional (e.g., c-plane) orientations. More specifically, for micro-LEDs fabricated on III-nitride materials with certain semi-polar orientations between the polar c-plane and non-polar a- or m-plane, the quantum efficiency of the micro-LEDs does not drop with decreasing micro-LED size, and the operating current at the peak quantum efficiency does not increase with decreasing micro-LED size. Thus, GaN materials with certain orientations can produce better performing micro-LED devices than GaN materials with conventional c-plane orientations.

Micro-LEDs with different semi-polar orientations are manufactured and tested. The experimental results show that using GaN materials with certain semi-polar orientations, such as the $(20\bar{2}1)$ plane GaN material, can result in a sustained peak quantum efficiency and a sustained low (~1 A/cm²) peak efficiency drive current density as the micro-LED size decreases. On some other crystallographic orientations, such as the $(20\bar{2}\bar{1})$ plane, typical efficiency characteristics with decreasing mesa size as shown in FIG. 8 are observed.

Thus, the orientation of the growth plane may significantly affect the device performance. For example, the device may perform better when the device is grown on a semi-polar plane that has an angle between 0° and 90° (such as between about 45° and about 90° or between about 60° and about 90°, such as 75°) with respect to the c-plane. This higher performance of semi-polar GaN micro-LEDs may be due to, for example, the unique crystallography of the semi-polar mesas grown on certain semi-polar planes, where the exposed sidewall facets of the semi-polar micro-LEDs are different from the exposed sidewall facets of conventional c-plane LEDs. For example, the exposed sidewall facets may be majority-N planes, where a majority of the elements in the planes are N, rather than Ga. The exposed sidewall facets may also be easier to passivate with a dielectric material or may be less susceptible to the formation of surface defects. Alternatively or additionally, the defects in semiconductor material layers grown on these semi-polar planes may have an inherently lower SRV, or the lateral diffusion length of the minority carriers may be smaller for semiconductor material layers with the semi-polar orientations. As such, the non-radiative SRH recombination may be reduced even for micro-LEDs with small lateral sizes, such as 5 µm or smaller.

Figure 10:
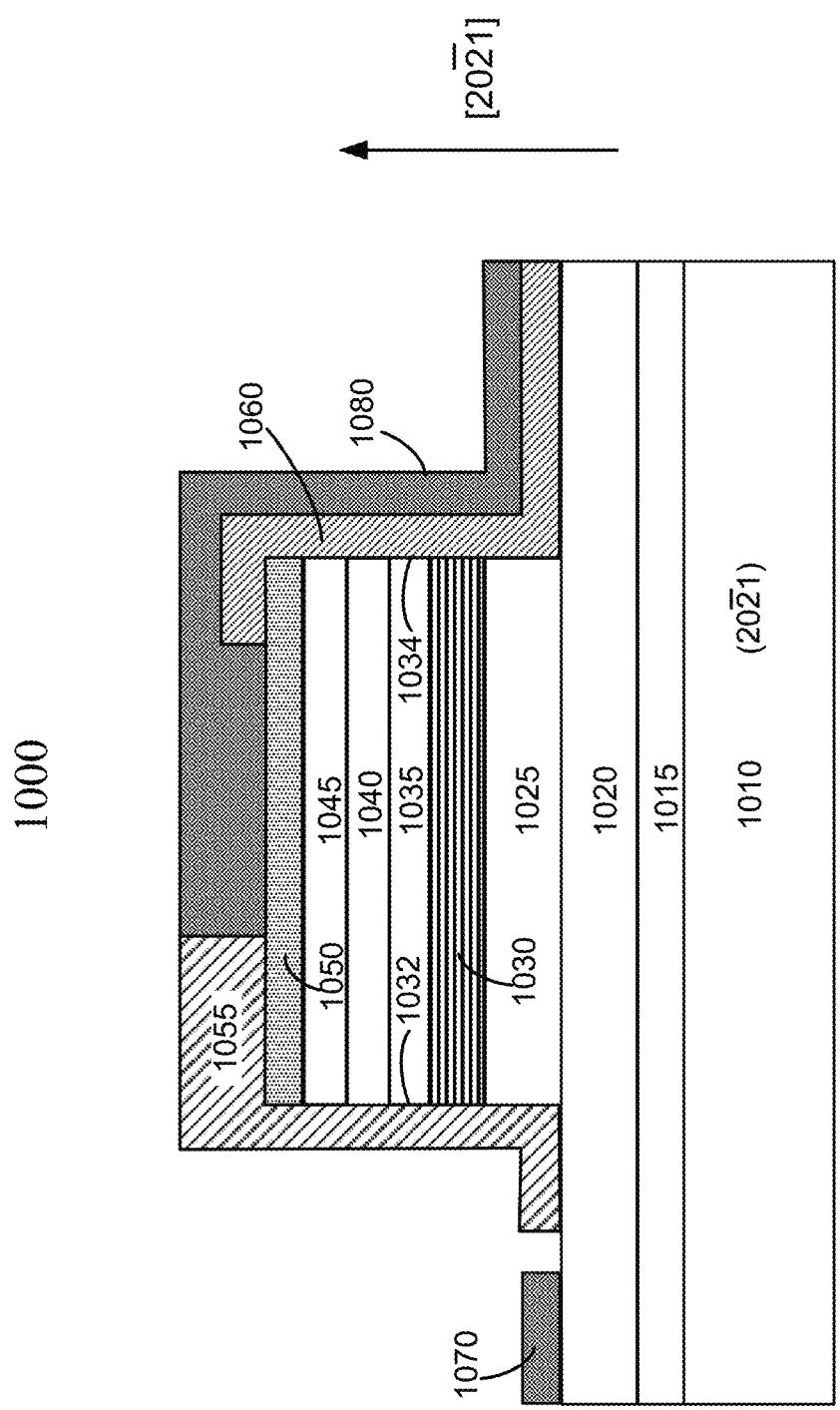
FIG. 10 illustrates an example of a micro-LED device including semiconductor materials having a semi-polar crystal lattice orientation according to certain embodiments.

FIG. 10 is a cross-sectional view of an example of a micro-LED device 1000 including semiconductor materials having a semi-polar crystal lattice orientation according to certain embodiments. Micro-LED device 1000 may include a substrate 1010, where a surface 1012 of substrate 1010 is a semi-polar $(20\bar{2}1)$ plane. Substrate 1010 may include, for example, a sapphire substrate, a GaN substrate, or another III-V semiconductor substrate. A buffer layer 1015 may be grown on surface 1012 of substrate 1010. Buffer layer 1015 may be used to accommodate the differences in two crystallographic structures and to reduce misfit strain and misfit dislocations. One example of buffer layer 1015 may include an undoped or unintentionally doped (UID) GaN. An n-GaN layer 1020 may be formed on buffer layer 1015. N—GaN layer 1020 may be a GaN layer doped with, for example, silicon or germanium. A barrier layer 1025 may be formed on n-GaN layer 1020. Barrier layer 1025 may include, for example, InGaN/GaN superlattice. An active region 1030 may be formed on barrier layer 1025. Active region 1030 may include one or more quantum wells, such as a multiple-quantum-well (MQW) including multiple (e.g., 2-6) quantum wells. In one example, active region 1030 may include an InGaN/GaN MQW that can generate green or blue light (e.g., at about 447 nm). An electron-blocking layer 1035 may be formed on active region 1030 to reduce the electron leakage current and improve the efficiency of the LED. A p-GaN layer 1040 may be formed on electron-blocking layer 1035. p-GaN layer 1040 may be doped with, for example, Mg, Mg, Ca, Zn, or Be. A p⁺-GaN layer 1045 (or P⁺⁺-GaN layer) may be formed on p-GaN layer 1040 to reduce the contact resistance. A conductor layer 1050, such as a transparent ITO layer, may be deposited on p⁺-GaN layer 1045.

The layer stack that includes barrier layer 1025, active region 1030, electron-blocking layer 1035, p-GaN layer 1040, p⁺-GaN layer 1045, conductor layer 1050, and, in some embodiments, a portion of n-GaN layer 1020 may be etched to form a mesa structure. The mesa structure may include sidewalls 1032 and 1034, which may be passivated by a passivation layer that includes, for example, a $SiO_2$, $SiN_x$, or $Al_2O_3$ layer. In some embodiments, at least some portions of sidewall 1032 or 1034 may be coated with an omnidirectional reflector (ODR) that includes, for example, $Ta_2O_5$ and/or $SiO_2$. Electrode layers 1070 and 1080 may then be formed on n-GaN layer 1020 and conductor layer 1050, respectively. Electrode layers 1070 and 1080 may include, for example, Al, Ni, Au, or any combination thereof.

Figure 11:
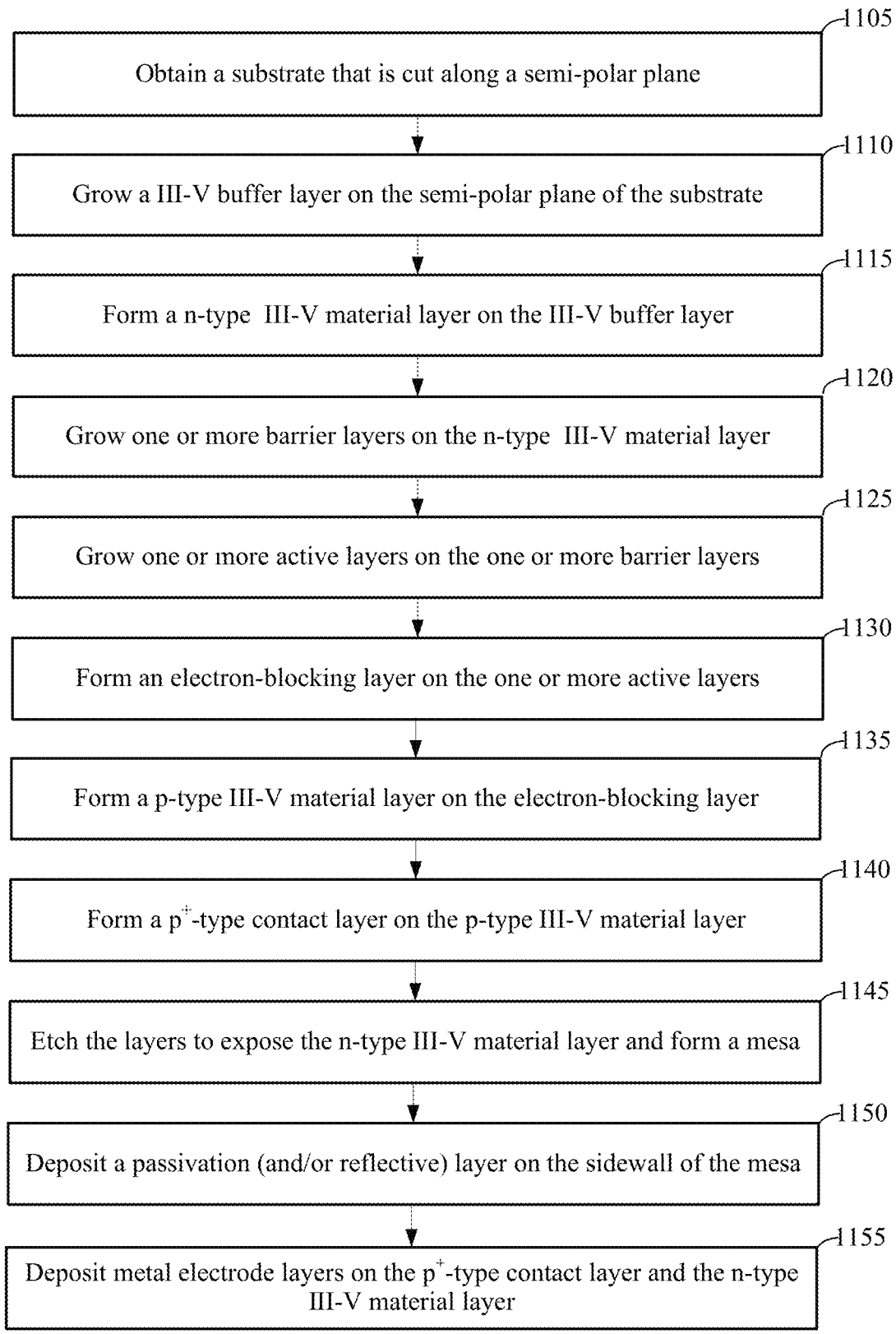
FIG. 11 is a flow chart illustrating an example of a method of fabricating a micro-LED device according to certain embodiments.

FIG. 11 is a flow chart 1100 illustrating an example of a method of fabricating a micro-LED device with improved light emission efficiency according to certain embodiments. The operations described in flow chart 1100 are for illustration purposes only and are not intended to be limiting. In various implementations, modifications may be made to flow chart 1100 to add additional operations or to omit some operations. The operations described in flow chart 1100 may be performed by, for example, one or more semiconductor fabrication systems that include, for example, molecular beam epitaxy (MBE) or metalorganic chemical vapor deposition (MOCVD) equipment.

At block 1105, a substrate, such as a sapphire substrate or a bulk III-V semiconductor substrate (e.g., GaN substrate) may be cut along a semi-polar plane (e.g., the (20$\bar{2}$1) plane). Thus, the exposed facet of the substrate (e.g., substrate 1010) may be a semi-polar plane, rather than the conventional c-plane. Optionally, at block 1110, a III-V buffer layer (e.g., buffer layer 1015) may be grown on the exposed semi-polar facet of the substrate. The buffer layer may be used to accommodate the differences in two crystallographic structures and to reduce misfit strain and misfit dislocations. One example of the buffer layer may include an undoped or unintentionally doped (UID) GaN layer. At block 1115, an n-type III-V material layer (e.g., n-GaN layer 1020) may be formed on the buffer layer. The n-type III-V material layer may be formed by growing a GaN layer and then doping the GaN layer with, for example, silicon or germanium. Optionally, at block 1120, one or more barrier layers (e.g., barrier layer 1025) may be formed on the n-type III-V material layer. The one or more barrier layers may include, for example, a superlattice structure. The superlattice structure may include a periodic structure of layers of two or more materials, such as InGaN and GaN, where the thickness of each layer may be several nanometers.

At block 1125, one or more active layers (e.g., active region 1030) may be formed on the one or more barrier layers. The one or more active layers may include one or more quantum wells, such as a MQW including multiple (e.g., about 2 to 6) quantum wells. In one example, the one or more active region includes an InGaN/GaN MQW that can generate green or blue light. Optionally, at block 1130, an electron-blocking layer (e.g., electron-blocking layer 1035) may be formed on the one or more active layers to reduce the electron leakage current and improve the efficiency of the LED. In one example, the electron-blocking layer may include an AlGaN layer. At block 1135, a p-type III-V material layer (e.g., p-GaN layer 1040) may be formed on the electron-blocking layer by, for example, growing a GaN layer and doping the GaN layer with, for example, Mg, Mg, Ca, Zn, or Be. At block 1140, a $p^+$-type or $p^{++}$-type contact layer (e.g., $p^+$-GaN layer 1045) may be formed on the p-type III-V material layer to reduce the contact resistance. The $p^+$-type or $p^{++}$-type contact layer may include, for example, a GaN layer heavily doped with Mg. Optionally, a conductor layer (e.g., conductor layer 1050), such as a transparent ITO layer, may be deposited on the $p^+$-type or $p^{++}$-type contact layer.

At block 1145, the layer stack that includes, for example, the barrier layer, the active layer(s), the electron-blocking layer, the p-type III-V material layer, the $p^+$-type contact layer, the conductor layer, and, in some embodiments, a portion of the n-type III-V material layer, may be etched to form a mesa structure, such as a vertical mesa structure. The mesa structure may include sidewalls (e.g., sidewalls 1032 and 1034). At block 1150, a passivation and/or reflection layer may be deposited on the sidewalls of the mesa structure. The passivation layer may include, for example, a $SiO_2$, $SiN_x$, or $Al_2O_3$ layer. In some embodiments, at least some portions of the sidewalls may be coated with an omnidirectional reflector (ODR) that includes, for example, $Ta_2O_5$ and/or $SiO_2$. The passivation and/or reflection layer may help to reflect the photons emitted by the active layers out of the LED to improve the extraction efficiency of the LED. In some embodiments, before forming the passivation and/or reflection layer, the sidewalls of the mesa structure may be chemically etched to remove the defects at the sidewalls due to physical etching. At block 1155, metal electrode layers (e.g., electrode layers 1070 and 1080) may be deposited on the n-type III-V material layer and the $p^+$-type contact layer (or the conductor layer), respectively. The metal electrode layers may include, for example, Al, Ni, Au, or any combination thereof.

It is noted that even though only one mesa structure (and one micro-LED) is described with respect to FIG. 11, in some embodiments, at block 1145, many mesa structures, such as a one-dimensional or two-dimensional array of mesa structures, may be etched on a same die or a same wafer that has the layers of III-V materials grown on a same substrate. The passivation and/or reflection layer may be deposited on the sidewalls of the array of mesa structures at block 1150. A metal electrode layer may be deposited on the $p^+$-type contact layer of each of the array of mesa structures to form an electrode (e.g., anode) for each of an array of micro-LEDs at block 1155. In some embodiments, the array of micro-LEDs may share a same metal contact (e.g., a shared cathode) on the n-type III-V material layer, and can be individually addressed through the respective anode. The array of micro-LEDs fabricated on the same die or same wafer may have similar characteristics and performance, and thus a better uniformity among the array of micro-LEDs.

Figure 12:
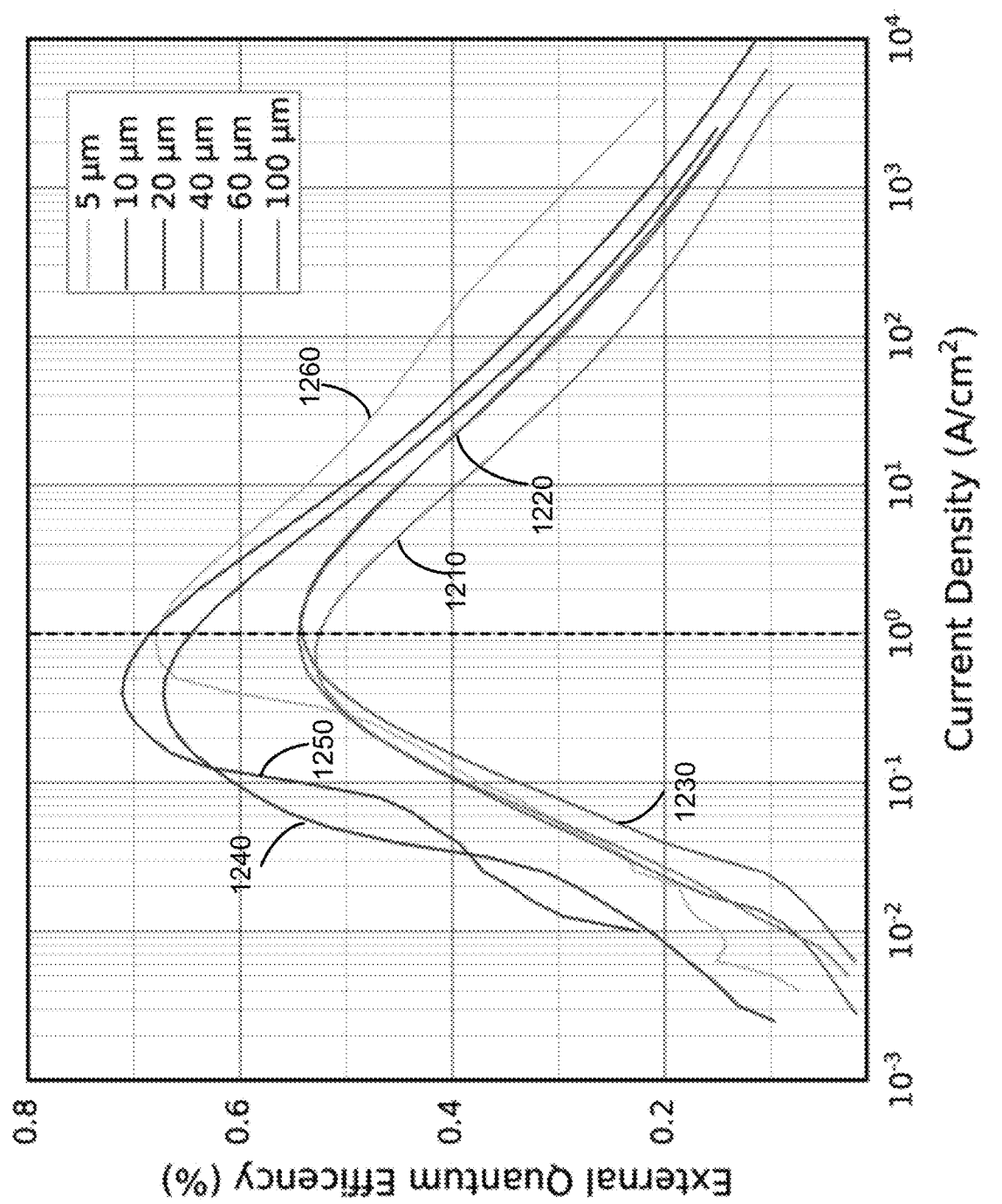
FIG. 12 illustrates the relationship between external quantum efficiency and current density for examples of semi-polar micro-LED devices having different sizes according to certain embodiments.

FIG. 12 illustrates the relationship between external quantum efficiency and current density for examples of semi-polar micro-LED devices having different sizes according to certain embodiments. The examples of micro-LED devices shown in FIG. 12 are grown on the semi-polar (20$\bar{2}$1) facet of GaN substrates. The examples of micro-LED devices shown in FIG. 12 may have a structure as shown in FIG. 10 and may emit green light. Curve 1210 illustrates the external quantum efficiency as a function of the current density for a micro-LED device having a linear dimension of about 100 μm. Curves 1220, 1230, 1240, 1250 show the external quantum efficiency as a function of the current density for micro-LED devices having a linear dimension of about 60 μm, about 40 μm, about 20 μm, and about 10 μm, respectively. Curve 1260 shows the external quantum efficiency as a function of the current density for a micro-LED device having a linear dimension of about 5 μm.

As shown by curves 1210-1260, the external quantum efficiency of a micro-LED device may be low when the current density (and thus the charge carrier density) is low, where the low external quantum efficiency may be caused by the relatively high non-radiative SRH recombination when the charge carrier density is low. As the current density increases, the external quantum efficiency may increase because the radiative recombination increases at a higher rate than the non-radiative SRH recombination when the charge carrier density is high. The external quantum efficiency may reach a peak value at a certain current density value, after which the external quantum efficiency may drop due to, for example, the higher non-radiative Auger recombination as described above.

As also shown by curves 1210-1260, for a same current density, the external quantum efficiency of a micro-LED device having a smaller die size (e.g., 5, 10, or 20 µm) may be similar to or higher than the external quantum efficiency of a micro-LED device having a larger die size (e.g., 40, 60, or 100 µm). The peak efficiency of micro-LED devices having a linear dimension of about 5 µm (shown by curve 1260), 10 µm (shown by curve 1250), and 20 µm (shown by curve 1240) may be about the same or even higher than the micro-LED devices having a linear dimension of about 100 µm (shown by curve 1210), a linear dimension of about 60 µm (shown by curve 1220), and a linear dimension of about 40 µm (shown by curve 1230). In addition, in general, the peak efficiency current density of the micro-LED having a linear dimension of about 5 µm (shown by curve 1260), 10 µm (shown by curve 1250), and 20 µm (shown by curve 1240) may be about the same (e.g., less than 1 A/cm$^2$) or even lower than the micro-LED devices having a linear dimension of about 100 µm (shown by curve 1210), a linear dimension of about 60 µm (shown by curve 1220), and a linear dimension of about 40 µm (shown by curve 1230). Furthermore, FIG. 12 shows that an EQE greater than a half of the peak EQE can be achieved for the micro-LED devices having a linear dimension of about 5 µm to about 100 µm at a current density of about 0.1 A/cm$^2$.

Thus, compared with the c-plane micro-LED devices (e.g., as shown in FIG. 8), the semi-polar micro-LEDs disclosed herein have a reduced low-voltage leakage for micro-LEDs having vertical mesas due to, for example, lower surface recombination losses as described above. Previously, a reduced low-voltage leakage is generally observed in micro-LEDs having parabolic-shaped mesas rather than vertical mesas. In addition, the semi-polar micro-LEDs disclosed herein can maintain their peak efficiency and have a low peak current density, for example, less than 1 A/cm$^2$, even when the linear dimension of the micro-LED decreases to about 5 µm.

InGaN/GaN c-plane LED devices generally have large internal fields in the quantum-well light emitting layers. The internal fields may include the polarization-induced internal field (e.g., caused by piezoelectric polarization and spontaneous polarization) and the built-in deletion field of the p-n junction. The field in a heterostructure of an LED device may cause the electron and hole energy levels to shift (thus changing the bandgap), which may be referred to as the Quantum-Confined Stark Effect (QCSE). The QCSE arises when a quantum-confined system is subjected to an electric field along the axis of carrier confinement. For semiconductor quantum wells, the internal field in the quantum well may skew the potential well, and cause the hole and electron energy levels to shift, thus decreasing the gap between these energy levels. These changes may be accompanied by a change to the exciton energy due to a reduction of the Coulombic interaction as the electrons and holes become spatially separated. The quantum well barriers may prevent field ionization that may occur in unconstrained systems under large fields. The QCSE may sometimes manifest as a net decrease in the energy of the exciton and thus a red-shift of its optical emission spectrum.

Heterostructures grown on c-plane substrates may suffer from a strong internal electric field in the carrier transport direction, which may be induced by the piezoelectric polarization and spontaneous polarization parallel to the most natural crystal growth direction [0001] (i.e., the c-axis). The polarization-induced electric fields in the carrier transport direction may cause a red-shift of the exciton emission energy inside these heterostructures. For example, as shown in FIG. 7A, due to the distortion of the energy bands caused by the polarization-induced internal field, the photoluminescence emission wavelength of a c-plane quantum well under zero bias may be red-shifted (i.e., having a longer wavelength and a lower energy) compared to a quantum well with no polarization effects. With increasing external bias voltage (and electrical field), the energy bands may be gradually flattened and the emission wavelength of the quantum well may blue-shift (i.e., having a shorter wavelength and a higher energy) as the internal electric fields may be at least partially screened by the injection of free carriers.

As described above with respect to FIGS. 7A and 7B, polarization-induced internal fields in the growth direction are the highest for c-plane device and reach a minimum for m-plane device. For semi-polar planes having an angle θ with respect to the c-plane between 0° and 90° (such as between about 45° and about 90° or between about 60° and about 90°), the polarization field in the growth direction (and thus QCSE) lies somewhere between these extremes. For c-plane LEDs, the blue-shift between spontaneous emission and emission in the biased condition can be significant (e.g., >30 nm). For m-plane LEDs, epitaxial growth of high-quality light emitting material layers may be difficult. Semi-polar GaN may be capable of accommodating sufficient stress before catastrophic morphological breakdown occurs, including the propagation of 1D and 2D extended defects. As a result, semi-polar GaN may be capable of producing highly efficient LEDs with reduced QCSE and blue-shift.

Figure 13:
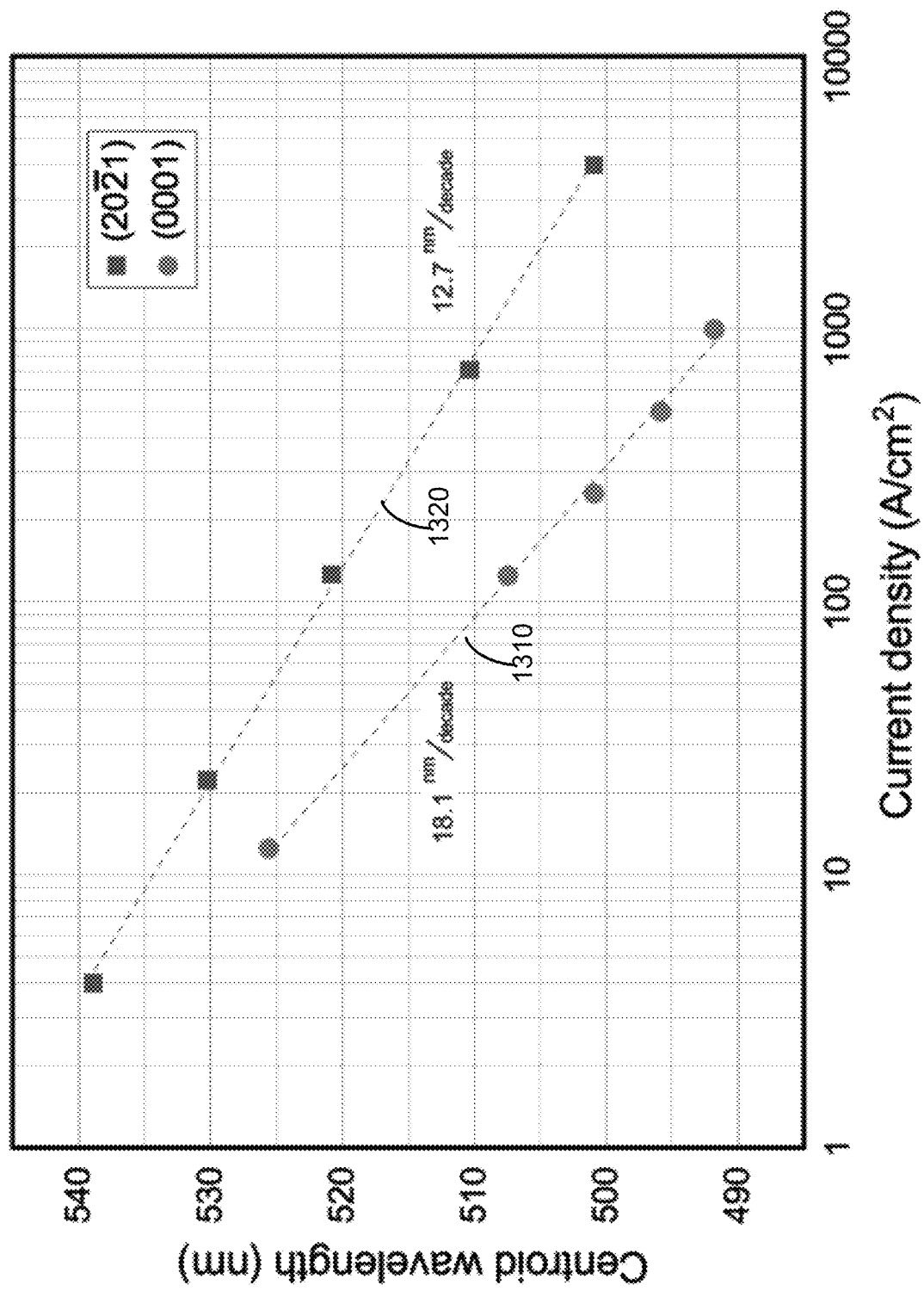
FIG. 13 illustrates the relationship between the center wavelength of the emitted light and the current density for micro-LEDs including semiconductor materials with different crystal lattice orientations according to certain embodiments.

FIG. 13 illustrates the relationship between the center wavelength of the emitted light and the bias current density for semi-polar micro-LEDs including semiconductor materials with different crystal lattice orientations according to certain embodiments. A line 1310 shows the change in the center wavelength of the emitted green light with the change in bias current density for micro-LEDs grown on the (0001) plane of a substrate. Line 1310 shows that the center wavelength of the emitted green light changes with the bias current density at a rate of about −18 nm/decade. In other words, the center wavelength of the emitted green light decreases 18 nm when the bias current density increases 10 times. A line 1320 shows the change in the center wavelength of the emitted green light with the change in bias current density for micro-LEDs grown on the semi-polar (20$\bar{2}$1) plane of a substrate. Line 1320 shows that the center wavelength of the emitted green light changes with the bias current density at a slower rate of about −12.7 nm/decade. Thus, FIG. 13 shows that the blue-shift can also be reduced by growing the LEDs on a semi-polar plane (e.g., (20$\bar{2}$1) plane) of a substrate. In other words, the QCSE can be reduced by fabricating the LEDs on the semi-polar (20$\bar{2}$1) plane of a substrate.

In LEDs fabricated on GaN layers grown on substrates having certain semi-polar orientations, such as on the (20$\bar{2}$$\bar{1}$) plane, the built-in depletion field and the polarization-induced internal field at a typical operating voltage may be approximately equal in magnitude and have opposing directions, which may result in minimal internal fields in (20$\bar{2}$$\bar{1}$) InGaN QWs and a significant reduction in QCSE. However, indium-rich InGaN layers grown on (20$\bar{2}$$\bar{1}$) may be unstable and can form stacking faults, which are extended defects within a crystal that can significantly reduce the radiative efficiency of LEDs. A (20$\bar{2}$1) plane-oriented GaN substrate can be used to more reliably grow epitaxial layers that can incorporate much more indium in the InGaN layers before stacking faults may be formed. However, in n-GaN-down LEDs (where the n-GaN layer of the LED is grown before the quantum-well layers and the p-GaN layer) grown on the (20$\bar{2}$1) semipolar plane, such as micro-LED device 1000, the built-in depletion field and the polarization-induced internal field may be in the same direction, and thus the QCSE effect and the blue-shift can be larger than those in $(20\bar{2}1)$ plane-oriented InGaN/GaN QWs.

Figure 14:
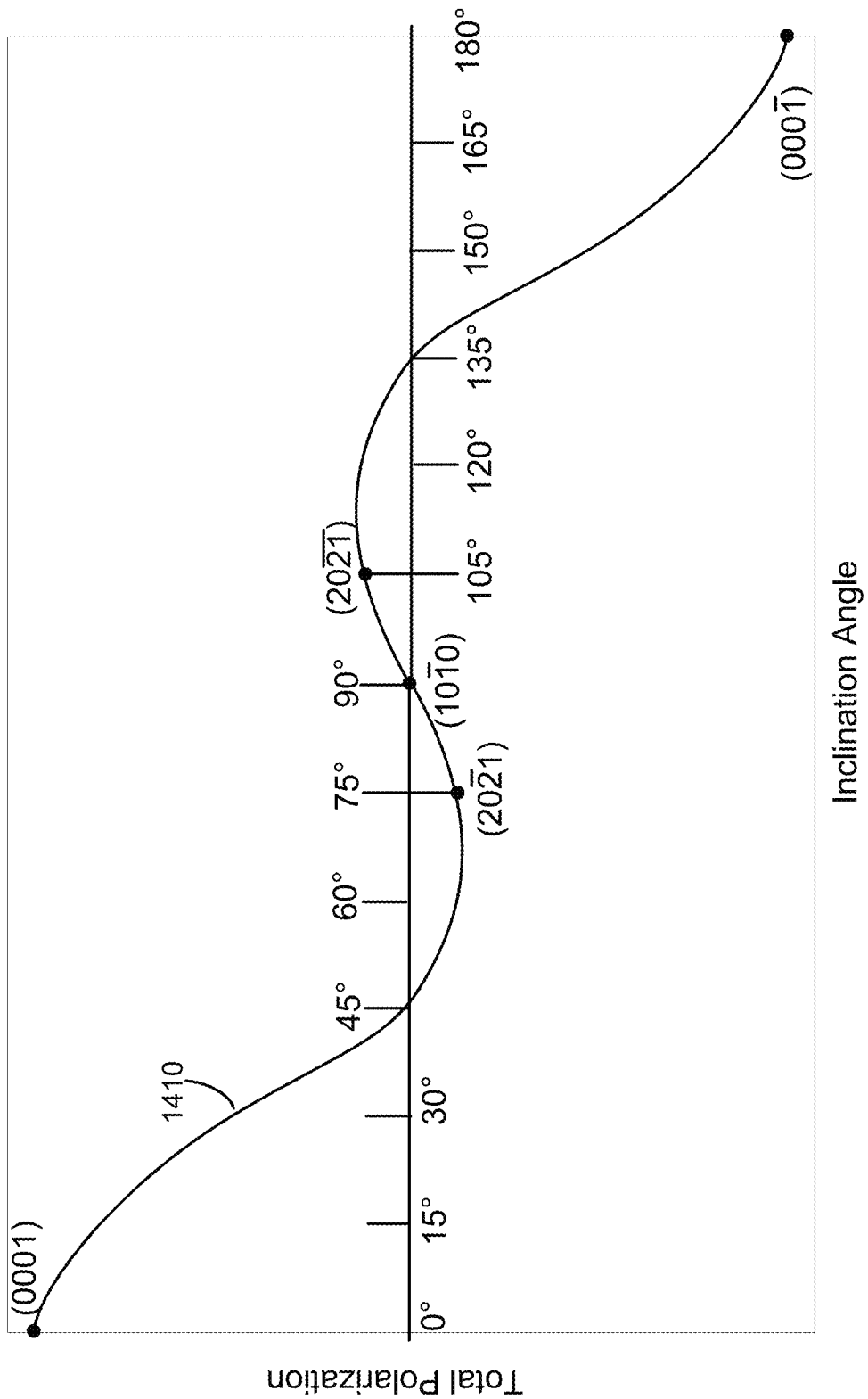
FIG. 14 illustrates the polarization charge densities at the interfaces of quantum well structures (e.g., InGaN/GaN QWs) having different crystal lattice orientations with respect to the c-axis.

FIG. 14 illustrates a curve 1410 that shows the polarization charge densities at the interfaces of quantum well structures (e.g., InGaN/GaN QWs) having different crystal lattice orientations with respect to the c-axis. III-nitride semiconductor heterostructures may experience both piezoelectric polarization and spontaneous polarization. The piezoelectric polarization may be caused by the strain in the III-nitride layers, and thus may be referred to as strain-induced piezoelectric polarization. Spontaneous polarization may be present in unstrained (i.e., fully relaxed) lattices and may be due to charge asymmetry. In InGaN/GaN QWs, the piezoelectric polarization may be much larger than the spontaneous polarization, and may increase with the increase in indium concentration. When the growth plane is inclined from the c-plane by an inclination angle θ, the piezoelectric polarization induced by the anisotropic strain for an InGaN layer on a GaN layer can be calculated based on the anisotropic linear elasticity. The total polarization as a function of inclination angle θ can be determined based on the strain-induced piezoelectric polarization and the known or calculated values of spontaneous polarization.

As shown by curve 1410, the total polarization charge density at the surface of an InGaN layer on a GaN layer may be the largest when the surface of the InGaN layer is on the c-plane, and may become 0 when the surface of the InGaN layer is at 45° with respect to the c-axis. The total polarization charge density at the surface of an InGaN layer may change sign for semi-polar plane-oriented InGaN layers having inclination angles between 45° and 90° with respect to the c-axis, such as a $(20\bar{2}1)$ plane-oriented InGaN layer that has an inclination angle 75° with respect to the c-axis. The total polarization charge density at the surface of an InGaN layer may become zero when the InGaN layer is oriented on the nonpolar a-plane or the nonpolar $(10\bar{1}0)$ m-plane (i.e., with an inclination angle 90°), and may change sign again for semi-polar plane-oriented InGaN layers having inclination angles between 90° and 135° with respect to the c-axis, such as a $(20\bar{2}\bar{1})$ plane-oriented InGaN layer that has an inclination angle 105° with respect to the c-axis.

Figures 15A, 15B:
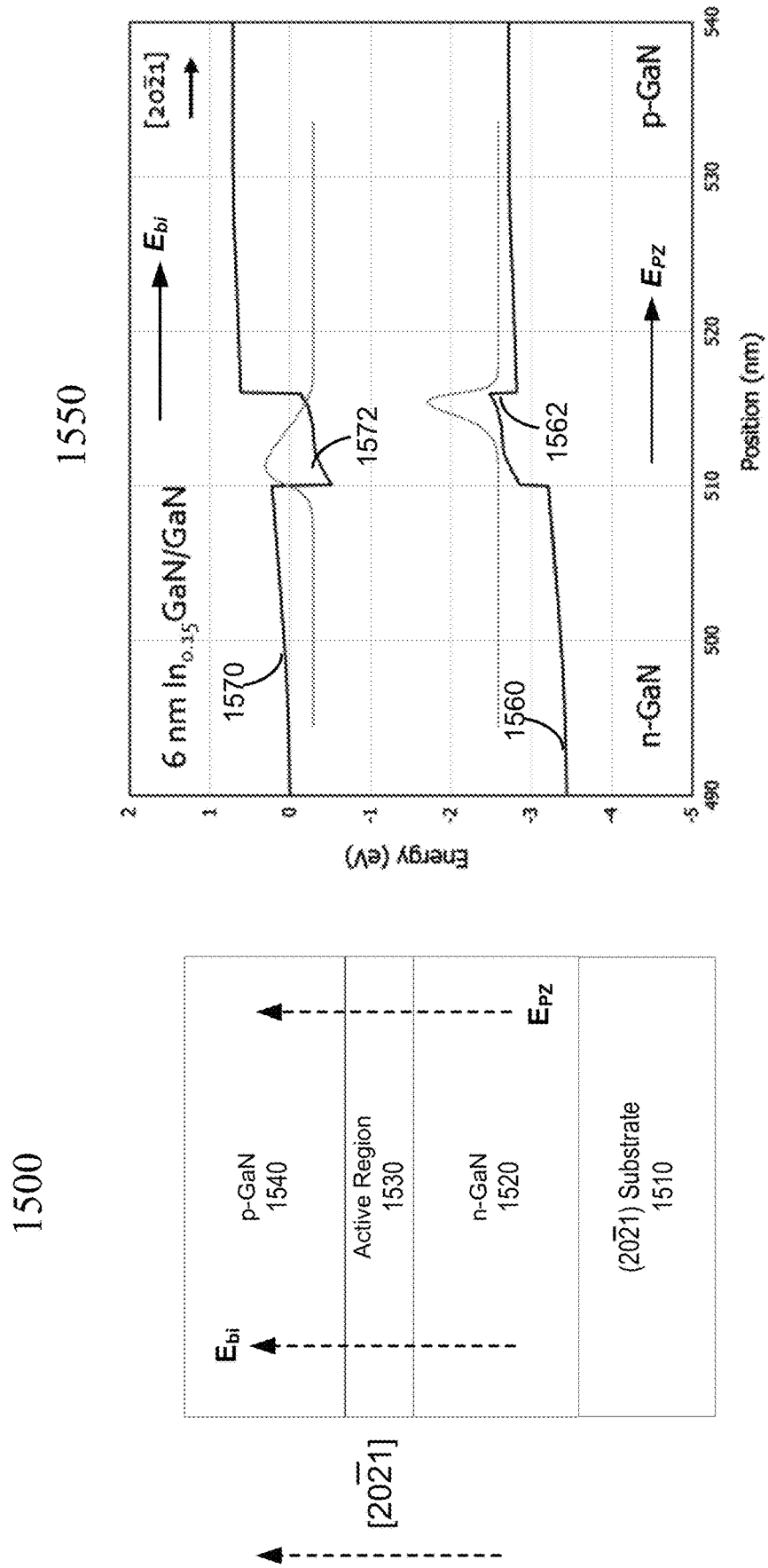
FIG. 15A illustrates the polarization-induced internal field and the built-in electric field in a light emitting diode fabricated in (20$\bar{2}$1) plane-oriented GaN layers.
FIG. 15B illustrates the Quantum-Confined Stark Effect (QCSE) in a light emitting diode fabricated in (20$\bar{2}$1) plane-oriented InGaN/GaN layers.

FIG. 15A illustrates the polarization-induced internal field and the built-in electric field in a light emitting diode 1500 fabricated in $(20\bar{2}1)$ plane-oriented GaN layers. Light emitting diode 1500 includes a $(20\bar{2}1)$ plane-oriented substrate 1510. An n-GaN layer 1520, an active region 1530 (e.g., an InGaN/GaN MQW), and a p-GaN layer 1540 of light emitting diode 1500 are grown on the $(20\bar{2}1)$ plane-oriented substrate 1510. The polarization-induced internal field $E_{pz}$ is mainly caused by the piezoelectric polarization, and may be in the direction from n-GaN layer 1520 to p-GaN layer 1540 (i.e., the growth direction). The built-in depletion field EN of the p-n junction is also in the direction from n-GaN layer 1520 to p-GaN layer 1540. Thus, the total internal field may be greater than the polarization-induced internal field $E_{pz}$ or the built-in depletion field $E_{bi}$.

FIG. 15B illustrates the Quantum-Confined Stark Effect (QCSE) in a light emitting diode 1550 fabricated in $(20\bar{2}1)$ plane-oriented InGaN/GaN layers. The conduction band of light emitting diode 1550 is shown by a curve 1570 and the valence band is shown by a curve 1560. Because the polarization-induced internal field $E_{pz}$ and the built-in depletion field EN are in the same direction, the QCSE in light emitting diode 1550 may be increased, and the electron energy level 1572 of the quantum well in the InGaN layer in the conduction band may be tilted and shifted to lower energy levels, while the hole energy level 1562 of the quantum well in the InGaN layer in the valence band may be tilted and shifted to higher energy levels. The electric field may also shift electrons and holes to opposite sides of the quantum well. For example, as shown in FIG. 15B, electrons accumulate near the n-GaN interface of the quantum well, and holes accumulate near the p-GaN interface of the quantum well, thus reducing the spatial electron-hole overlap and the radiative recombination rate.

Figure 16:
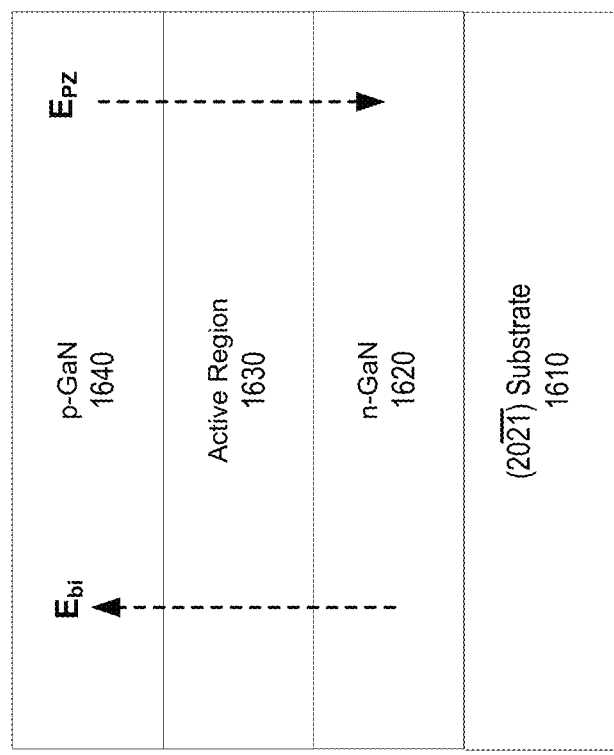
FIG. 16 illustrates the polarization-induced internal field and the built-in electric field in a light emitting diode fabricated in (20$\bar{2}\bar{1}$) plane-oriented GaN layers.

FIG. 16 illustrates the polarization-induced internal field and the built-in electric field in a light emitting diode 1600 fabricated in $(20\bar{2}\bar{1})$ plane-oriented GaN layers. Light emitting diode 1600 includes a $(20\bar{2}\bar{1})$ plane-oriented substrate 1610. An n-GaN layer 1620, an active region 1630 (e.g., an InGaN/GaN MQW), and a p-GaN layer 1640 of light emitting diode 1600 are grown on the $(20\bar{2}\bar{1})$ plane-oriented substrate 1610. The polarization-induced internal field $E_{pz}$ is mainly caused by the piezoelectric polarization, and may be in the direction from p-GaN layer 1640 to n-GaN layer 1620 (i.e., opposite to the growth direction). The built-in depletion field EN of the p-n junction is in the direction from n-GaN layer 1620 to p-GaN layer 1640. Thus, the polarization-induced internal field $E_{pz}$ and the built-in depletion field $E_{bi}$ may at least partially cancel out to reduce or minimize the total internal field and thus the QCSE of light emitting diode 1600.

Semi-polar $(20\bar{2}\bar{1})$ InGaN/GaN QWs may have a flatter energy band structure that leads to increased electron and hole wavefunction overlap, stable emission wavelength with increasing current density, and improved efficiency droop characteristics. However, InGaN layers epitaxially grown on the semi-polar $(20\bar{2}\bar{1})$ plane may suffer from performance-limiting defects, such as stacking faults that can significantly reduce the radiative efficiency.

According to certain embodiments, epitaxial layers of an LED can be grown on the $(20\bar{2}1)$ semipolar plane of a substrate, where the p-GaN layer of the LED is grown before the active layers and the n-GaN layer of the LED (which is referred to herein as p-GaN-down LED or PDLED). Thus, the polarization field remains in the growth direction (e.g., determined by the crystal symmetry of the substrate), but the direction of the p-n junction is switched and thus the built-in field switches direction accordingly. As such, the overall polarization-induced internal field is opposite to the built-in depletion field, thus reducing or minimizing the overall internal field and hence the QCSE of the LED.

Figure 17:
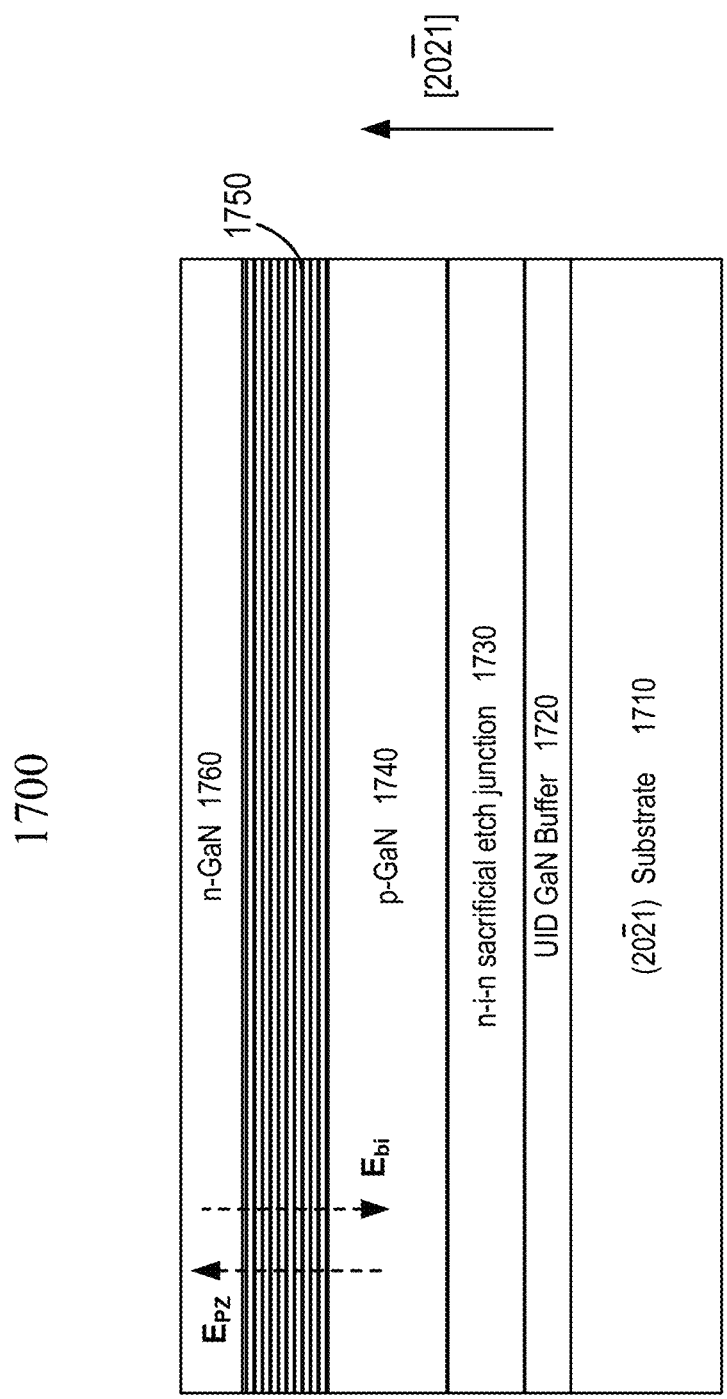
FIG. 17 illustrates a p-GaN-down light emitting diode fabricated in epitaxially grown (20$\bar{2}$1) plane-oriented GaN layers according to certain embodiments.

FIG. 17 illustrates a p-GaN-down light emitting diode 1700 fabricated in epitaxially grown $(20\bar{2}1)$ plane-oriented GaN layers according to certain embodiments. Light emitting diode 1700 includes a $(20\bar{2}1)$ plane-oriented substrate 1710. An unintentionally doped (UID) buffer layer 1720 may be formed on substrate 1710 as described above with respect to buffer layer 1015. An n-i-n sacrificial etch junction 1730 may be grown on UID buffer layer 1720. A p-GaN layer 1740, an active region 1750 (e.g., an InGaN/GaN MQW), and an n-GaN layer 1760 of light emitting diode 1700 may be grown on n-i-n sacrificial etch junction 1730. Because p-GaN layer 1740 is grown before active region 1750 and n-GaN layer 1760 and is buried under active region 1750 and n-GaN layer 1760, light emitting diode 1700 may be referred to as a p-GaN-down LED (or PDLED). The polarization-induced internal field $E_{pz}$ that is mainly caused by the piezoelectric polarization may be in the direction from p-GaN layer 1740 to n-GaN layer 1760 (i.e., in the growth direction as shown in FIG. 15A). The built-in depletion field $E_{bi}$ of the p-n junction is in the direction from n-GaN layer 1760 to p-GaN layer 1740. Thus, the polarization-induced internal field $E_{pz}$ and the built-in depletion field $E_{bi}$ may at least partially cancel out to reduce or minimize the total internal field and thus the QCSE in light emitting diode 1700.

In general, higher quality p-type GaN layers can be grown at higher temperatures (e.g., about 1050° C.) to reduce contamination, improve crystal quality, and achieve better electrical properties. In NDLEDs, because the p-GaN layer is grown after growing the active region, voids and stacking faults can form in the MQW and can increase in size if the post-MQW epitaxial layer growth is performed at temperatures above a certain growth temperature. Thus, a low growth temperature may be used to grow the p-type GaN layers in NDLEDs. A low growth temperature may also be used for post-MQW layer growth in order to prevent MQW decomposition due to low thermal stability of indium-rich InGaN. Therefore, for conventional NDLEDs, lowered growth temperatures are generally employed for growing p-type GaN layers in order to suppress non-radiative defects and to avoid InGaN MQW decomposition. Growth at a temperature below a certain temperature (e.g., about 1050° C.) may produce lower quality p-type GaN layers. PDLEDs, such as light emitting diode 1700, can avoid this issue because the p-type GaN layer in a PDLED is grown before growing the MQW, and thus the p-type GaN layer can be grown at a higher temperature to reduce contamination, improve crystal quality, suppress the formation of non-radiative defects, and achieve better electrical properties. The n-type GaN layer may be grown at a lower temperature because it is grown after the MQW in PDLEDs and because it is relatively easy to grow n-type GaN layers with good crystalline quality even at lower temperatures.

There may be some challenges associated with fabricating the LEDs when the p-GaN layer is grown before the active layers and the n-GaN layer are grown (and thus the p-GaN layer is buried). For example, after growing the p-GaN layer, Mg used to dope the p-GaN layer (e.g., Mg-doped GaN layer) may remain in the reactor and/or on the epitaxial surface after the introduction of Mg precursors into the reactor. For example, the source for Mg doping (e.g., bis (cyclopentadienyl) magnesium ($Cp_2Mg$)) may be adsorbed onto reactor lines and walls and may be released in the gas phase in subsequent processes. A surface riding effect can also contribute to the residual Mg due to a Mg-rich layer formed on the surface of the p-GaN layer. Thus, if the quantum-well layers are grown directly on the Mg-rich p-GaN layer, the quantum-well layers may be contaminated with Mg dopants even after the Mg source is turned off, which may be referred to as the Mg-memory effect and may manifest as a slow decay tail of Mg into subsequent epitaxial layers. Mg can contaminate the MQW layers to form non-radiative recombination centers, which may be caused by Mg-related point defects, Mg interstitials, or Mg-related complexes.

In addition, for p-type GaN layers formed using, for example, MOCVD, the dopants (e.g., Mg) may be passivated due to the incorporation of atomic hydrogen (which exists in $H^+$) during growth and the formation of Mg—H complexes. Therefore, a post-growth activation of the dopants is generally performed to release mobile holes. The activation of the p-GaN layer may include breaking the Mg—H bonds and driving the $H^+$ out of the p-GaN layer from the exposed planar or broadside p-GaN surfaces (rather than the side surfaces) at elevated temperatures (e.g., above 700° C.) to activate the Mg dopants, which is referred to herein as planar (or vertical) activation. Insufficient activation of the p-GaN layer may lead to an open circuit, a poor performance, or a premature punch-through breakdown of the LED device. The activation may not be performed right after the p-doping, because the subsequent growth generally occurs in the presence of high pressure ammonia ($NH_3$) in order to avoid decomposition of GaN at the high growth temperatures, and any layer that is activated may be re-passivated due to presence of ammonia.

Because the p-GaN layer is buried in PDLEDs, to drive out hydrogen, positively charged $H^+$ ions need to diffuse across the p-n junction and through the n-GaN layer that is exposed. However, because of the depletion field in the p-n junction (from n to p), positively charged $H^+$ ions may not be able to diffuse from the p-type region to the n-type region across the p-n junction. In addition, hydrogen may have a much higher diffusion barrier and thus a much lower diffusivity in n-type GaN compared with in p-type GaN. Thus, the hydrogen ions may not diffuse through the n-type layer to the exposed top surface of the n-type layer. One possible technique for activating the buried p-GaN is to expose the p-GaN through etched mesa trenches and/or holes and to laterally diffuse the $H^+$ ions through the trenches or holes, which is referred to herein as lateral activation in contrast to the planar (or vertical) activation described above. But the lateral diffusion may not sufficiently activate the buried p-GaN layer when, for example, the lateral diffusion dimension is large, and/or because the type conversion of p-GaN to n-GaN during initial mesa etching may create a lateral diffusion barrier similar to the vertical diffusion barrier in p-down LEDs described above.

According to certain embodiments, to reduce or eliminate the Mg-memory effect, after the p-GaN layer is grown, the reactor may be conditioned. For example, chlorine can be introduced into the reactor to clean the reactor walls and reactor lines. Additionally or optionally, a surface treatment can be carried out to reduce the Mg on the growth surface. The remaining epitaxial layers, including the multiple quantum wells, can be grown after the reactor conditioning and/or the surface treatment, and thus the Mg-memory effect and the Mg contamination can be reduced or eliminated.

To activate the buried p-GaN layer, a sacrificial layer may be formed before the p-GaN layer. The sacrificial layer may include, for example, a thick InGaN sacrificial layer or a multiple-quantum well structure (e.g., InGaN/GaN). A photoelectrochemical (PEC) etching process can be performed to laterally etch the sacrificial layer and expose the p-GaN layer. PEC etching offers the advantages of reduced physical ion-damage, fast etch rates, and low cost. In PEC etching, material removal from a semiconductor occurs through a chemical reaction involving an electrolyte (i.e., the etchant, e.g., KOH), the semiconductor atoms/ions, and photo-generated holes (generated using, e.g., an external light source) within the semiconductor. PEC etching can be used to selectively etch GaN and other compound semiconductors. It allows the tuning of the etch selectivity by tuning the doping levels, the material bandgaps, the defect densities, the location and magnitude of the voltage bias applied, and the like.

In some embodiments, to activate the buried p-GaN layer, the sacrificial layer may not be used and the PEC etching process may not be performed. Rather, the substrate may be grinded down, followed by an in-situ hydrogen cleaning process. In some embodiments, other lift-off techniques, such as laser lift-off technique, may be used, where an absorption interface may be included in the layer stack.

In bandgap-selective PEC etching, materials with lower bandgap can be etched, while higher bandgap materials may not be etched, due to the different band bending and hence the different drifting directions of photo-generated holes at the semiconductor-etchant interface. A sacrificial layer sandwiched within an n-i-p junction may be difficult to etch due to unfavorable Fermi level pinning at the semiconductor-etchant interface, where the energy bands of the sacrificial layer may bend downwards towards the interface with the n-type material layer and may bend upwards towards the interface with the p-type material layer. Therefore, due to the Fermi level pinning, the energy bands in the sacrificial layer may bend upwards from the semiconductor-etchant interface to the semiconductor material in the sacrificial layer. As such, the photo-generated holes may draft away from the interface between the etchant and thus the semiconductor material in the sacrificial layer may be difficult to etch by the PEC etching.

According to some embodiments, the sacrificial layer can be sandwiched within an n-i-n junction to form n-i-n sacrificial etch junction 1730 to facilitate the lateral etching of the sacrificial layer. n-i-n sacrificial etch junction 1730 may include, for example, an InGaN or GaN layer sandwiched by two n-type layers, such as two n-GaN layers. The n-type layers may be heavily doped, and may provide charges to compensate for the interfacial charges associated with Fermi level pinning. Thus, the energy bands in the sacrificial layer may be lower and may bend downwards from the semiconductor-etchant interface to the semiconductor material in the sacrificial layer. As such, the photo-generated holes may drift towards the semiconductor-etchant interface, and thus the semiconductor material in the sacrificial layer may be more effectively etched by the PEC etching.

After the PEC etching, an n-type layer (i.e., one of the n-type layers of n-i-n sacrificial etch junction 1730) may be exposed, where the p-GaN layer may be directly underneath the n-type layer. A hydrogen-based etching may be performed to etch the remaining n-type material to fully expose the p-GaN layer. Subsequently, a $p^+$ or $p^{++}$-GaN layer can be grown on the exposed p-GaN layer in an MOCVD regrowth process, followed by an in-situ or ex-situ activation to activate the dopants (e.g., Mg) in the p-GaN and $p^+$ or $p^{++}$-GaN layers. The micro-LED may then be bonded to a silicon backplane, which may include, for example, CMOS or NMOS circuits for addressing and controlling individual LEDs. For example, n-GaN layer 1760 of light emitting diode 1700 may be bonded to the silicon backplane.

Figure 18:
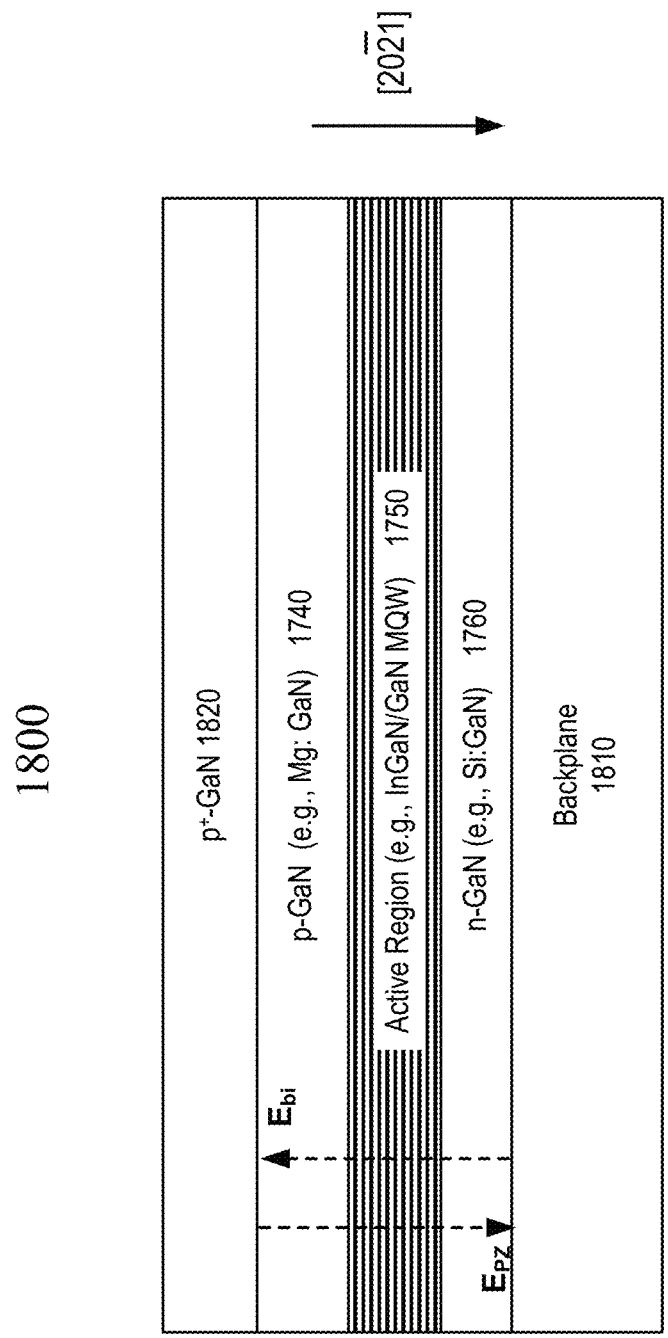
FIG. 18 illustrates a p-GaN-down micro light emitting diode fabricated in epitaxially grown (20$\bar{2}$1) plane-oriented GaN layers and bonded to a backplane according to certain embodiments.

FIG. 18 illustrates a p-GaN-down micro light emitting diode 1800 fabricated in epitaxially grown ($20\bar{2}1$) plane-oriented GaN layers and bonded to a backplane 1810 according to certain embodiments. Micro-LED 1800 may include portions of light emitting diode 1700 detached from substrate 1710 by PEC etching, which may include p-GaN layer 1740, active region 1750 (e.g., an InGaN/GaN MQW), and n-GaN layer 1760. n-GaN layer 1760 may be bonded to backplane 1810, which may include a silicon backplane that may include CMOS or NMOS circuits fabricated thereon for addressing and controlling individual LEDs. Micro-LED 1800 may also include a $p^+$-GaN (or $p^{++}$-GaN) layer 1820 on p-GaN layer 1740. $p^+$-GaN (or $p^{++}$-GaN) layer 1820 may be used for making the p-contact.

As in p-GaN-down light emitting diode 1700, the polarization-induced internal field $E_{pz}$ in the active region of micro-LED 1800 is mainly caused by the piezoelectric polarization and may be in the direction from p-GaN layer 1740 to n-GaN layer 1760. The built-in depletion field $E_{bi}$ in the active region of micro-LED 1800 may be in the direction from n-GaN layer 1760 to p-GaN layer 1740. Thus, the polarization-induced internal field $E_{pz}$ and the built-in depletion field EN may at least partially cancel out to reduce or minimize the total internal field and thus the QCSE in micro-LED 1800.

Although not shown in FIGS. 17 and 18, in some embodiments, one or more barrier layers (such as barrier layer 1025) may be grown between n-GaN layer 1760 and active region 1750, and/or an electron-blocking layer (such as electron-blocking layer 1035) may be grown between p-GaN layer 1740 and active region 1750.

Figure 19:
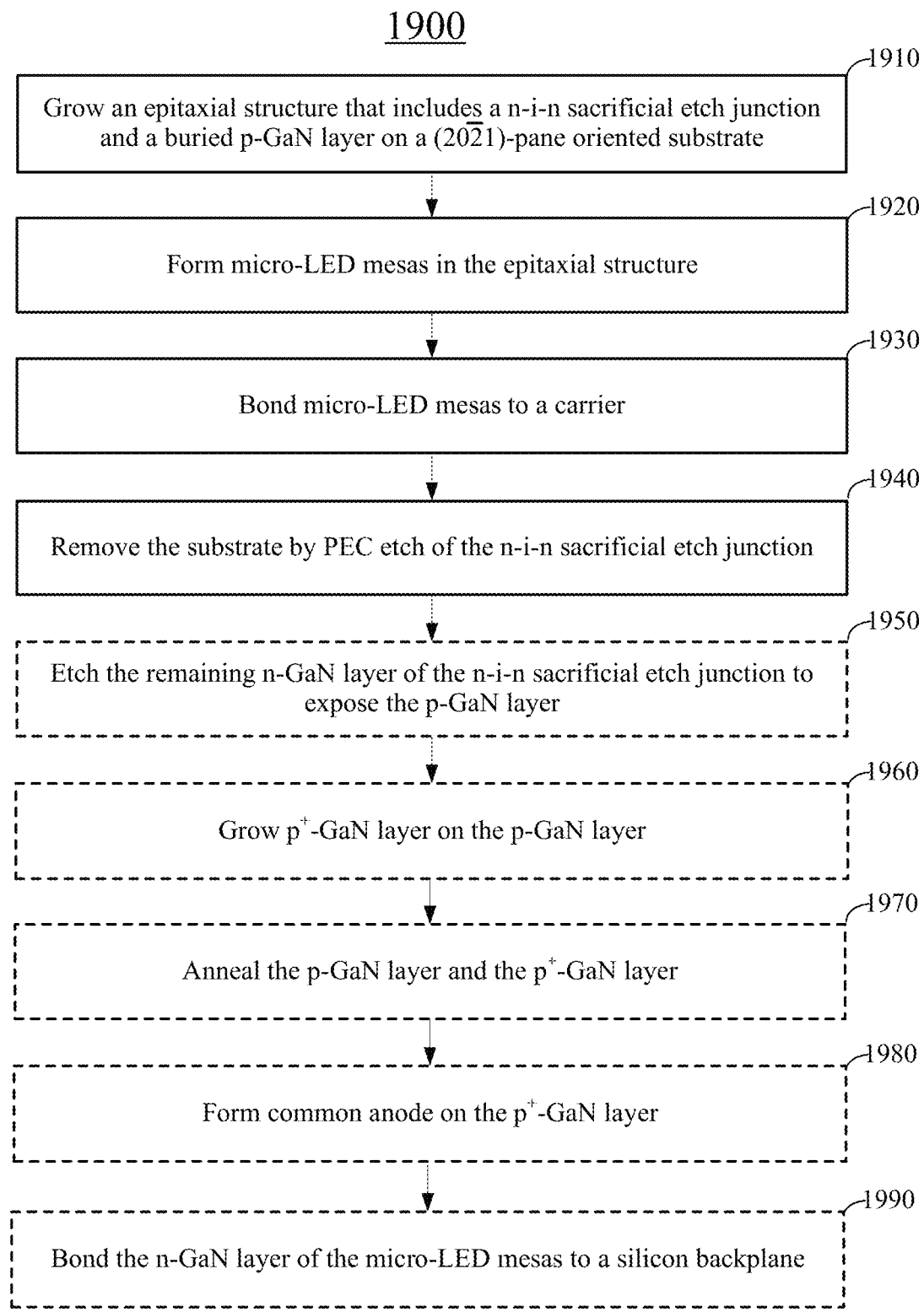
FIG. 19 is a flow chart illustrating an example of a method of fabricating a p-GaN-down micro-LED device in (20$\bar{2}\bar{1}$) plane-oriented GaN layers according to certain embodiments.

FIG. 19 is a flow chart 1900 illustrating an example of a method of fabricating a p-GaN-down micro-LED device in ($20\bar{2}1$) plane-oriented GaN layers according to certain embodiments. The operations described in flow chart 1900 are for illustration purposes only and are not intended to be limiting. In various implementations, modifications may be made to flow chart 1900 to add additional operations or to omit some operations. The operations described in flow chart 1900 may be performed by, for example, one or more semiconductor fabrication systems that include, for example, molecular beam epitaxy (MBE) or metalorganic chemical vapor deposition (MOCVD) equipment.

At block 1910, an epitaxial structure that includes an n-i-n sacrificial etch junction, a buried p-GaN layer, an active region, and an n-GaN layer epitaxially grown on a ($20\bar{2}1$)-plane oriented substrate may be fabricated. The epitaxial structure may be similar to p-GaN-down light emitting diode 1700. In some embodiments, the epitaxial structure may also include one or more barrier layers (such as barrier layer 1025) between the n-GaN layer and the active region. In some embodiments, the epitaxial structure may also include an electron-blocking layer (such as electron-blocking layer 1035) between the buried p-GaN layer and the active region. The epitaxial structure may be fabricated using techniques and processes similar to the techniques and processes descried above with respect to FIG. 11, but the order of the processes may be modified. For example, the p-GaN layer, the active region, the n-GaN layer, and the optional barrier layer and optional electron-blocking layer of the epitaxial structure may be grown in a reversed order compared with the operations described with respect to FIG. 11. In some embodiments, additional operations, such as reactor conditioning and/or surface treatment, may be performed, for example, after growing the p-GaN layer as described above with respect to FIG. 17.

At block 1920, micro-LED mesas may be formed in the epitaxial structure. For example, the epitaxial structure may be etched from the n-GaN layer through the action region and into the p-GaN layer to form an array of micro-LED mesas. The dimensions of each micro-LED mesa may be selected based on the desired performance, resolution, density, and the like. For example, the micro-LED mesas can have a linear dimension from about a few hundred microns to close to one micron. As described above, the micro-LED mesa can have different shapes, such as a planar, vertical, conical, semi-parabolic, or parabolic shape. In some embodiments, the sidewalls (e.g., the side surfaces of a vertical mesa) of the micro-LED mesas may be chemically etched to remove defects at the sidewalls due to physical etching. In some embodiments, a passivation and/or reflection layer may be deposited on the sidewalls of the micro-LED mesas. The passivation layer may include, for example, a $SiO_2$, $SiN_x$, $Al_2O_3$, AlN, or $Ta_2O_5$ layer. The passivation and/or reflection layer may help to reflect the photons emitted by the active region out of the LED to improve the extraction efficiency of the LED. In some embodiments, anchor sites (or islands) may be formed in the epitaxial structure by the etching as well. The anchor sites may be used to temporarily bond the micro-LED mesas to a temporary carrier. In some embodiments, the epitaxial structure may be further etched down to expose the n-i-n sacrificial etch junction.

Figure 20:
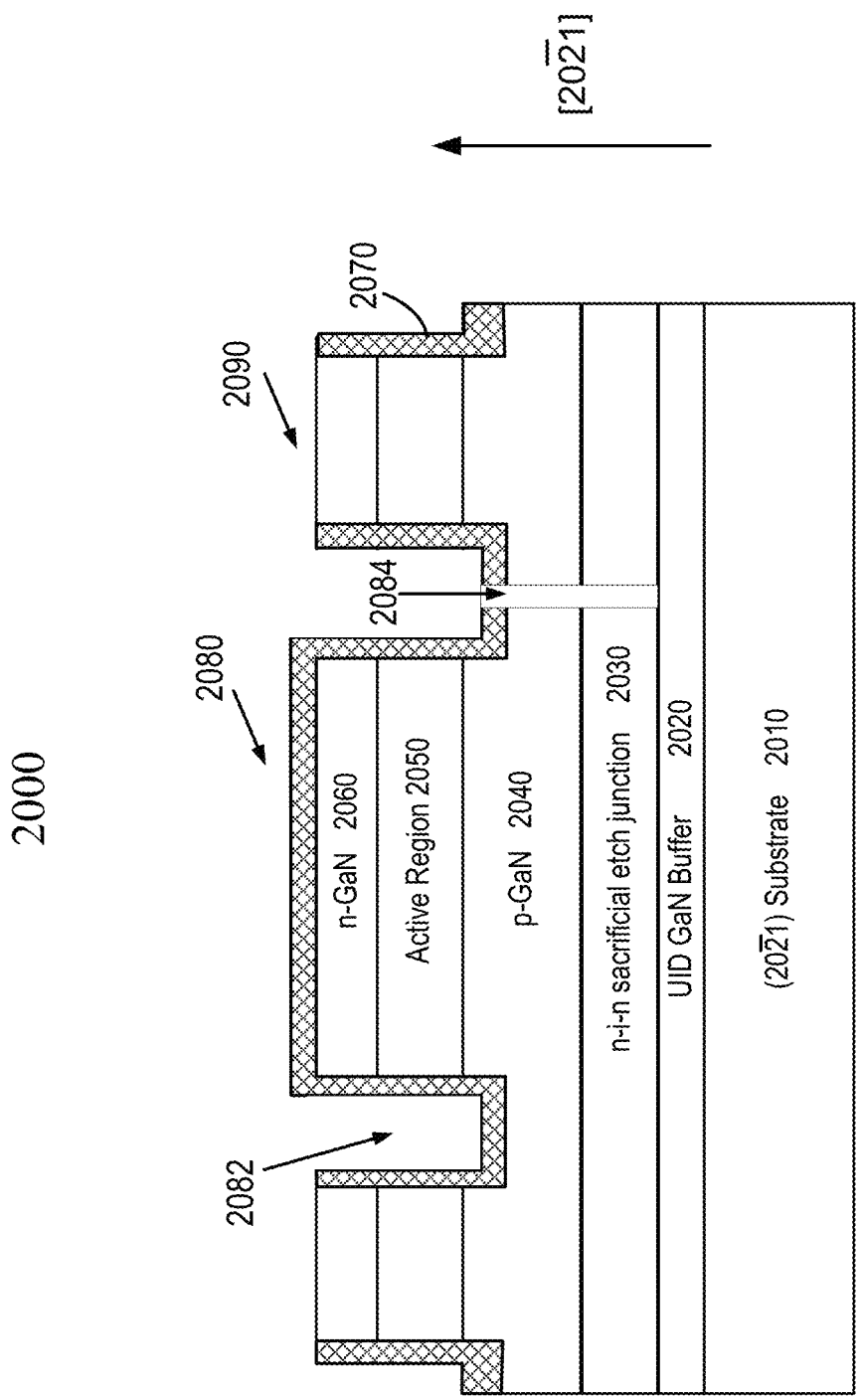
FIG. 20 illustrates an example of a p-GaN-down epitaxial structure grown on a (20$\bar{2}$1) plane-oriented substrate according to certain embodiments.

FIG. 20 illustrates an example of a p-GaN-down epitaxial structure 2000 grown on a (20$\bar{2}$1) plane-oriented substrate 2010 according to certain embodiments. Epitaxial structure 2000 may include substrate 2010, an UID GaN buffer layer 2020 grown on substrate 2010, an n-i-n sacrificial etch junction 2030 grown on UID GaN buffer layer 2020, a buried p-GaN (e.g., Mg, Ca, Zn, or Be-doped GaN) layer 2040 grown on n-i-n sacrificial etch junction 2030, an active region 2050 on p-GaN layer 2040, and an n-GaN (e.g., Si or Ge-doped GaN) layer 2060 on active region 2050. The growth direction may be in the [20$\bar{2}$1] direction as shown in the figure. Active region 2050 may include multiple layers of materials (e.g., InGaN/GaN or AlGaN/GaN) to form multiple quantum wells for light emitting. As shown in FIG. 20, one or more vertical micro-LED mesas 2080 and one or more anchor sites 2090 may be formed in epitaxial structure 2000 by etching through n-GaN layer 2060, active region 2050, and a portion of p-GaN layer 2040 using physical or chemical etching techniques, such as reactive ion etching. As described above, the sidewalls of micro-LED mesas 2080 may be chemically treated, and a passivation layer 2070 may be deposited on the sidewalls and top surfaces of vertical micro-LED mesas 2080 and anchor sites 2090 using, for example, atomic layer deposition techniques. In some embodiments, epitaxial structure 2000 may be further etched down in at least some trenches 2082 to form deeper trenches 2084 and expose n-i-n sacrificial etch junction 2030.

At block 1930, the micro-LED mesas in the epitaxial structure (e.g., micro-LED mesas 2080 in epitaxial structure 2000) may be bonded to a carrier (e.g., a substrate), which may be a temporary carrier for supporting the micro-LED mesas and the epitaxial structure. The carrier may include a metal, semiconductor (e.g., Si), or dielectric (e.g., glass, SiC, or Al$_2$O$_3$) substrate or wafer. The carrier may be temporarily bonded to the anchor sites formed in the epitaxial structure using, for example, a curable adhesive (e.g., polymers), a thermoplastic bonding material, or any other temporary wafer bonding material or technique. In some embodiments, the passivation layer on the top surfaces of the anchor sites may be removed before the bonding.

Figure 21:
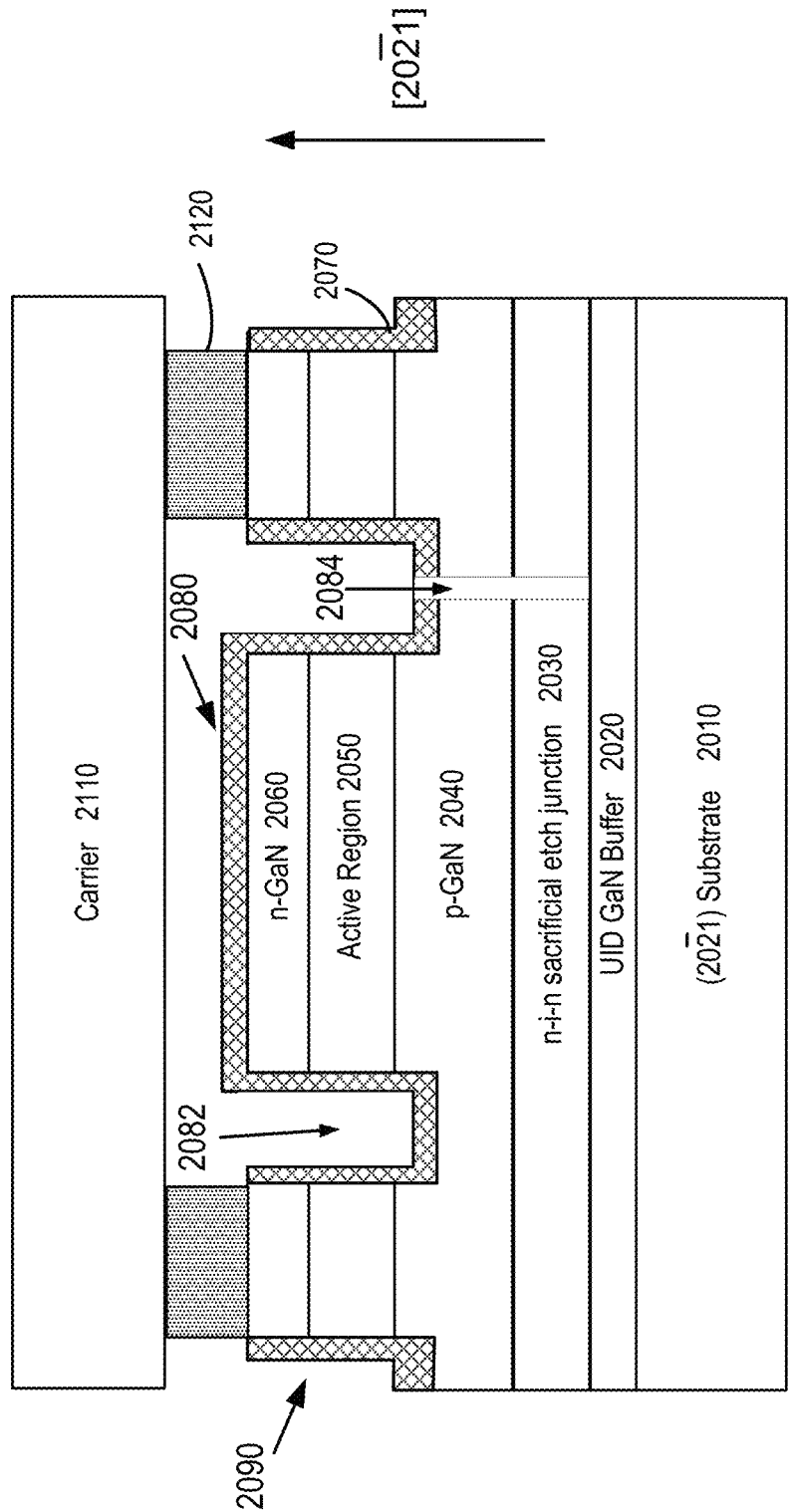
FIG. 21 illustrates an example of a p-GaN-down micro-LED device epitaxially grown on a (20$\bar{2}$1) plane-oriented substrate and bonded to a carrier according to certain embodiments.

FIG. 21 illustrates p-GaN-down epitaxial structure 2000 grown on (20$\bar{2}$1) plane-oriented substrate 2010 as described above with respect to FIG. 20 and bonded to a carrier 2110 according to certain embodiments. Carrier 2110 may include, for example, a metal, semiconductor (e.g., Si), or dielectric (e.g., glass, SiC, or Al$_2$O$_3$) substrate or wafer, and may be bonded to anchor sites 2090 of epitaxial structure 2000 using a temporary bonding material layer 2120. As described above, temporary bonding material layer 2120 may include a curable adhesive or a thermoplastic bonding material, and may be relatively easy to debond using slide debonding, laser debonding, mechanical debonding, or other debonding techniques.

At block 1940, the p-GaN layer, the active region, and the n-GaN layer of the epitaxial structure (e.g., epitaxial structure 2000) may be detached from the substrate (e.g., (20$\bar{2}$1) plane-oriented substrate 2010) and the buffer layer (e.g., UID GaN buffer layer 2020) by PEC etching of the n-i-n sacrificial etch junction (e.g., n-i-n sacrificial etch junction 2030). As described above with respect to FIG. 17, the n-i-n sacrificial etch junction may include a sacrificial layer (e.g., a GaN or InGaN layer) sandwiched by two n-GaN layers to facilitate the lateral etching of the sacrificial layer using the PEC etching techniques. The epitaxial structure may be illuminated by a light source to generate carriers (e.g., holes), which may move to the semiconductor-etchant interface due to the electrochemical potential of the sacrificial layer at the surface of the sacrificial layer relative to the etchant (e.g., an electrolyte, such as KOH). The holes may participate in electrochemical reactions for sacrificial material removal. After the sacrificial layer is etched away, an n-GaN layer of the n-i-n sacrificial etch junction, the p-GaN layer, the active region, and the n-GaN layer of the epitaxial structure may be separated from the substrate and the buffer layer. In some embodiments, the substrate and the buffer layer may be reused to grow other epitaxial structures.

Figure 22:
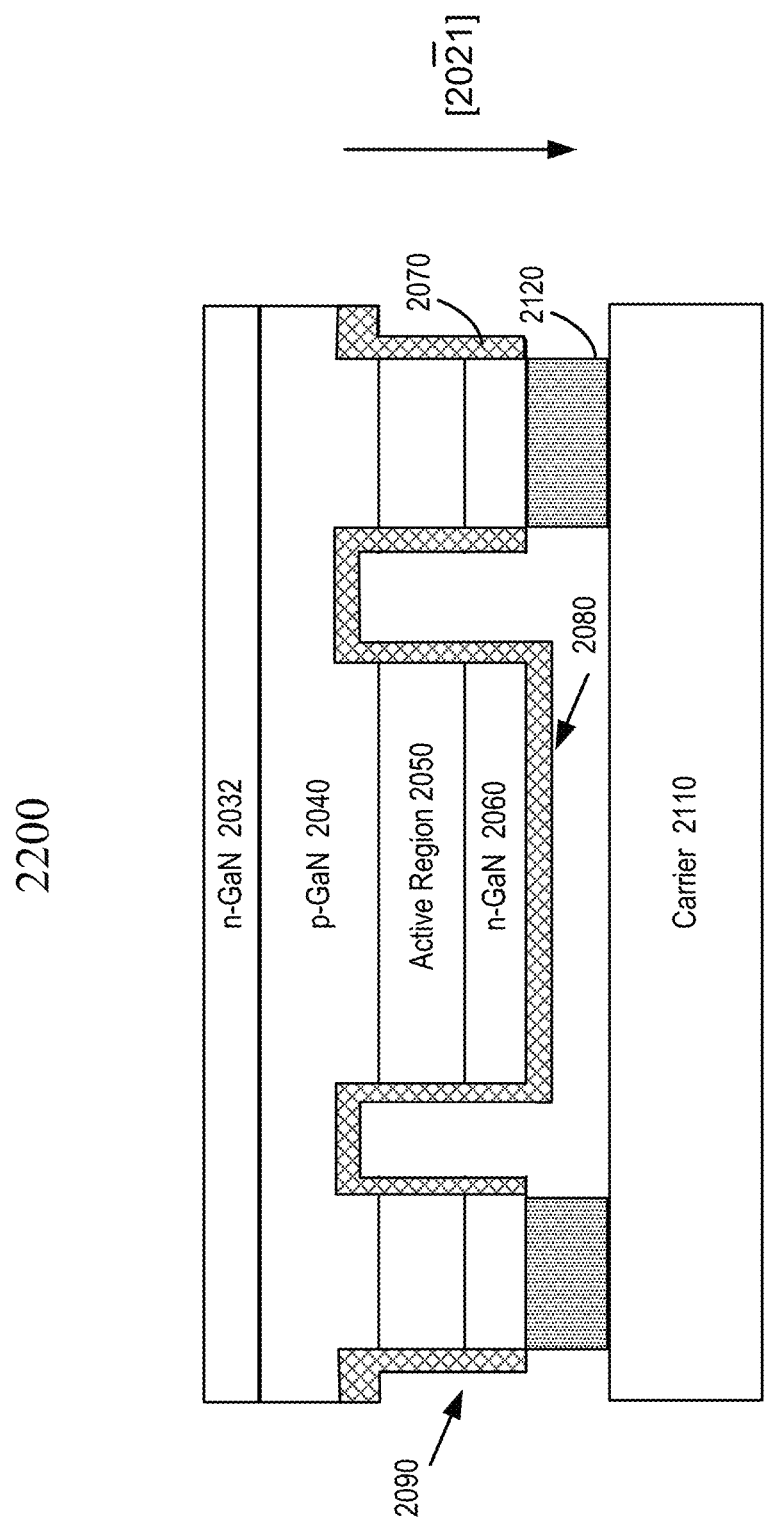
FIG. 22 illustrates an example of a p-GaN-down micro-LED device grown on a (20$\bar{2}$1) plane-oriented substrate and bonded to a carrier according to certain embodiments, where the (20$\bar{2}$1) plane-oriented substrate has been removed.

FIG. 22 illustrates an example of a p-GaN-down micro-LED device 2200 bonded to a carrier (e.g., carrier 2110) according to certain embodiments. Micro-LED device 2200 may be formed in epitaxial structure 2000 after the operations at block 1940, where the sacrificial layer in n-i-n sacrificial etch junction 2030 has been etched and the (20$\bar{2}$1) plane-oriented substrate (e.g., substrate 2010) has been removed. Thus, an n-GaN layer 2032 of n-i-n sacrificial etch junction 2030 may be exposed, and p-GaN layer 2040 may be under n-GaN layer 2032. FIG. 22 also shows the [20$\bar{2}$1] direction from p-GaN layer 2040 to n-GaN layer 2060 in micro-LED device 2200.

In some embodiments, at block 1950, the remaining n-GaN layer of the n-i-n sacrificial etch junction may be removed using etching techniques, such as hydrogen etch, to expose the p-GaN layer in the epitaxial structure. Optionally, at block 1960, a p$^+$-GaN or p$^{++}$-GaN layer may be formed on the exposed p-GaN layer by, for example, MOCVD re-growth. The p$^+$-GaN layer may be used as a contact layer for connecting to an electrode to reduce the contact resistance. At block 1970, the p-GaN layer and/or the p$^+$-GaN layer may be activated by an in-situ or ex-situ annealing process at elevated temperatures (e.g., above 700° C.) to break the Mg—H bonds and drive the H$^+$ ions out of the p-GaN layer and/or the p$^+$-GaN layer from exposed p-GaN or p$^+$-GaN surface to activate the Mg dopants as described above. Optionally, at block 1980, a common anode may be formed on the p$^+$-GaN layer. The common anode may include, for example, a metal or a transparent contact layer, such as an indium tin oxide (ITO) layer or a thin Al/Ni/Au film. In some embodiments, the common anode may be formed on the p$^+$-GaN layer at a later stage.

Figure 23:
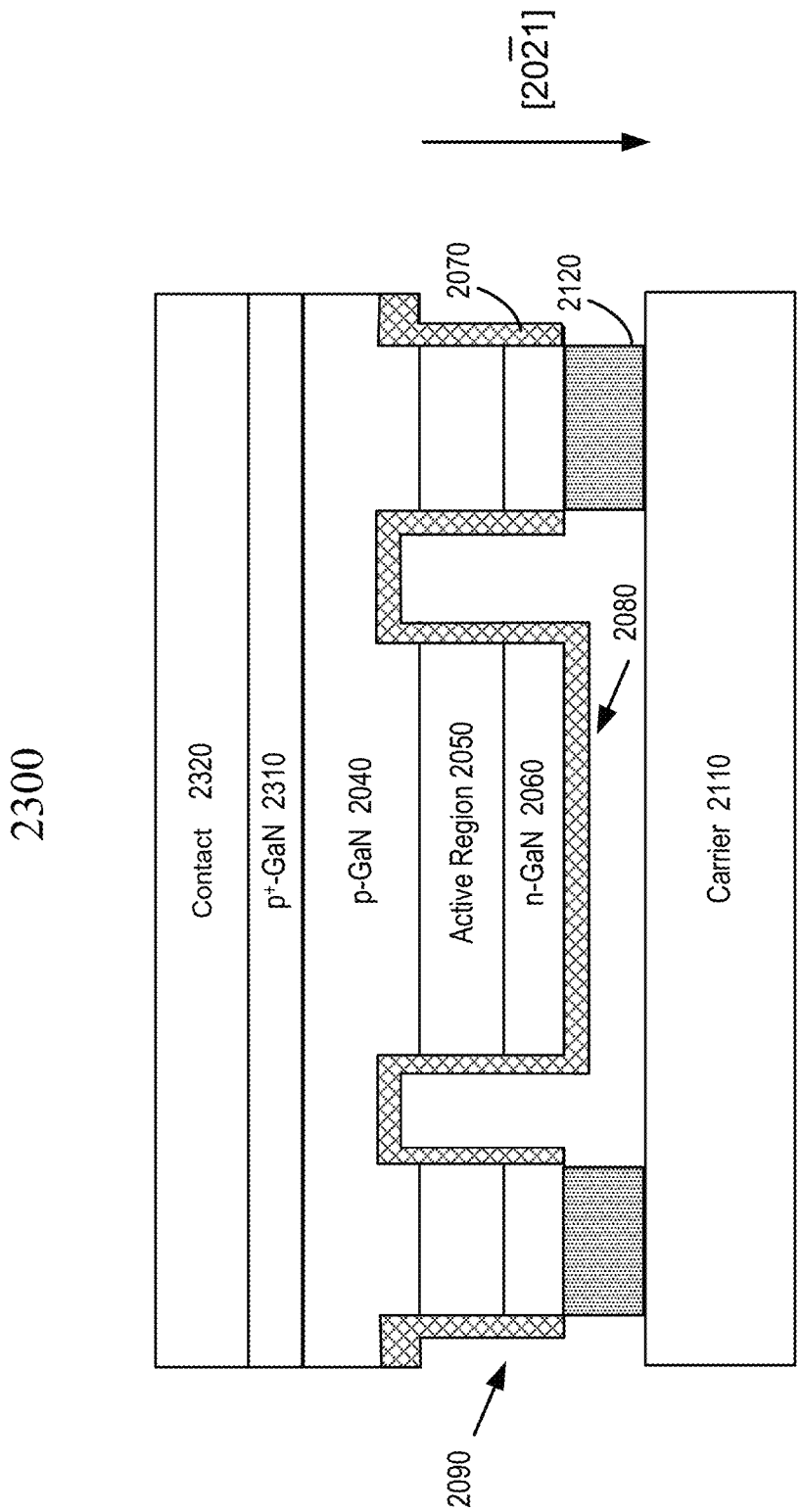
FIG. 23 illustrates an example of a p-GaN-down micro-LED device grown on a (20$\bar{2}$1) plane-oriented substrate and bonded to a carrier according to certain embodiments, where the (20$\bar{2}$1) plane-oriented substrate has been removed and a p$^+$-GaN layer and a contact layer are formed on the p-GaN layer.

FIG. 23 illustrates an example of a p-GaN-down micro-LED device 2300 bonded to a carrier (e.g., carrier 2110) according to certain embodiments. Micro-LED device 2300 may be formed in epitaxial structure 2000 after the operations at block 1980, where the (20$\bar{2}$1) plane-oriented substrate 2010 has been removed and a p$^+$-GaN layer 2310 and a contact layer 2320 are formed on p-GaN layer 2040. As described above, contact layer 2320 may include a metal or a transparent contact layer, such as an indium tin oxide (ITO) layer or a thin Al/Ni/Au film. FIG. 23 also shows the [20$\bar{2}$1] direction from p-GaN layer 2040 to n-GaN layer 2060 in micro-LED device 2300.

At block 1990, the micro-LED array formed in the micro-LED mesas may be bonded to a silicon backplane. The silicon backplane may include bonding pads (e.g., Au or Cu) and electrical circuits for addressing and driving the micro-LED array. In some embodiments, a second temporary carrier may be temporarily bonded to the p$^+$-GaN layer or the common anode (e.g., the metal contact layer) formed on the p$^+$-GaN layer. The carrier (e.g., carrier 2110) that is bonded to the anchor sites may be debonded, and the dielectric layer on the n-GaN layer of the micro-LED array may then be removed by, for example, dielectric punch-through. The exposed n-GaN layer may be bonded to the bonding pads or traces on the silicon backplane. In some embodiments, a metal contact layer may be formed on the n-GaN layer before bonding the micro-LED array to the silicon backplane. After the micro-LED array is bonded to the silicon backplane, the second temporary carrier may be removed to expose the p$^+$-GaN layer or the common anode (which may be formed on the p$^+$-GaN layer at block 1990 if not done at block 1980).

Figure 24:
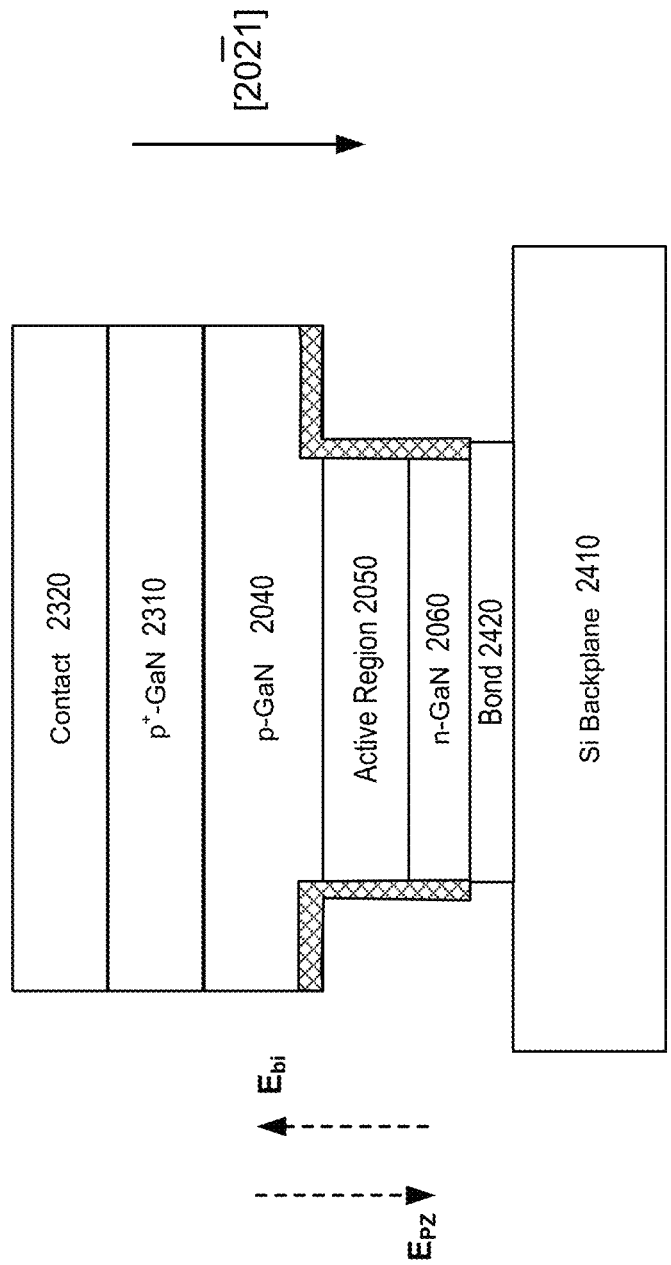
FIG. 24 illustrates an example of a p-GaN-down micro-LED device grown on a (20$\bar{2}$1) plane-oriented substrate and bonded to a silicon backplane according to certain embodiments, where the (20$\bar{2}$1) plane-oriented substrate has been removed, a PtGaN layer and a contact layer are formed on the p-GaN layer, and the n-GaN layer is bonded to the silicon backplane.

FIG. 24 illustrates an example of a micro-LED device 2400 bonded to a silicon backplane 2410 according to certain embodiments. Micro-LED device 2400 may be formed from micro-LED device 2300 after the operations at block 1990. Silicon backplane 2410 may include bonding pads and electrical circuits for addressing and driving micro-LED device 2400. Micro-LED device 2400 may be bonded to the bonding pads or metal traces on silicon backplane 2410 by a metal bond 2420 or by a hybrid bonding technique.

As shown in FIG. 24, the polarization-induced internal field $E_{pz}$ mainly caused by the piezoelectric polarization may be in the direction from p-GaN layer 2040 to n-GaN layer 2060. The built-in depletion field $E_{bi}$ of the p-n junction is in the direction from n-GaN layer 2060 to p-GaN layer 2040. Thus, the polarization-induced internal field $E_{pz}$ and the built-in depletion field $E_{bi}$ may at least partially cancel out to reduce or minimize the total internal field and thus the QCSE of micro-LED device 2400.

Figure 25:
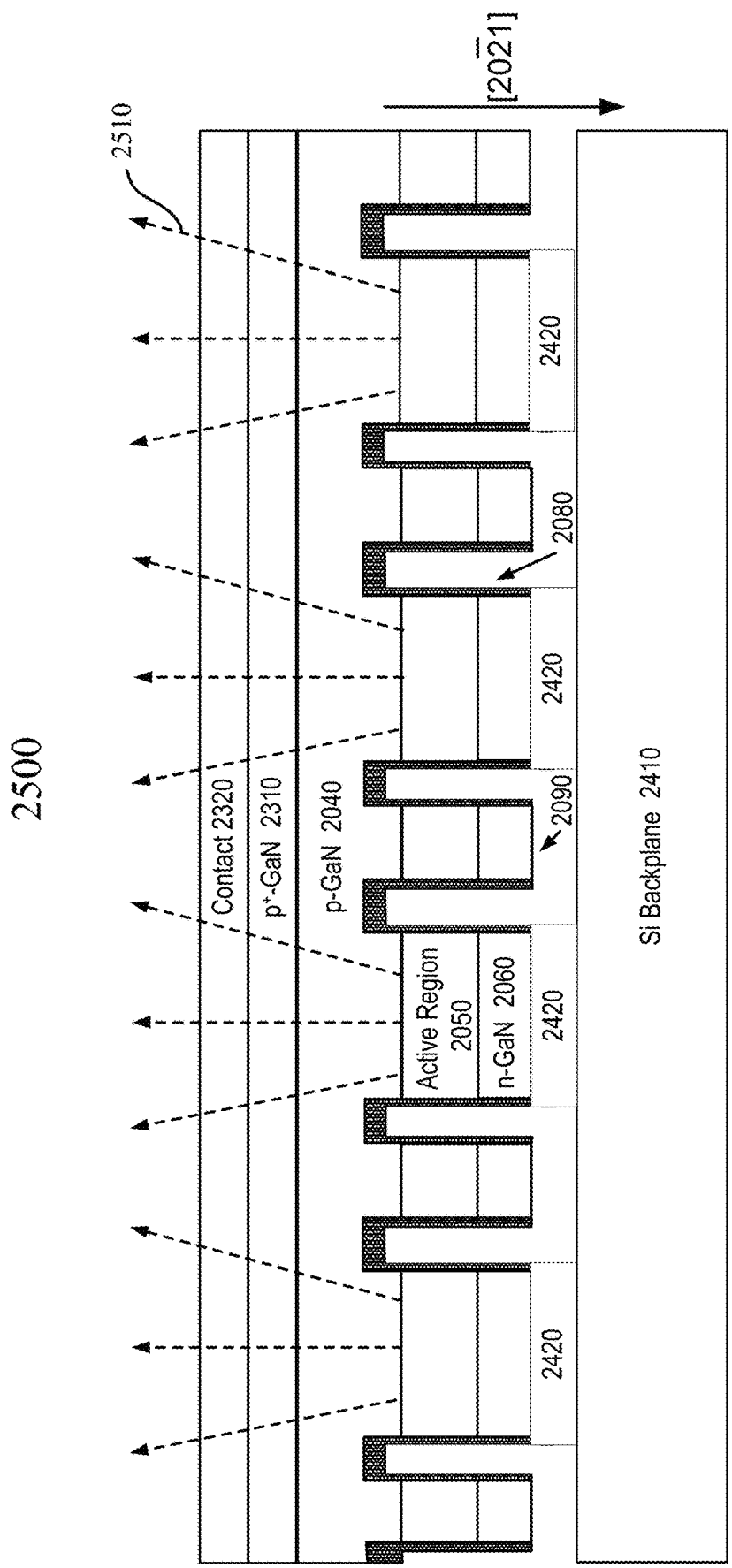
FIG. 25 illustrates an example of an array of p-GaN-down micro-LED devices bonded to a silicon backplane according to certain embodiments.

FIG. 25 illustrates an assembled p-GaN-down micro-LED array 2500 on a silicon backplane (e.g., silicon backplane 2410) according to certain embodiments. Micro-LED array 2500 may include a one-dimensional or two-dimensional array of micro-LEDs fabricated using the techniques described above with respect to FIGS. 17-24. Each micro-LED in micro-LED array 2500 may be fabricated in a respective micro-LED mesa 2080 etched in epitaxial structure 2000 as shown in FIG. 20. At least some micro-LEDs in micro-LED array 2500 may share a common anode (e.g., contact layer 2320, which may be transparent). Micro-LED array 2500 may be bonded to silicon backplane 2410 by bonding n-GaN layer 2060 to bonding pads or traces on silicon backplane 2410 through metal bonds 2420. Because the n-GaN layer 2060 of the micro-LEDs is bonded to silicon backplane 2410, the circuits on silicon backplane 2410 can be made using NMOS devices. Because NMOS devices are generally much faster than PMOS devices due to the higher carrier mobility, fewer NMOS transistors (and thus smaller silicon area) can be used to achieve the same current and a higher speed.

Each micro-LED in micro-LED array 2500 may be individually addressable and controllable at the cathode through the circuits fabricated on silicon backplane 2410. When a voltage is applied to a micro-LED in micro-LED array 2500, the active region of the micro-LED may emit light 2510 through radiative recombination of charge carriers as described above. The emitted light 2510 may pass through p-GaN layer 2040, p$^+$-GaN layer 2310, and contact layer 2320, or may pass through n-GaN layer 2060 and silicon backplane 2410. In some embodiments, an array of microlenses (not shown in FIG. 25) may be formed on top of contact layer 2320 for extracting and/or collimating light 2510 emitted from micro-LED array 2500. Micro-LED array 2500 may be used as the light source or image source for a display system.

As described above, because the epitaxial layers in micro-LED array 2500 are high quality epitaxial layers grown on a semi-polar (e.g., (20$\bar{2}$1)) plane-oriented substrate, the production yield and device reliability can be improved, the defect density at the sidewalls of each micro-LED in micro-LED array 2500 may be significantly reduced, the quantum efficiency of the micro-LEDs can be improved even for micro-LEDs with very small physical sizes, and the peak efficiency current density can be reduced. Furthermore, because the polarization-induced internal field $E_{pz}$ and the built-in depletion field $E_{bi}$ of the p-n junction in active region 2050 are approximately equal in magnitude and are in opposite directions, they may substantially cancel out to reduce or minimize the total internal field and thus the QCSE of the micro-LEDs in micro-LED array 2500. In addition, because the epitaxial layers in micro-LED array 2500 are epitaxial layers grown on a semi-polar (e.g., (20$\bar{2}$1)) plane-oriented substrate, light 2510 emitted from micro-LED array 2500 may have a higher degree of linear polarization, and thus may be coupled into a waveguide at a higher coupling efficiency.

Embodiments of the invention may be used to implement components of an artificial reality system or may be implemented in conjunction with an artificial reality system. Artificial reality is a form of reality that has been adjusted in some manner before presentation to a user, which may include, for example, a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Figure 26:
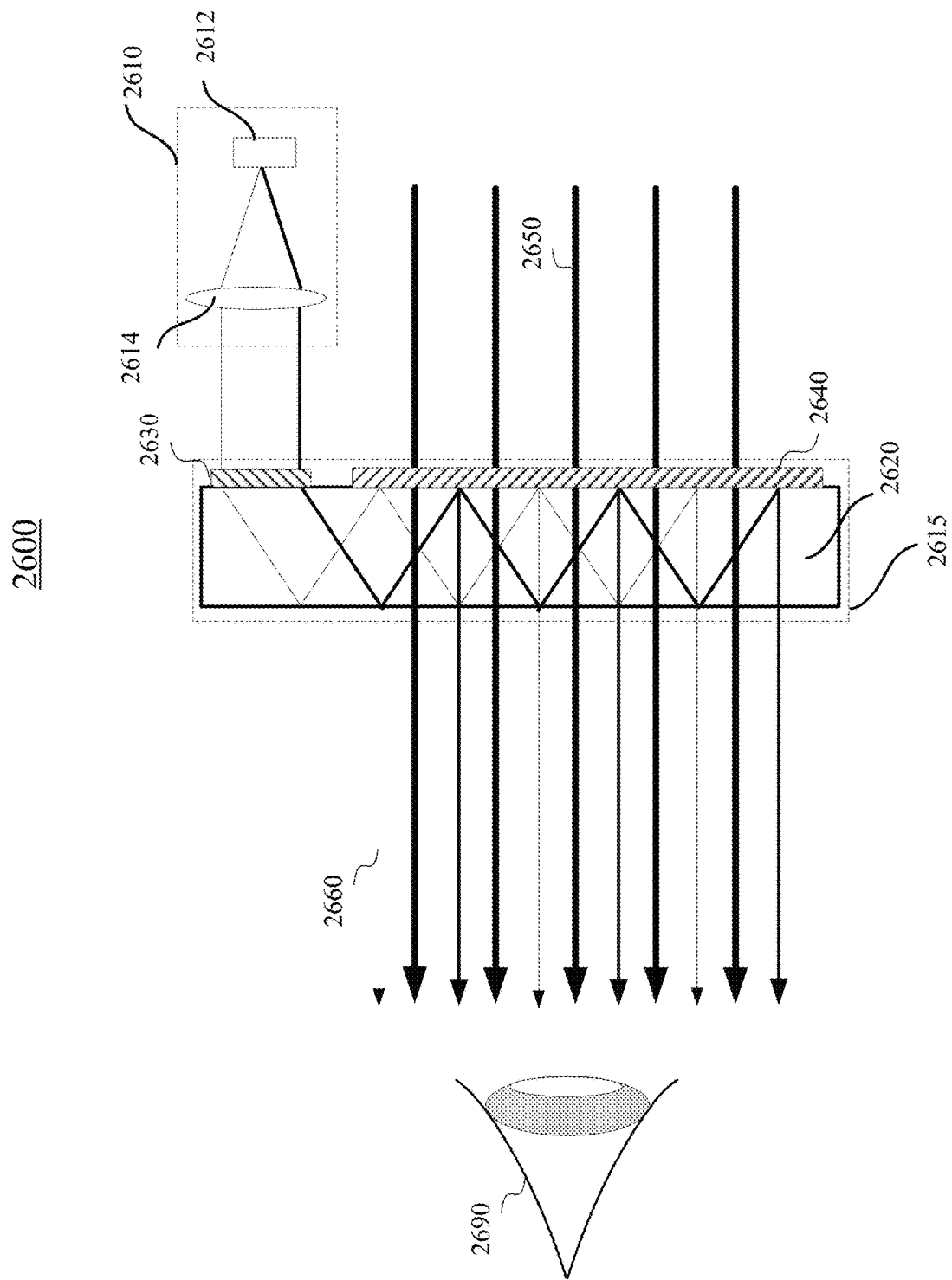
FIG. 26 illustrates an example of an optical see-through augmented reality system including a waveguide display according to certain embodiments.

FIG. 26 illustrates an example of an optical see-through augmented reality system 2600 including a waveguide display according to certain embodiments. Augmented reality system 2600 may include a projector 2610 and a combiner 2615. Projector 2610 may include a light source or image source 2612 and projector optics 2614. In some embodiments, light source or image source 2612 may include one or more micro-LED devices described above. In some embodiments, image source 2612 may include a plurality of pixels that displays virtual objects, such as an LCD display panel or an LED display panel. In some embodiments, image source 2612 may include a light source that generates coherent or partially coherent light. For example, image source 2612 may include a laser diode, a vertical cavity surface emitting laser, a light emitting diode, and/or a micro-LED described above. In some embodiments, image source 2612 may include a plurality of light sources (e.g., an array of micro-LEDs described above) each emitting a monochromatic image light corresponding to a primary color (e.g., red, green, or blue). In some embodiments, image source 2612 may include three two-dimensional arrays of micro-LEDs, where each two-dimensional array of micro-LEDs may include micro-LEDs configured to emit light of a primary color (e.g., red, green, or blue). In some embodiments, image source 2612 may include an optical pattern generator, such as a spatial light modulator. Projector optics 2614 may include one or more optical components that can condition the light from image source 2612, such as expanding, collimating, scanning, or projecting light from image source 2612 to combiner 2615. The one or more optical components may include, for example, one or more lenses, liquid lenses, mirrors, apertures, and/or gratings. For example, in some embodiments, image source 2612 may include one or more one-dimensional arrays or elongated two-dimensional arrays of micro-LEDs, and projector optics 2614 may include one or more one-dimensional scanners (e.g., micro-mirrors or prisms) configured to scan the one-dimensional arrays or elongated two-dimensional arrays of micro-LEDs to generate image frames. In some embodiments, projector optics 2614 may include a liquid lens (e.g., a liquid crystal lens) with a plurality of electrodes that allows scanning of the light from image source 2612.

Combiner 2615 may include an input coupler 2630 for coupling light from projector 2610 into a substrate 2620 of combiner 2615. Combiner 2615 may transmit at least 50% of light in a first wavelength range and reflect at least 25% of light in a second wavelength range. For example, the first wavelength range may be visible light from about 2600 nm to about 650 nm, and the second wavelength range may be in the infrared band, for example, from about 800 nm to about 1000 nm. Input coupler 2630 may include a volume holographic grating, a diffractive optical elements (DOE) (e.g., a surface-relief grating), a slanted surface of substrate 2620, or a refractive coupler (e.g., a wedge or a prism). Input coupler 2630 may have a coupling efficiency of greater than 30%, 50%, 75%, 90%, or higher for visible light. Light coupled into substrate 2620 may propagate within substrate 2620 through, for example, total internal reflection (TIR). Substrate 2620 may be in the form of a lens of a pair of eyeglasses. Substrate 2620 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 2620 may be transparent to visible light.

Substrate 2620 may include or may be coupled to a plurality of output couplers 2640 configured to extract at least a portion of the light guided by and propagating within substrate 2620 from substrate 2620, and direct extracted light 2660 to an eye 2690 of the user of augmented reality system 2600. As input coupler 2630, output couplers 2640 may include grating couplers (e.g., volume holographic gratings or surface-relief gratings), other diffractive optical elements (DOEs), prisms, etc. Output couplers 2640 may have different coupling (e.g., diffraction) efficiencies at different locations. Substrate 2620 may also allow light 2650 from environment in front of combiner 2615 to pass through with little or no loss. Output couplers 2640 may also allow light 2650 to pass through with little loss. For example, in some implementations, output couplers 2640 may have a low diffraction efficiency for light 2650 such that light 2650 may be refracted or otherwise pass through output couplers 2640 with little loss, and thus may have a higher intensity than extracted light 2660. In some implementations, output couplers 2640 may have a high diffraction efficiency for light 2650 and may diffract light 2650 to certain desired directions (i.e., diffraction angles) with little loss. As a result, the user may be able to view combined images of the environment in front of combiner 2615 and virtual objects projected by projector 2610.

Figure 27B:
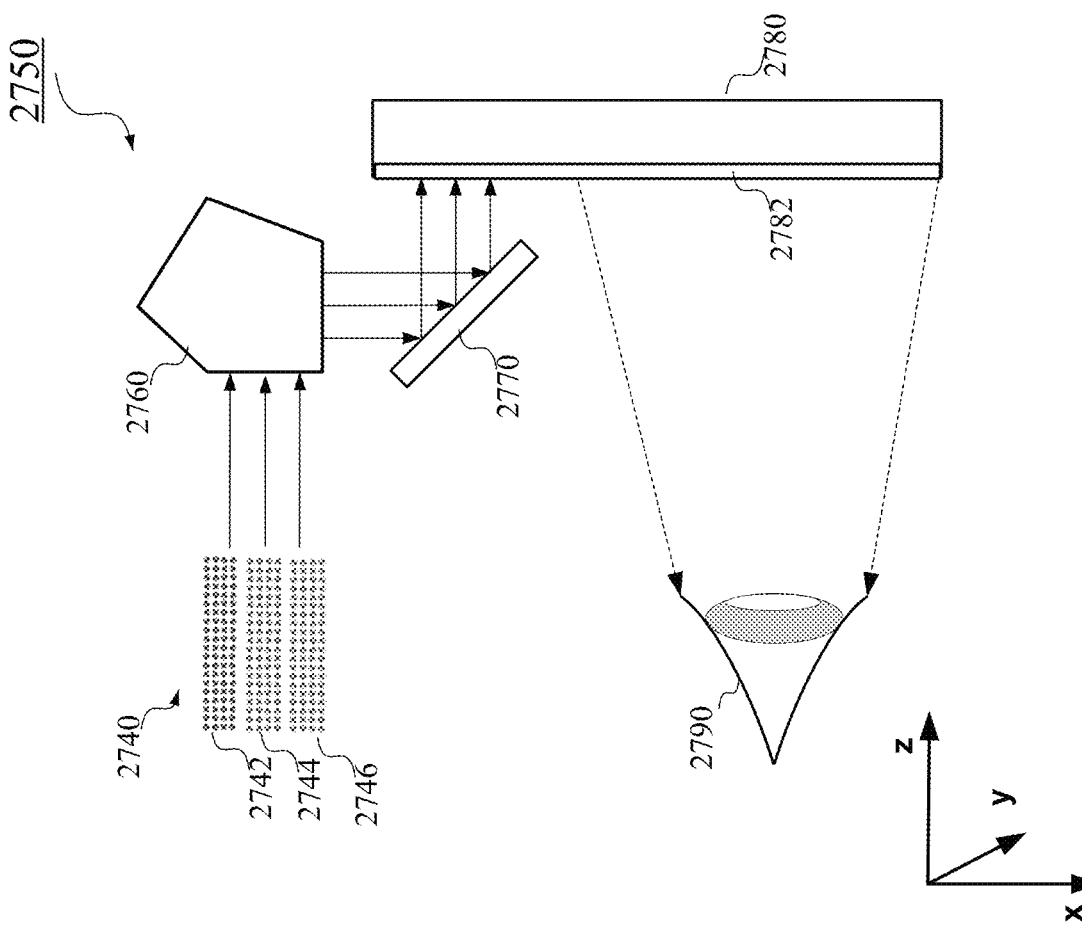
FIG. 27B illustrates an example of a near-eye display device including a waveguide display according to certain embodiments.
Figure 27A:
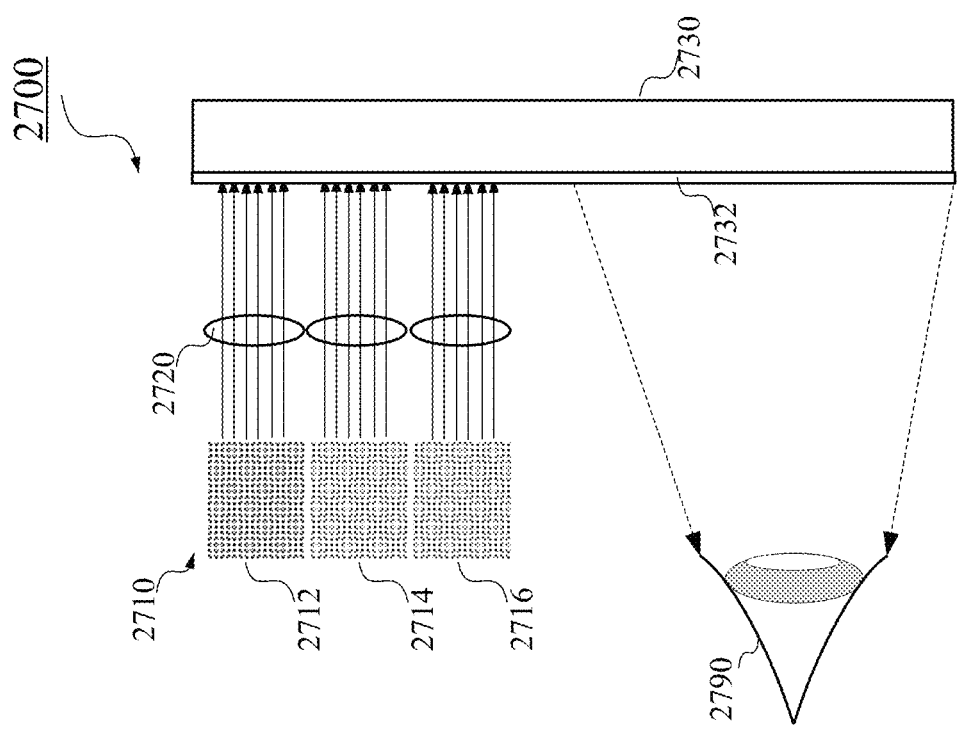
FIG. 27A illustrates an example of a near-eye display device including a waveguide display according to certain embodiments.

FIG. 27A illustrates an example of a near-eye display (NED) device 2700 including a waveguide display 2730 according to certain embodiments. NED device 2700 may be an example of near-eye display 120, augmented reality system 2600, or another type of display device. NED device 2700 may include a light source 2710, projection optics 2720, and waveguide display 2730. Light source 2710 may include multiple panels of light emitters for different colors, such as a panel of red light emitters 2712, a panel of green light emitters 2714, and a panel of blue light emitters 2716. The dimensions and pitches of light emitters in light source 2710 may be small. For example, each light emitter may have a diameter less than 2 μm (e.g., about 1.2 μm) and the pitch may be less than 2 μm (e.g., about 1.5 μm). As such, the number of light emitters in each red light emitters 2712, green light emitters 2714, and blue light emitters 2716 can be equal to or greater than the number of pixels in a display image, such as 960×720, 1280×720, 1440×1080, 1920×1080, 2160×1080, or 2560×1080 pixels. Thus, a display image may be generated simultaneously by light source 2710. A scanning element may not be used in NED device 2700.

Before reaching waveguide display 2730, the light emitted by light source 2710 may be conditioned by projection optics 2720, which may include a lens array. Projection optics 2720 may collimate or focus the light emitted by light source 2710 to waveguide display 2730, which may include a coupler 2732 for coupling the light emitted by light source 2710 into waveguide display 2730. The light coupled into waveguide display 2730 may propagate within waveguide display 2730 through, for example, total internal reflection as described above with respect to FIG. 26. Coupler 2732 may also couple portions of the light propagating within waveguide display 2730 out of waveguide display 2730 and towards user's eye 2790.

FIG. 27B illustrates an example of a near-eye display (NED) device 2750 including a waveguide display 2780 according to certain embodiments. In some embodiments, NED device 2750 may use a scanning mirror 2770 to project light from a light source 2740 to an image field where a user's eye 2790 may be located. NED device 2750 may be an example of near-eye display 120, augmented reality system 2600, or another type of display device. Light source 2740 may include one or more rows or one or more columns of light emitters of different colors, such as multiple rows of red light emitters 2742, multiple rows of green light emitters 2744, and multiple rows of blue light emitters 2746. For example, red light emitters 2742, green light emitters 2744, and blue light emitters 2746 may each include N rows, each row including, for example, 2560 light emitters (pixels). In some embodiments, light source 2740 may include a single line of light emitters for each color. In some embodiments, light source 2740 may include multiple columns of light emitters for each of red, green, and blue colors, where each column may include, for example, 1080 light emitters. In some embodiments, the dimensions and/or pitches of the light emitters in light source 2740 may be relatively large (e.g., about 3-5 μm) and thus light source 2740 may not include sufficient light emitters for simultaneously generating a full display image. For example, the number of light emitters for a single color may be fewer than the number of pixels (e.g., 2560×1080 pixels) in a display image. The light emitted by light source 2740 may be a set of collimated or diverging beams of light.

Before reaching scanning mirror 2770, the light emitted by light source 2740 may be conditioned by various optical devices, such as collimating lenses or a freeform optical element 2760. Freeform optical element 2760 may include, for example, a multi-facets prism or another light folding element that may direct the light emitted by light source 2740 towards scanning mirror 2770, such as changing the propagation direction of the light emitted by light source 2740 by, for example, about 90° or larger. In some embodiments, freeform optical element 2760 may be rotatable to scan the light. Scanning mirror 2770 and/or freeform optical element 2760 may reflect and project the light emitted by light source 2740 to waveguide display 2780, which may include a coupler 2782 for coupling the light emitted by light source 2740 into waveguide display 2780. The light coupled into waveguide display 2780 may propagate within waveguide display 2780 through, for example, total internal reflection as described above with respect to FIG. 26. Coupler 2782 may also couple portions of the light propagating within waveguide display 2780 out of waveguide display 2780 and towards user's eye 2790.

Scanning mirror 2770 may include a microelectromechanical system (MEMS) mirror or any other suitable mirrors. Scanning mirror 2770 may rotate to scan in one or two dimensions. As scanning mirror 2770 rotates, the light emitted by light source 2740 may be directed to a different areas of waveguide display 2780 such that a full display image may be projected onto waveguide display 2780 and directed to user's eye 2790 by waveguide display 2780 in each scanning cycle. For example, in embodiments where light source 2740 includes light emitters for all pixels in one or more rows or columns, scanning mirror 2770 may be rotated in the column or row direction (e.g., x or y direction) to scan an image. In embodiments where light source 2740 includes light emitters for some but not all pixels in one or more rows or columns, scanning mirror 2770 may be rotated in both the row and column directions (e.g., both x and y directions) to project a display image (e.g., using a raster-type scanning pattern).

NED device 2750 may operate in predefined display periods. A display period (e.g., display cycle) may refer to a duration of time in which a full image is scanned or projected. For example, a display period may be a reciprocal of the desired frame rate. In NED device 2750 that includes scanning mirror 2770, the display period may also be referred to as a scanning period or scanning cycle. The light generation by light source 2740 may be synchronized with the rotation of scanning mirror 2770. For example, each scanning cycle may include multiple scanning steps, where light source 2740 may generate a different light pattern in each respective scanning step.

In each scanning cycle, as scanning mirror 2770 rotates, a display image may be projected onto waveguide display 2780 and user's eye 2790. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 2770 may revert back to the initial position to project light for the first few rows of the next display image or may rotate in a reverse direction or scan pattern to project light for the next display image, where a new set of driving signals may be fed to light source 2740. The same process may be repeated as scanning mirror 2770 rotates in each scanning cycle. As such, different images may be projected to user's eye 2790 in different scanning cycles.

Figure 28:
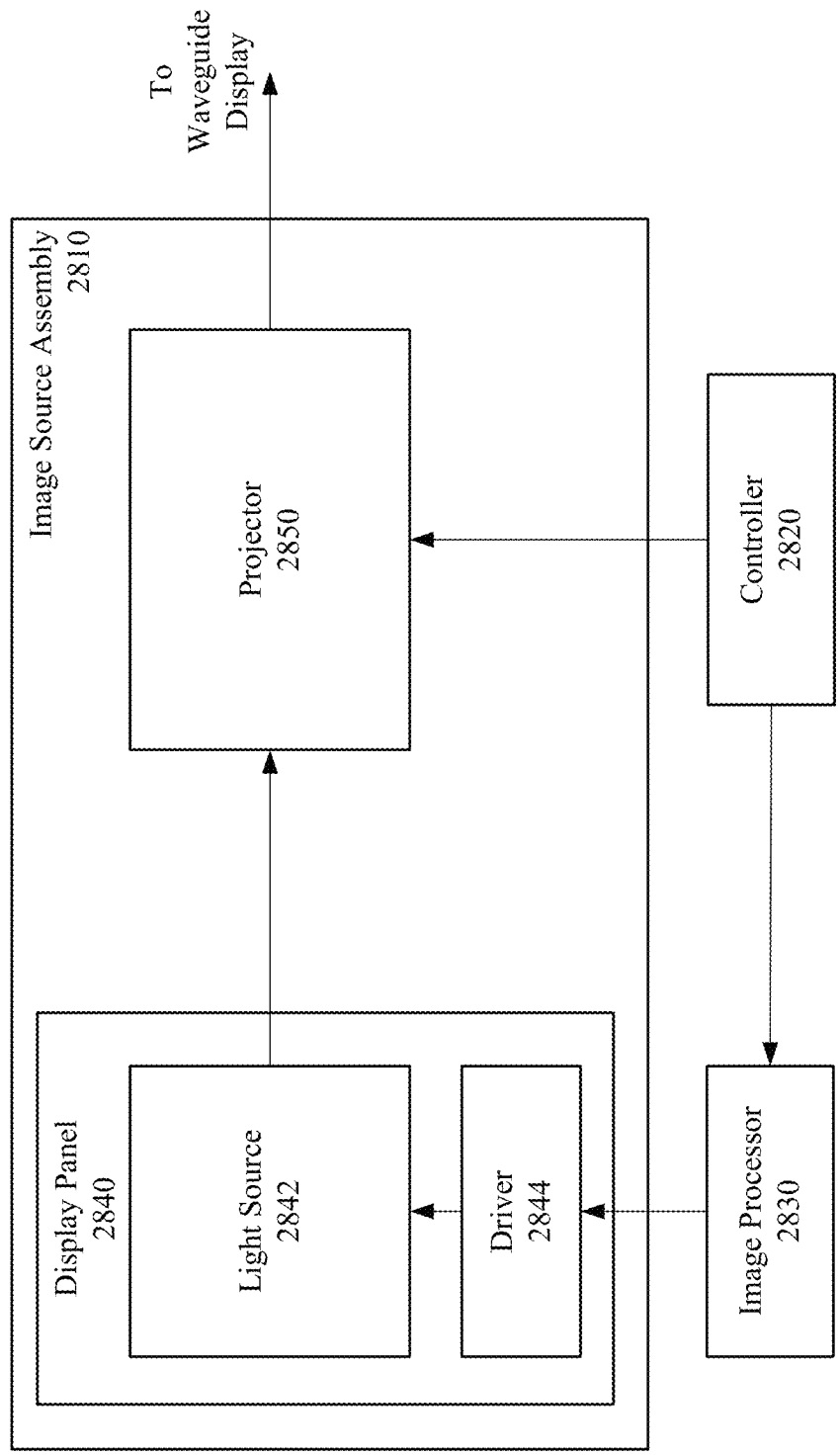
FIG. 28 illustrates an example of an image source assembly in an augmented reality system according to certain embodiments.

FIG. 28 illustrates an example of an image source assembly 2810 in a near-eye display system 2800 according to certain embodiments. Image source assembly 2810 may include, for example, a display panel 2840 that may generate display images to be projected to the user's eyes, and a projector 2850 that may project the display images generated by display panel 2840 to a waveguide display as described above with respect to FIGS. 26-27B. Display panel 2840 may include a light source 2842 and a driver circuit 2844 for light source 2842. Light source 2842 may include, for example, light source 2710 or 2760. Projector 2850 may include, for example, freeform optical element 2720, scanning mirror 2730, and/or projection optics 2770 described above. Near-eye display system 2800 may also include a controller 2820 that synchronously controls light source 2842 and projector 2850 (e.g., scanning mirror 2730). Image source assembly 2810 may generate and output an image light to a waveguide display (not shown in FIG. 28), such as waveguide display 2740 or 2780. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 2842 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 2800. In some embodiments, a display panel in accordance with an embodiment may use more than three primary colors. Each pixel in light source 2842 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 2820 may control the image rendering operations of image source assembly 2810, such as the operations of light source 2842 and/or projector 2850. For example, controller 2820 may determine instructions for image source assembly 2810 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 2810 to generate image light. The scanning instructions may specify, for example, a type of a source of image light (e.g., monochromatic or polychromatic), a scanning rate, an orientation of a scanning apparatus, one or more illumination parameters, or any combination thereof. Controller 2820 may include a combination of hardware, software, and/or firmware not shown here so as not to obscure other aspects of the present disclosure.

In some embodiments, controller 2820 may be a graphics processing unit (GPU) of a display device. In other embodiments, controller 2820 may be other kinds of processors. The operations performed by controller 2820 may include taking content for display and dividing the content into discrete sections. Controller 2820 may provide to light source 2842 scanning instructions that include an address corresponding to an individual source element of light source 2842 and/or an electrical bias applied to the individual source element. Controller 2820 may instruct light source 2842 to sequentially present the discrete sections using light emitters corresponding to one or more rows of pixels in an image ultimately displayed to the user. Controller 2820 may also instruct projector 2850 to perform different adjustments of the light. For example, controller 2820 may control projector 2850 to scan the discrete sections to different areas of a coupling element of the waveguide display (e.g., waveguide display 2740) as described above with respect to FIG. 27A. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 2830 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 2830 may be one or more circuits that are dedicated to performing certain features. While image processor 2830 in FIG. 28 is shown as a stand-alone unit that is separate from controller 2820 and driver circuit 2844, image processor 2830 may be a sub-unit of controller 2820 or driver circuit 2844 in other embodiments. In other words, in those embodiments, controller 2820 or driver circuit 2844 may perform various image processing functions of image processor 2830. Image processor 2830 may also be referred to as an image processing circuit.

In the example shown in FIG. 28, light source 2842 may be driven by driver circuit 2844, based on data or instructions (e.g., display and scanning instructions) sent from controller 2820 or image processor 2830. In one embodiment, driver circuit 2844 may include a circuit panel that connects to and mechanically holds various light emitters of light source 2842. Light source 2842 may emit light in accordance with one or more illumination parameters that are set by the controller 2820 and potentially adjusted by image processor 2830 and driver circuit 2844. An illumination parameter may be used by light source 2842 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 2842 may include multiple beams of red light, green light, and blue light, or any combination thereof.

Projector 2850 may perform a set of optical functions, such as focusing, combining, conditioning, or scanning the image light generated by light source 2842. In some embodiments, projector 2850 may include a combining assembly, a light conditioning assembly, or a scanning mirror assembly. Projector 2850 may include one or more optical components that optically adjust and potentially re-direct the light from light source 2842. One example of the adjustment of light may include conditioning the light, such as expanding, collimating, correcting for one or more optical errors (e.g., field curvature, chromatic aberration, etc.), some other adjustments of the light, or any combination thereof. The optical components of projector 2850 may include, for example, lenses, mirrors, apertures, gratings, or any combination thereof.

Projector 2850 may redirect image light via its one or more reflective and/or refractive portions so that the image light is projected at certain orientations toward the waveguide display. The location where the image light is redirected toward may depend on specific orientations of the one or more reflective and/or refractive portions. In some embodiments, projector 2850 includes a single scanning mirror that scans in at least two dimensions. In other embodiments, projector 2850 may include a plurality of scanning mirrors that each scan in directions orthogonal to each other. Projector 2850 may perform a raster scan (horizontally or vertically), a bi-resonant scan, or any combination thereof. In some embodiments, projector 2850 may perform a controlled vibration along the horizontal and/or vertical directions with a specific frequency of oscillation to scan along two dimensions and generate a two-dimensional projected image of the media presented to user's eyes. In other embodiments, projector 2850 may include a lens or prism that may serve similar or the same function as one or more scanning mirrors. In some embodiments, image source assembly 2810 may not include a projector, where the light emitted by light source 2842 may be directly incident on the waveguide display.

Figure 29:
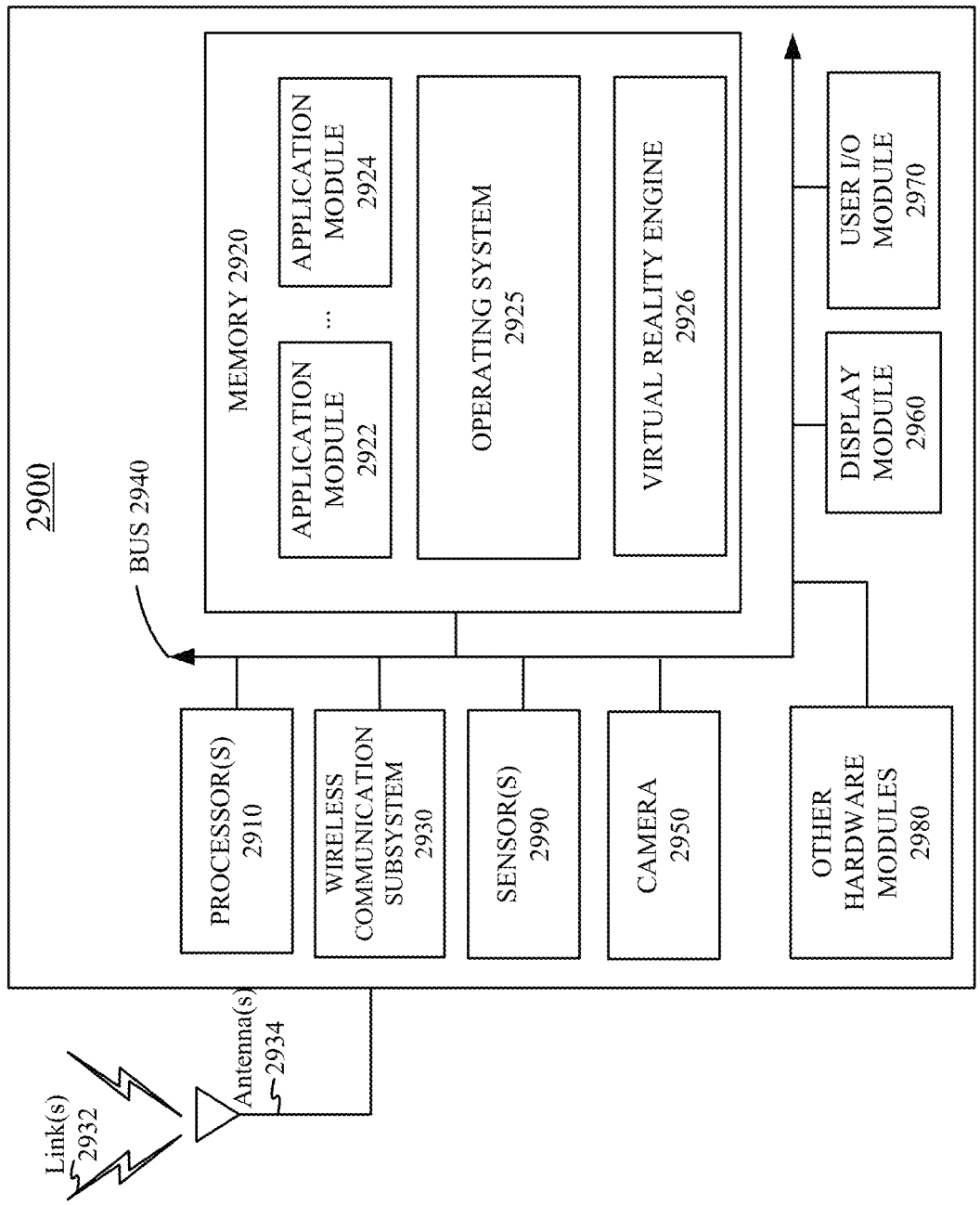
FIG. 29 is a simplified block diagram of an electronic system of an example of a near-eye display according to certain embodiments.

FIG. 29 is a simplified block diagram of an example electronic system 2900 of an example near-eye display (e.g., HMD device) for implementing some of the examples disclosed herein. Electronic system 2900 may be used as the electronic system of an HMD device or other near-eye displays described above. In this example, electronic system 2900 may include one or more processor(s) 2910 and a memory 2920. Processor(s) 2910 may be configured to execute instructions for performing operations at a number of components, and can be, for example, a general-purpose processor or microprocessor suitable for implementation within a portable electronic device. Processor(s) 2910 may be communicatively coupled with a plurality of components within electronic system 2900. To realize this communicative coupling, processor(s) 2910 may communicate with the other illustrated components across a bus 2940. Bus 2940 may be any subsystem adapted to transfer data within electronic system 2900. Bus 2940 may include a plurality of computer buses and additional circuitry to transfer data.

Memory 2920 may be coupled to processor(s) 2910. In some embodiments, memory 2920 may offer both short-term and long-term storage and may be divided into several units. Memory 2920 may be volatile, such as static random access memory (SRAM) and/or dynamic random access memory (DRAM) and/or non-volatile, such as read-only memory (ROM), flash memory, and the like. Furthermore, memory 2920 may include removable storage devices, such as secure digital (SD) cards. Memory 2920 may provide storage of computer-readable instructions, data structures, program modules, and other data for electronic system 2900. In some embodiments, memory 2920 may be distributed into different hardware modules. A set of instructions and/or code might be stored on memory 2920. The instructions might take the form of executable code that may be executable by electronic system 2900, and/or might take the form of source and/or installable code, which, upon compilation and/or installation on electronic system 2900 (e.g., using any of a variety of generally available compilers, installation programs, compression/decompression utilities, etc.), may take the form of executable code.

In some embodiments, memory 2920 may store a plurality of application modules 2922 through 2924, which may include any number of applications. Examples of applications may include gaming applications, conferencing applications, video playback applications, or other suitable applications. The applications may include a depth sensing function or eye tracking function. Application modules 2922-2924 may include particular instructions to be executed by processor(s) 2910. In some embodiments, certain applications or parts of application modules 2922-2924 may be executable by other hardware modules 2980. In certain embodiments, memory 2920 may additionally include secure memory, which may include additional security controls to prevent copying or other unauthorized access to secure information.

In some embodiments, memory 2920 may include an operating system 2925 loaded therein. Operating system 2925 may be operable to initiate the execution of the instructions provided by application modules 2922-2924 and/or manage other hardware modules 2980 as well as interfaces with a wireless communication subsystem 2930 which may include one or more wireless transceivers. Operating system 2925 may be adapted to perform other operations across the components of electronic system 2900 including threading, resource management, data storage control and other similar functionality.

Wireless communication subsystem 2930 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 2900 may include one or more antennas 2934 for wireless communication as part of wireless communication subsystem 2930 or as a separate component coupled to any portion of the system. Depending on desired functionality, wireless communication subsystem 2930 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 2930 may permit data to be exchanged with a network, other computer systems, and/or any other devices described herein. Wireless communication subsystem 2930 may include a means for transmitting or receiving data, such as identifiers of HMD devices, position data, a geographic map, a heat map, photos, or videos, using antenna(s) 2934 and wireless link(s) 2932. Wireless communication subsystem 2930, processor(s) 2910, and memory 2920 may together comprise at least a part of one or more of a means for performing some functions disclosed herein.

Embodiments of electronic system 2900 may also include one or more sensors 2990. Sensor(s) 2990 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 2990 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or some combination thereof. The position sensors may be located external to the IMU, internal to the IMU, or some combination thereof. At least some sensors may use a structured light pattern for sensing.

Electronic system 2900 may include a display module 2960. Display module 2960 may be a near-eye display, and may graphically present information, such as images, videos, and various instructions, from electronic system 2900 to a user. Such information may be derived from one or more application modules 2922-2924, virtual reality engine 2926, one or more other hardware modules 2980, a combination thereof, or any other suitable means for resolving graphical content for the user (e.g., by operating system 2925). Display module 2960 may use liquid crystal display (LCD) technology, light-emitting diode (LED) technology (including, for example, OLED, ILED, μ-LED, AMOLED, TOLED, etc.), light emitting polymer display (LPD) technology, or some other display technology. Despite Electronic system 2900 may include a user input/output module 2970. User input/output module 2970 may allow a user to send action requests to electronic system 2900. An action request may be a request to perform a particular action. For example, an action request may be to start or end an application or to perform a particular action within the application. User input/output module 2970 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 2900. In some embodiments, user input/output module 2970 may provide haptic feedback to the user in accordance with instructions received from electronic system 2900. For example, the haptic feedback may be provided when an action request is received or has been performed.

Electronic system 2900 may include a camera 2950 that may be used to take photos or videos of a user, for example, for tracking the user's eye position. Camera 2950 may also be used to take photos or videos of the environment, for example, for VR, AR, or MR applications. Camera 2950 may include, for example, a complementary metal-oxide-semiconductor (CMOS) image sensor with a few millions or tens of millions of pixels. In some implementations, camera 2950 may include two or more cameras that may be used to capture 3-D images.

In some embodiments, electronic system 2900 may include a plurality of other hardware modules 2980. Each of other hardware modules 2980 may be a physical module within electronic system 2900. While each of other hardware modules 2980 may be permanently configured as a structure, some of other hardware modules 2980 may be temporarily configured to perform specific functions or temporarily activated. Examples of other hardware modules 2980 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 2980 may be implemented in software.

In some embodiments, memory 2920 of electronic system 2900 may also store a virtual reality engine 2926. Virtual reality engine 2926 may execute applications within electronic system 2900 and receive position information, acceleration information, velocity information, predicted future positions, or some combination thereof of the HMD device from the various sensors. In some embodiments, the information received by virtual reality engine 2926 may be used for producing a signal (e.g., display instructions) to display module 2960. For example, if the received information indicates that the user has looked to the left, virtual reality engine 2926 may generate content for the HMD device that mirrors the user's movement in a virtual environment. Additionally, virtual reality engine 2926 may perform an action within an application in response to an action request received from user input/output module 2970 and provide feedback to the user. The provided feedback may be visual, audible, or haptic feedback. In some implementations, processor(s) 2910 may include one or more GPUs that may execute virtual reality engine 2926.

In various implementations, the above-described hardware and modules may be implemented on a single device or on multiple devices that can communicate with one another using wired or wireless connections. For example, in some implementations, some components or modules, such as GPUs, virtual reality engine 2926, and applications (e.g., tracking application), may be implemented on a console separate from the head-mounted display device. In some implementations, one console may be connected to or support more than one HMD.

In alternative configurations, different and/or additional components may be included in electronic system 2900. Similarly, functionality of one or more of the components can be distributed among the components in a manner different from the manner described above. For example, in some embodiments, electronic system 2900 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A method comprising:
   forming, on a semi-polar plane-oriented surface of a substrate, an n-i-n junction that includes a sacrificial layer sandwiched by a first n-type III-nitride material layer and a second n-type III-nitride material layer;
   forming, on the second n-type III-nitride material layer, a p-type III-nitride material layer;
   growing, on the p-type III-nitride material layer, a light emitting region that includes one or more III-nitride material layers;
   forming, on the light emitting region, a third n-type III-nitride material layer;
   etching the third n-type III-nitride material layer, the light emitting region, and the p-type III-nitride material layer to form one or more mesa structures and one or more anchor sites;
   etching the p-type III-nitride material layer and the n-i-n junction to expose the sacrificial layer;
   bonding a first carrier to the anchor sites; and
   laterally etching the sacrificial layer using photoelectrochemical etching to detach the substrate.

2. The method of claim 1, wherein an angle between the semi-polar plane-oriented surface of the substrate and a c-plane of the substrate is between 45° and 90°.

3. The method of claim 1, further comprising, after forming the p-type III-nitride material layer, at least one of:
   conditioning a process chamber used to dope the p-type III-nitride material layer to remove remaining dopants in the process chamber; or
   treating a surface of the p-type III-nitride material layer to remove dopants built on the surface of the p-type III-nitride material layer.

4. The method of claim 1, wherein forming the p-type III-nitride material layer includes growing the p-type III-nitride material layer at a temperature higher than a temperature for growing the light emitting region.

5. The method of claim 1, further comprising:
   etching the second n-type III-nitride material layer to expose the p-type III-nitride material layer;
   forming, on the p-type III-nitride material layer, a $p^+$-type III-nitride material layer;
   activating the p-type III-nitride material layer and the $p^+$-type III-nitride material layer; and
   forming, on the $p^+$-type III-nitride material layer, a first contact layer.

6. The method of claim 5, further comprising:
   bonding a second carrier on the first contact layer;
   debonding the first carrier from the anchor sites; and
   bonding a silicon backplane including electrical circuits to the third n-type III-nitride material layer.

7. A wafer comprising:
   a substrate including a semi-polar plane-oriented surface;
   an n-i-n junction grown on the semi-polar plane-oriented surface of the substrate, the n-i-n junction including a sacrificial layer sandwiched by a first n-type III-nitride material layer and a second n-type III-nitride material layer;
   a p-type III-nitride material layer on the second n-type III-nitride material layer;
   a light emitting region on the p-type III-nitride material layer, the light emitting region including one or more III-nitride material layers; and
   a third n-type III-nitride material layer on the light emitting region.

8. The wafer of claim 7, wherein an angle between the semi-polar plane-oriented surface of the substrate and a c-plane of the substrate is between 45° and 90°.

9. The wafer of claim 7, wherein the semi-polar plane-oriented surface is parallel to a (20$\bar{2}$1) plane or (11$\bar{2}$2) plane of the substrate.

10. The wafer of claim 7, wherein the substrate includes GaN, sapphire, silicon carbide, silicon, zinc oxide, boron nitride, lithium aluminate, lithium niobate, germanium, aluminum nitride, lithium gallate, partially substituted spinel, or quaternary tetragonal oxide having a beta-LiAlO$_2$ structure.

11. The wafer of claim 7, further comprising a buffer layer between the substrate and the n-i-n junction.

12. A light source comprising:
   a semiconductor substrate including electrical circuits fabricated thereon; and
   a light emitting diode bonded to the semiconductor substrate, the light emitting diode comprising:
      an n-type III-nitride material layer bonded to the electrical circuits on the semiconductor substrate;
      a light emitting region including one or more III-nitride material layers; and
      a p-type III-nitride material layer,
   wherein:
      the light emitting region includes a side surface that is at least partially covered by a passivation layer;
      a bottom surface of the light emitting region is parallel to a semi-polar plane of a hexagonal lattice; and
      the light emitting region is characterized by a polarization-induced electric field opposite to a built-in depletion electric field in the light emitting region.

13. The light source of claim 12, wherein the p-type III-nitride material layer is vertically rather than laterally activated.

14. The light source of claim 12, wherein an angle between the semi-polar plane and a c-plane of the hexagonal lattice is between 45° and 90°.

15. The light source of claim 12, wherein a direction from the p-type III-nitride material layer to the n-type III-nitride material layer is a [20$\bar{2}$1] or [11$\bar{2}$2] direction.

16. The light source of claim 12, wherein the light emitting region includes a single InGaN/GaN quantum-well structure or an InGaN/GaN multiple-quantum-well structure.

17. The light source of claim 12, wherein the polarization-induced electric field and the built-in depletion electric field are antiparallel.

18. The light source of claim 17, wherein a difference between an amplitude of the polarization-induced electric field and an amplitude of the built-in depletion electric field is less than 25% of the amplitude of the built-in depletion electric field.

19. The light source of claim 12, wherein a majority of transistors in the electrical circuits are NMOS transistors.

20. The light source of claim 12, wherein the light emitting diode is characterized by a blue-shift less than 15 nm when a current density of the light emitting diode is increased ten times.

* * * * *